US012701756B2

(12) United States Patent
Lo

(10) Patent No.: US 12,701,756 B2
(45) Date of Patent: Aug. 4, 2026

(54) SEMICONDUCTOR DEVICE HAVING NANOSHEET TRANSISTOR AND METHODS OF FABRICATION THEREOF

(71) Applicant: TAIWAN SEMICONDUCTOR MANUFACTURING COMPANY, LTD., Hsinchu (TW)

(72) Inventor: Yi-Chen Lo, Zhubei (TW)

(73) Assignee: TAIWAN SEMICONDUCTOR MANUFACTURING COMPANY, LTD., Hsinchu (TW)

( * ) Notice: Subject to any disclaimer, the term of this patent is extended or adjusted under 35 U.S.C. 154(b) by 611 days.

(21) Appl. No.: 18/101,254

(22) Filed: Jan. 25, 2023

(65) Prior Publication Data

US 2024/0072114 A1     Feb. 29, 2024

Related U.S. Application Data

(60) Provisional application No. 63/435,725, filed on Dec. 28, 2022, provisional application No. 63/402,107, filed on Aug. 30, 2022.

(51) Int. Cl.
| | |
|---|---|
| *H10D 62/10* | (2025.01) |
| *H10D 30/67* | (2025.01) |
| *H10D 62/13* | (2025.01) |
| *H10D 64/01* | (2025.01) |

(Continued)

(52) U.S. Cl.
CPC ....... *H10D 62/121* (2025.01); *H10D 30/6735* (2025.01); *H10D 30/6757* (2025.01); *H10D 62/151* (2025.01); *H10D 64/017* (2025.01); *H10D 64/018* (2025.01);

(Continued)

(58) Field of Classification Search
CPC ............. H10D 62/121; H10D 30/6735; H10D 30/6757; H10D 62/151; H10D 64/017; H10D 64/018; H10D 84/013; H10D 84/0158; H10D 84/038; H10D 30/797;

(Continued)

(56) References Cited

U.S. PATENT DOCUMENTS

| | | |
|---|---|---|
| 9,209,247 B2 | 12/2015 | Colinge et al. |
| 9,236,267 B2 | 1/2016 | De et al. |
| 9,412,817 B2 | 8/2016 | Yang et al. |

(Continued)

OTHER PUBLICATIONS

U.S. Appl. No. 17/732,552, filed Apr. 29, 2022.

*Primary Examiner* — Cuong B Nguyen

(74) *Attorney, Agent, or Firm* — NZ Carr Law Office

(57) ABSTRACT

Various embodiments of the present disclosure provide a semiconductor device structure. In one embodiment, the semiconductor device structure includes a plurality of semiconductor layers vertically stacked over a substrate, a source/drain feature in contact with each of the plurality of the semiconductor layers, an inner spacer disposed between two adjacent semiconductor layers, a gate electrode layer surrounding a portion of each of the plurality of the semiconductor layers, a gate dielectric layer disposed between the semiconductor layer and the gate electrode layer, a gate spacer in contact with a portion of the gate dielectric layer. The semiconductor device structure further includes a first cap layer comprising a first portion disposed between and in contact with the source/drain feature and the gate spacer, and a second portion disposed between and in contact with gate spacer and the inner spacer.

20 Claims, 41 Drawing Sheets

(51) Int. Cl.
　　*H10D 84/01* 　　　　(2025.01)
　　*H10D 84/03* 　　　　(2025.01)
(52) U.S. Cl.
　　CPC ....... *H10D 84/013* (2025.01); *H10D 84/0158*
　　　　　　　　(2025.01); *H10D 84/038* (2025.01)
(58) Field of Classification Search
　　CPC .. H10D 62/822; H10D 62/116; H10D 64/015;
　　　　　　　　　H10D 64/021; H10D 84/83
　　See application file for complete search history.

(56) References Cited

U.S. PATENT DOCUMENTS

| | | | |
|---|---|---|---|
| 9,412,828 B2 | 8/2016 | Ching et al. | |
| 9,472,618 B2 | 10/2016 | Oxland | |
| 9,502,265 B1 | 11/2016 | Jiang et al. | |
| 9,520,482 B1 | 12/2016 | Chang et al. | |
| 9,536,738 B2 | 1/2017 | Huang et al. | |
| 9,576,814 B2 | 2/2017 | Wu et al. | |
| 9,608,116 B2 | 3/2017 | Ching et al. | |
| 2018/0026033 A1 | 1/2018 | Chang et al. | |
| 2023/0010657 A1* | 1/2023 | Wu ..................... | H10D 30/014 |
| 2023/0100505 A1* | 3/2023 | Penumatcha ........ | H10D 30/014 |
| | | | 257/288 |

* cited by examiner

SEMICONDUCTOR DEVICE HAVING NANOSHEET TRANSISTOR AND METHODS OF FABRICATION THEREOF

CROSS-REFERENCE TO RELATED APPLICATIONS

This application claims priority to U.S. Provisional Application Ser. Nos. 63/402,107 filed Aug. 30, 2022 and 63/435,725 filed Dec. 28, 2022 which are incorporated by reference in their entirety.

BACKGROUND

The semiconductor integrated circuit (IC) industry has experienced exponential growth. Technological advances in IC materials and design have produced generations of ICs where each generation has smaller and more complex circuits than the previous generation. In the course of IC evolution, functional density (i.e., the number of interconnected devices per chip area) has generally increased while geometry size (i.e., the smallest component (or line) that can be created using a fabrication process) has decreased. This scaling down process generally provides benefits by increasing production efficiency and lowering associated costs. However, such scaling down presents new challenge. For example, transistors using nanostructure channels have been proposed to improve carrier mobility and drive current in a device. An inner spacer is often disposed between metal gate and source/drain (S/D) structure to protect the S/D structure from damage that may occur during the subsequent gate replacement process. Although the formation of the inner spacer has been generally adequate for their intended purposes, they have not been entirely satisfactory in all respects.

BRIEF DESCRIPTION OF THE DRAWINGS

Aspects of the present disclosure are best understood from the following detailed description when read with the accompanying figures. It is noted that, in accordance with the standard practice in the industry, various features are not drawn to scale. In fact, the dimensions of the various features may be arbitrarily increased or reduced for clarity of discussion.

FIGS. 7A-18A are cross-sectional side views of various stages of manufacturing the semiconductor device structure taken along cross-section A-A of FIG. 6, in accordance with some embodiments.

FIGS. 9A-1, 9A-2, and 9A-3 are cross-sectional side views of the semiconductor device structure, in accordance with some alternative embodiments.

FIGS. 12A-1, 12A-2 are cross-sectional side views of the semiconductor device structure, in accordance with some alternative embodiments.

FIG. 12A-1a is an enlarged view of a portion of the semiconductor device structure of FIG. 12A-1, in accordance with some alternative embodiments.

FIGS. 7B-18B are cross-sectional side views of various stages of manufacturing the semiconductor device structure taken along cross-section B-B of FIG. 6, in accordance with some embodiments.

FIGS. 7C-18C are cross-sectional side views of various stages of manufacturing the semiconductor device structure taken along cross-section C-C of FIG. 6, in accordance with some embodiments.

FIGS. 7D-18D are cross-sectional side views of various stages of manufacturing the semiconductor device structure taken along cross-section D-D of FIG. 6, in accordance with some embodiments.

FIGS. 9D-1, 9D-2, and 9D-3 are top view of a portion of the semiconductor device structure, in accordance with some alternative embodiments.

FIG. 11D-1 is a top view of a portion of the semiconductor device structure, in accordance with some alternative embodiments.

FIGS. 16D-1, 16D-2, and 16D-3 are top view of a portion of the semiconductor device structure, in accordance with some alternative embodiments.

FIGS. 18D-1, 18D-2, and 18D-3 are top view of a portion of the semiconductor device structure, in accordance with some alternative embodiments.

DETAILED DESCRIPTION

Figure 1:
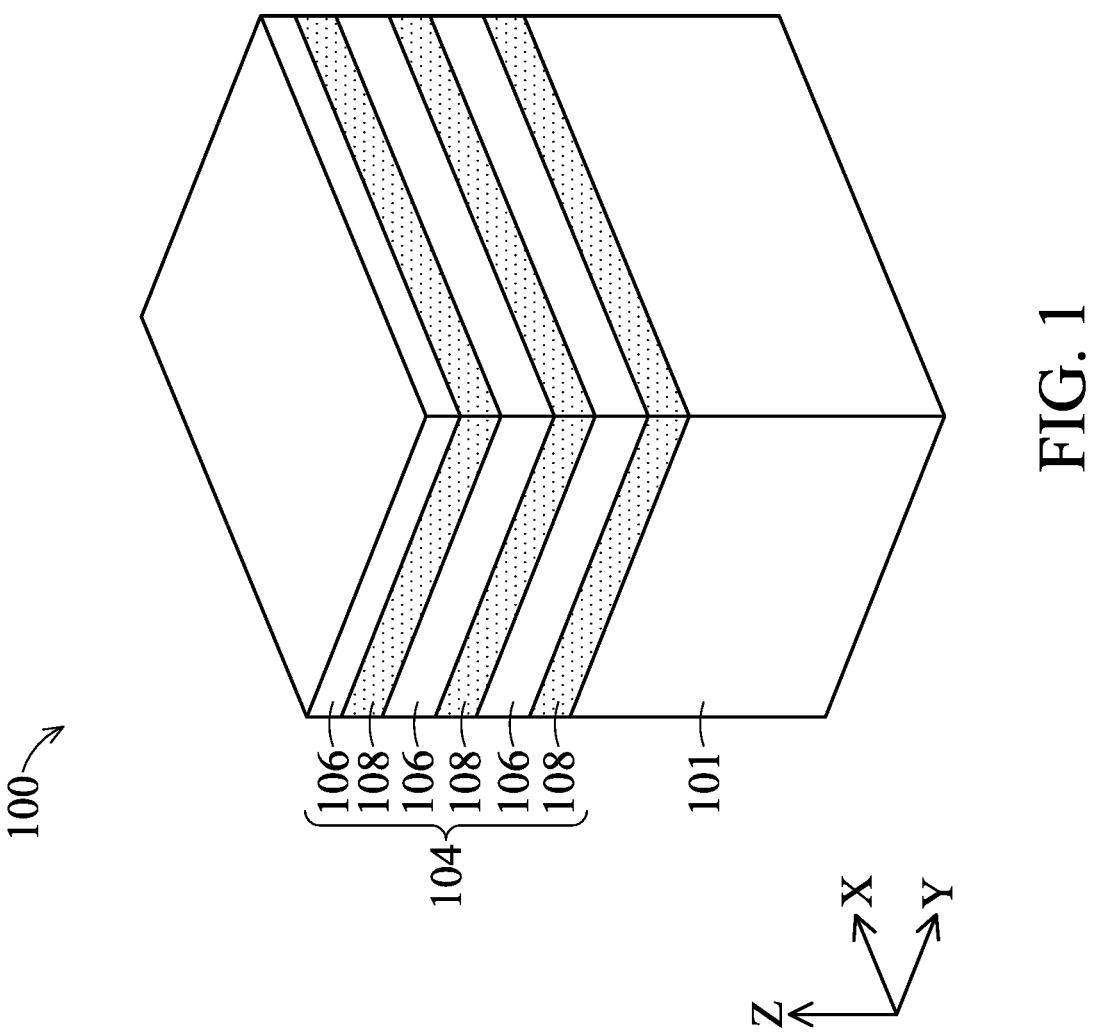
FIGS. 1-6 are perspective views of various stages of manufacturing a semiconductor device structure in accordance with some embodiments.

The following disclosure provides many different embodiments, or examples, for implementing different features of the provided subject matter. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various examples. This repetition is for the purpose of simplicity and clarity and does not in itself dictate a relationship between the various embodiments and/or configurations discussed.

Further, spatially relative terms, such as "beneath," "below," "lower," "above," "over," "on," "top," "upper" and the like, may be used herein for ease of description to describe one element or feature's relationship to another element(s) or feature(s) as illustrated in the figures. The spatially relative terms are intended to encompass different orientations of the device in use or operation in addition to the orientation depicted in the figures. The apparatus may be otherwise oriented (rotated 90 degrees or at other orientations) and the spatially relative descriptors used herein may likewise be interpreted accordingly.

While the embodiments of this disclosure are discussed with respect to nanostructure channel FETs, implementations of some aspects of the present disclosure may be used in other processes and/or in other devices, such as planar FETs, Fin-FETs, Horizontal Gate All Around (HGAA) FETs, Vertical Gate All Around (VGAA) FETs, and other suitable devices. A person having ordinary skill in the art will readily understand other modifications that may be made are contemplated within the scope of this disclosure. In cases where gate all around (GAA) transistor structures are adapted, the GAA transistor structures may be patterned by any suitable method. For example, the structures may be patterned using one or more photolithography processes, including double-patterning or multi-patterning processes. Generally, double-patterning or multi-patterning processes combine photolithography and self-aligned processes, allowing patterns to be created that have, for example, pitches smaller than what is otherwise obtainable using a single, direct photolithography process. For example, in one embodiment, a sacrificial layer is formed over a substrate and patterned using a photolithography process. Spacers are formed alongside the patterned sacrificial layer using a self-aligned process. The sacrificial layer is then removed, and the remaining spacers may then be used to pattern the GAA structure.

FIGS. 1 to 18D-3 show exemplary processes for manufacturing a semiconductor device structure 100 according to embodiments of the present disclosure. It is understood that additional operations can be provided before, during, and after processes shown by FIGS. 1 to 18D-3, and some of the operations described below can be replaced or eliminated, for additional embodiments of the method. The order of the operations/processes is not limiting and may be interchangeable.

FIGS. 1-6 are perspective views of various stages of manufacturing a semiconductor device structure 100 in accordance with some embodiments. As shown in FIG. 1, a semiconductor device structure 100 includes a stack of semiconductor layers 104 formed over a front side of a substrate 101. The substrate 101 may be a semiconductor substrate. The substrate 101 may include a crystalline semiconductor material such as, but not limited to, silicon (Si), germanium (Ge), silicon germanium (SiGe), gallium arsenide (GaAs), indium antimonide (InSb), gallium phosphide (GaP), gallium antimonide (GaSb), indium aluminum arsenide (InAlAs), indium gallium arsenide (InGaAs), gallium antimony phosphide (GaSbP), gallium arsenic antimonide (GaAsSb), indium phosphide (InP), or a combination thereof. In one embodiment, the substrate 101 is made of silicon. The substrate 101 may be doped or un-doped. The substrate 101 may be a bulk semiconductor substrate, such as a bulk silicon substrate that is a wafer, a silicon-on-insulator (SOI) substrate, a multi-layered or gradient substrate, or the like.

The substrate 101 may include various regions that have been doped with impurities (e.g., dopants having p-type or n-type conductivity). Depending on circuit design, the dopants may be, for example phosphorus for an n-type field effect transistors (NFET) and boron for a p-type field effect transistors (PFET).

The stack of semiconductor layers 104 includes alternating semiconductor layers made of different materials to facilitate formation of nanosheet channels in a multi-gate device, such as nanosheet channel FETs. In some embodiments, the stack of semiconductor layers 104 includes first semiconductor layers 106 and second semiconductor layers 108 vertically stacked over the substrate 101. In some embodiments, the stack of semiconductor layers 104 includes alternating first and second semiconductor layers 106, 108. The first semiconductor layers 106 and the second semiconductor layers 108 are made of semiconductor materials having different etch selectivity and/or oxidation rates. For example, the first semiconductor layers 106 may be made of Si and the second semiconductor layers 108 may be made of SiGe. In some examples, the first semiconductor layers 106 may be made of SiGe and the second semiconductor layers 108 may be made of Si. Alternatively, in some embodiments, either of the semiconductor layers 106, 108 may be or include other materials such as Ge, SiC, GeAs, GaP, InP, InAs, InSb, GaAsP, AlInAs, AlGaAs, InGaAs, GaInP, GaInAsP, or any combinations thereof.

The first and second semiconductor layers 106, 108 are formed by any suitable deposition process, such as epitaxy. By way of example, epitaxial growth of the layers of the stack of semiconductor layers 104 may be performed by a molecular beam epitaxy (MBE) process, a metalorganic chemical vapor deposition (MOCVD) process, and/or other suitable epitaxial growth processes.

The first semiconductor layers 106 or portions thereof may form nanosheet channel(s) of the semiconductor device structure 100 in later fabrication stages. The term nanosheet is used herein to designate any material portion with nanoscale, or even microscale dimensions, and having an elongate shape, regardless of the cross-sectional shape of this portion. Thus, this term designates both circular and substantially circular cross-section elongate material portions, and beam or bar-shaped material portions including, for example, a cylindrical in shape or substantially rectangular cross-section. The nanosheet channel(s) of the semiconductor device structure 100 may be surrounded by a gate electrode. The semiconductor device structure 100 may include a nanosheet transistor. The nanosheet transistors may be referred to as nanowire transistors, gate-all-around (GAA) transistors, multi-bridge channel (MBC) transistors, or any transistors having the gate electrode surrounding the channels. The use of the first semiconductor layers 106 to define a channel or channels of the semiconductor device structure 100 is further discussed below.

Each first semiconductor layer 106 may have a thickness in a range between about 5 nm and about 30 nm. Each second semiconductor layer 108 may have a thickness that is equal, less, or greater than the thickness of the first semiconductor layer 106. In some embodiments, each second semiconductor layer 108 has a thickness in a range between about 2 nm and about 50 nm. Three first semiconductor layers 106 and three second semiconductor layers 108 are alternately arranged as illustrated in FIG. 1, which is for illustrative purposes and not intended to be limiting beyond what is specifically recited in the claims. It can be appreciated that any number of first and second semiconductor layers 106, 108 can be formed in the stack of semiconductor layers 104, and the number of layers depending on the predetermined number of channels for the semiconductor device structure 100.

Figure 2:
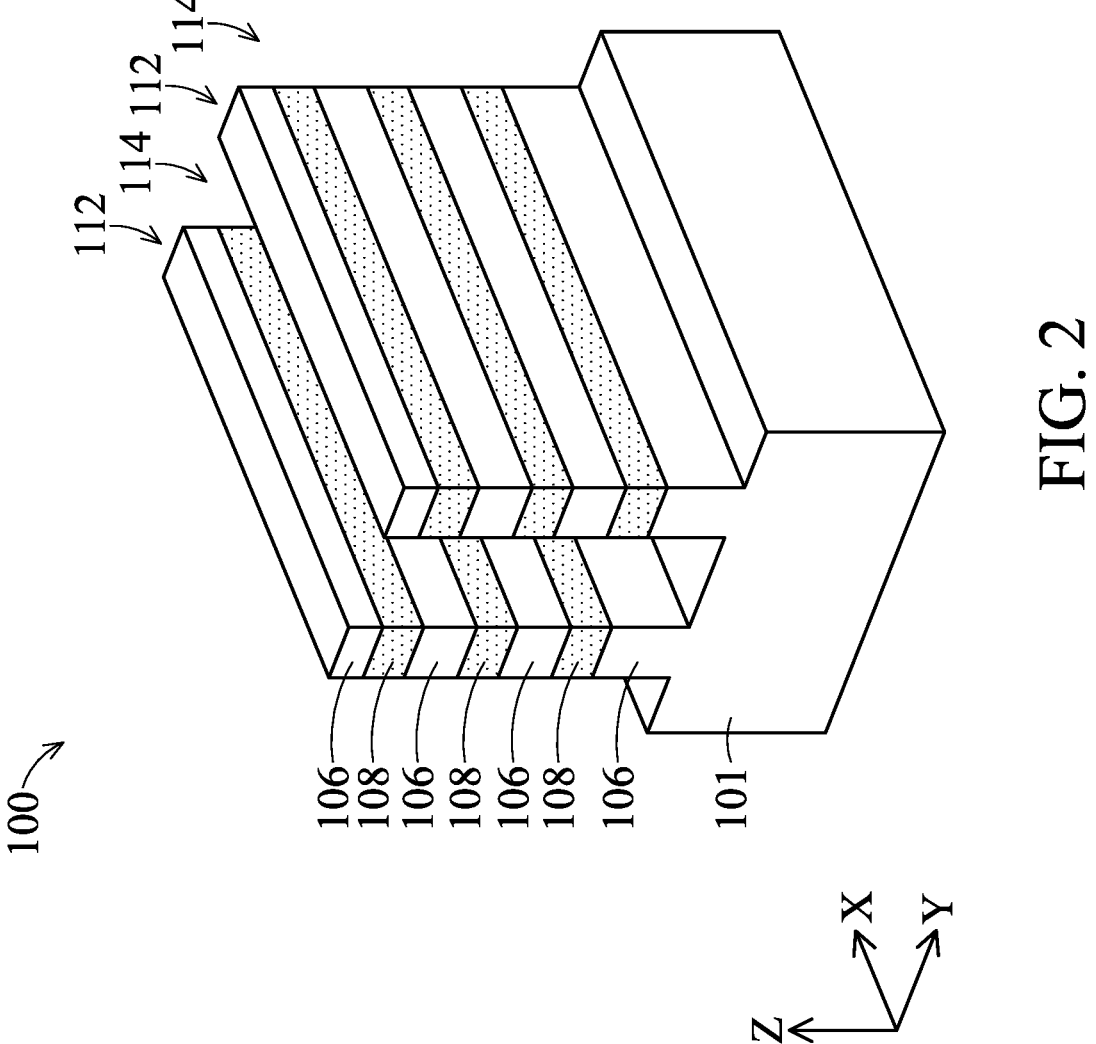

In FIG. 2, fin structures 112 are formed from the stack of semiconductor layers 104. Each fin structure 112 has an upper portion including the semiconductor layers 106, 108 and a well portion 116 formed from the substrate 101. The fin structures 112 may be formed by patterning a hard mask layer (not shown) formed on the stack of semiconductor layers 104 using multi-patterning operations including photo-lithography and etching processes. The etching process can include dry etching, wet etching, reactive ion etching (RIE), and/or other suitable processes. The photo-lithography process may include forming a photoresist layer (not shown) over the hard mask layer, exposing the photoresist layer to a pattern, performing post-exposure bake processes, and developing the photoresist layer to form a masking element including the photoresist layer. In some embodiments, patterning the photoresist layer to form the masking element may be performed using an electron beam (e-beam) lithography process. The etching process forms trenches 114 in unprotected regions through the hard mask layer, through the stack of semiconductor layers 104, and into the substrate 101, thereby leaving the plurality of extending fin structures 112. The trenches 114 extend along the X direction. The trenches 114 may be etched using a dry etch (e.g., RIE), a wet etch, and/or combination thereof.

Figure 3:
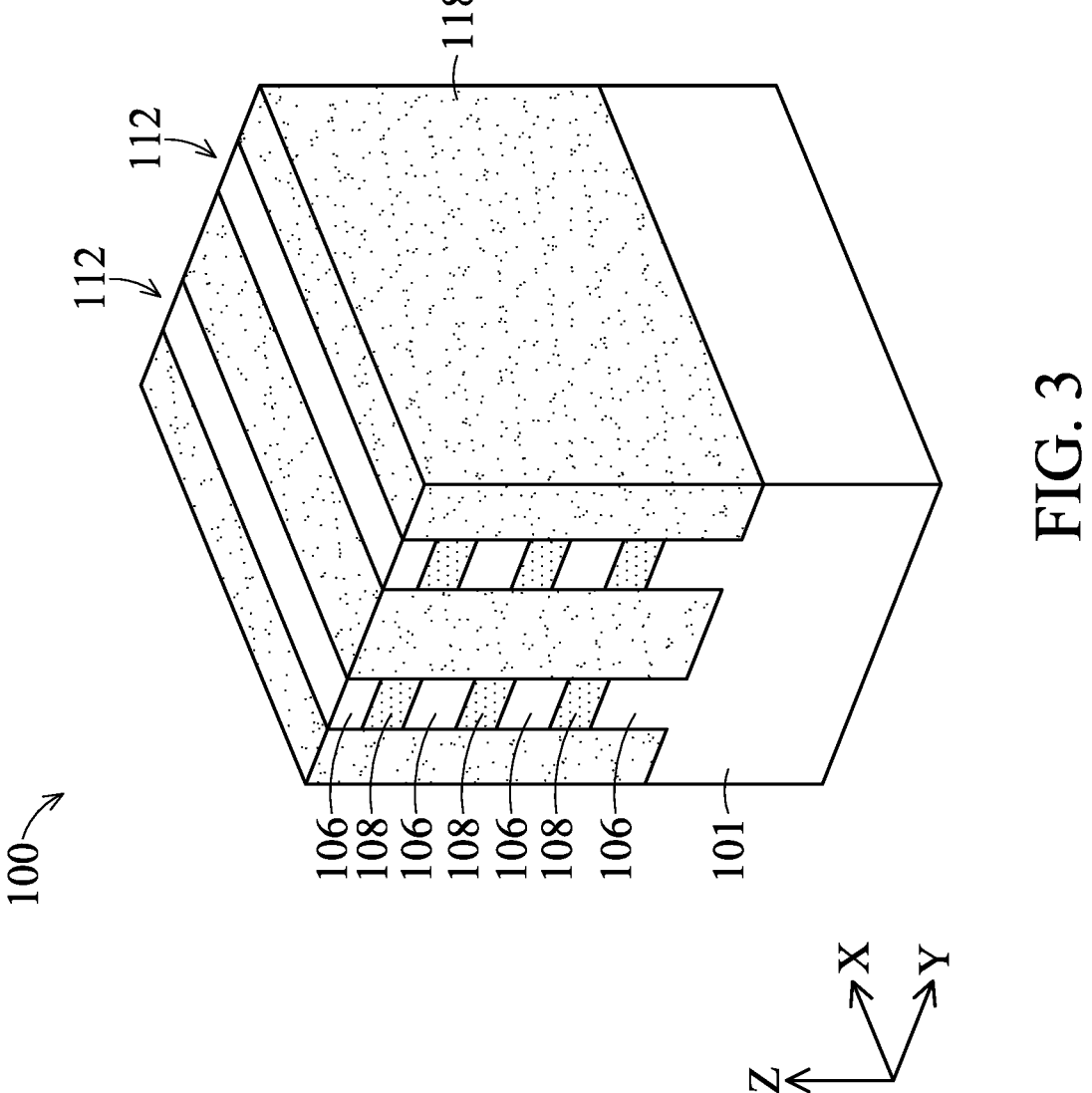

In FIG. 3, after the fin structures 112 are formed, an insulating material 118 is formed on the substrate 101. The insulating material 118 fills the trenches 114 between neighboring fin structures 112 until the fin structures 112 are embedded in the insulating material 118. Then, a planarization operation, such as a chemical mechanical polishing (CMP) method and/or an etch-back method, is performed such that the top of the fin structures 112 is exposed. The insulating material 118 may be made of silicon oxide, silicon nitride, silicon oxynitride (SiON), SiOCN, SiCN, fluorine-doped silicate glass (FSG), a low-K dielectric material, or any suitable dielectric material. The insulating material 118 may be formed by any suitable method, such as low-pressure chemical vapor deposition (LPCVD), plasma enhanced CVD (PECVD) or flowable CVD (FCVD).

Figure 4:
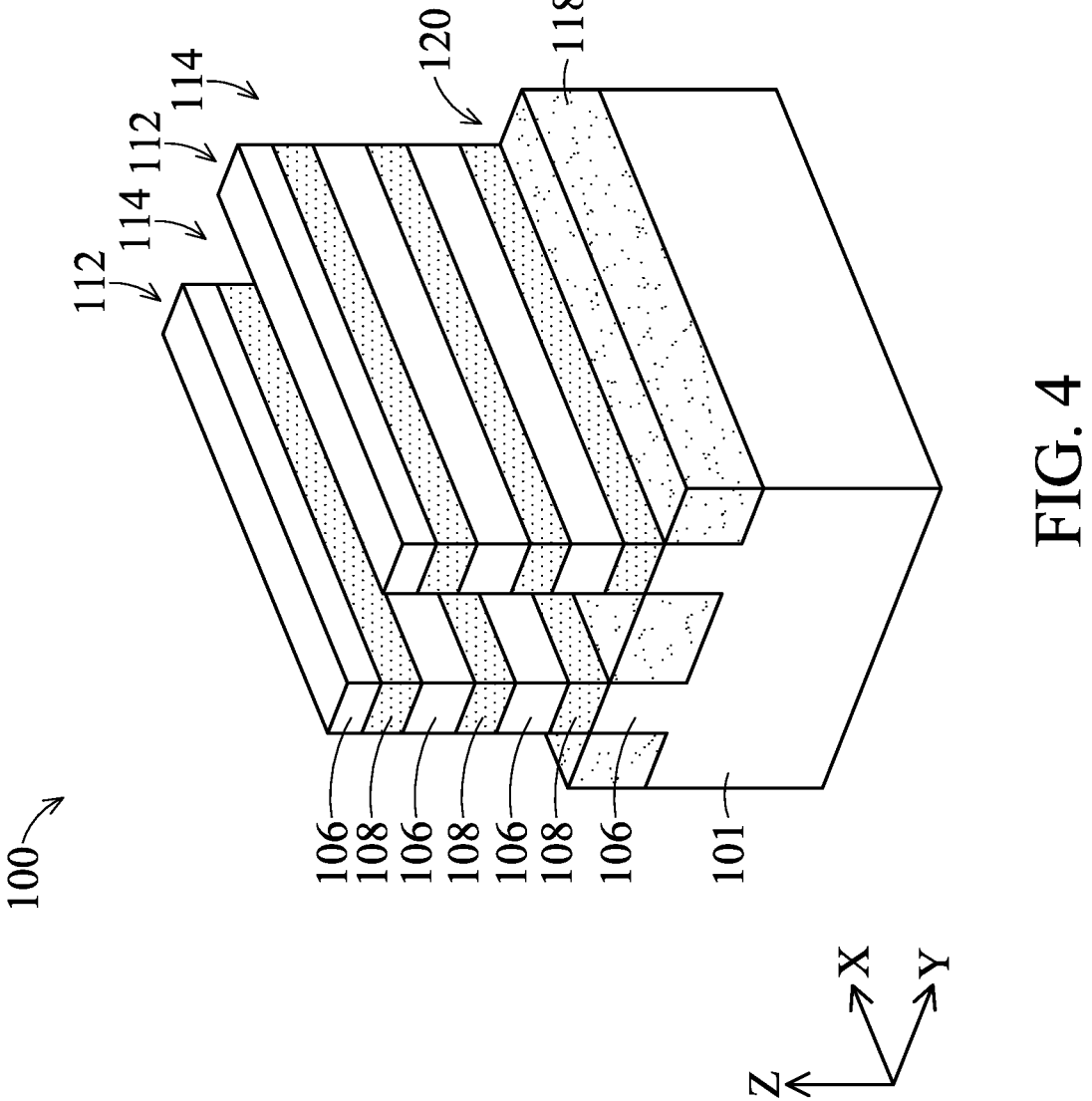

In FIG. 4, the insulating material 118 is recessed to form an isolation region 120. The recess of the insulating material 118 exposes portions of the fin structures 112, such as the stack of semiconductor layers 104. The recess of the insulating material 118 reveals the trenches 114 between the neighboring fin structures 112. The isolation region 120 may be formed using a suitable process, such as a dry etching process, a wet etching process, or a combination thereof. A top surface of the insulating material 118 may be level with or at a below a surface of the second semiconductor layers 108 in contact with the well portion 116 formed from the substrate 101.

Figure 5:
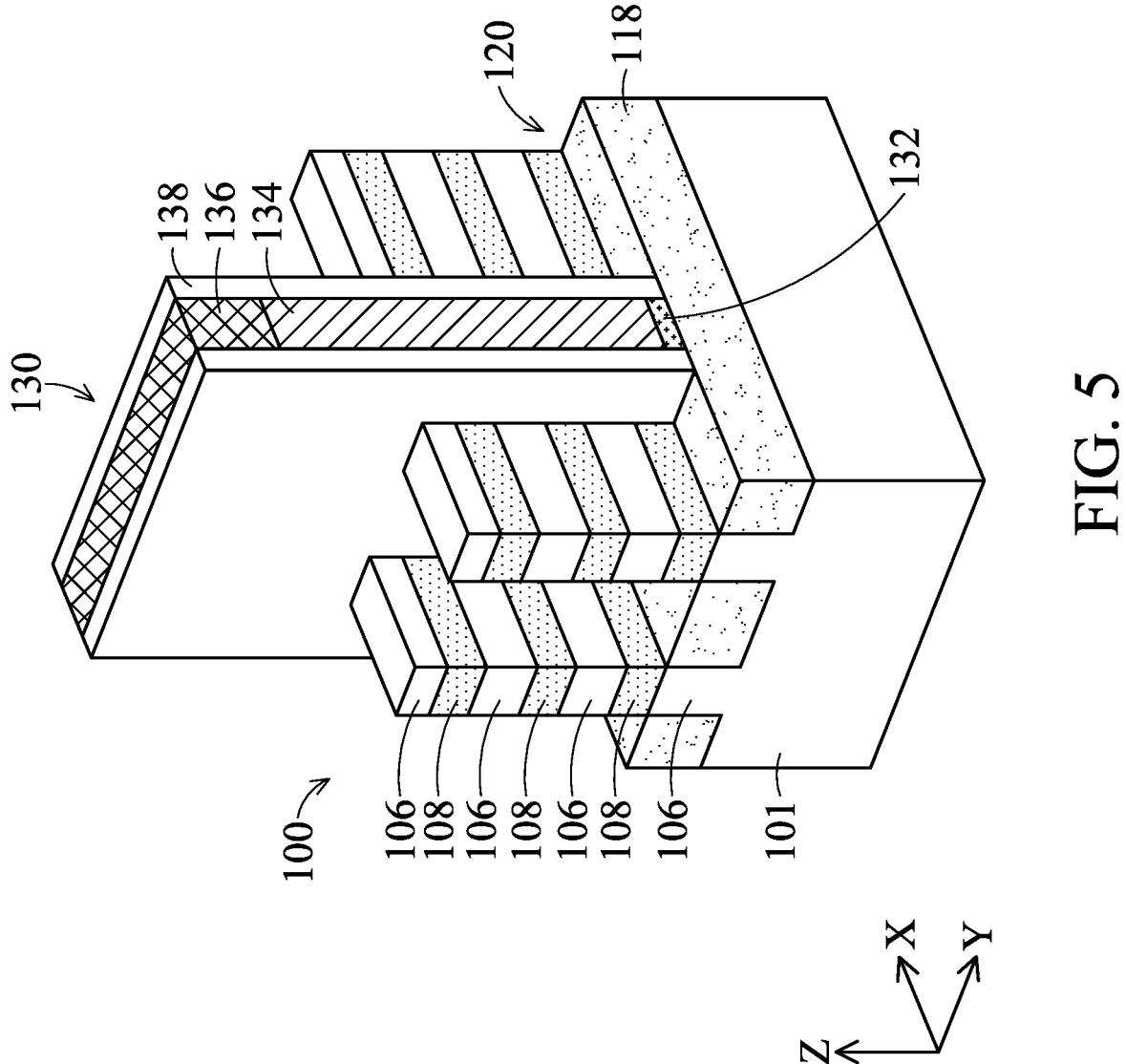

In FIG. 5, one or more sacrificial gate structures 130 (only one is shown) are formed over the semiconductor device structure 100. The sacrificial gate structures 130 are formed over a portion of the fin structures 112. Each sacrificial gate structure 130 may include a sacrificial gate dielectric layer 132, a sacrificial gate electrode layer 134, and a mask layer 136. The sacrificial gate dielectric layer 132, the sacrificial gate electrode layer 134, and the mask layer 136 may be formed by sequentially depositing blanket layers of the sacrificial gate dielectric layer 132, the sacrificial gate electrode layer 134, and the mask layer 136, and then patterning those layers into the sacrificial gate structures 130. Gate spacers 138 are then formed on sidewalls of the sacrificial gate structures 130. The gate spacers 138 may be formed by conformally depositing one or more layers for the gate spacers 138 and anisotropically etching the one or more layers, for example. While one sacrificial gate structure 130 is shown, two or more sacrificial gate structures 130 may be arranged along the X direction in some embodiments.

The sacrificial gate dielectric layer 132 may include one or more layers of dielectric material, such as silicon oxide (SiO$_x$) or a silicon oxide-based material. The sacrificial gate electrode layer 134 may include silicon such as polycrystalline silicon or amorphous silicon. The mask layer 136 may include more than one layer, such as an oxide layer and a nitride layer. The gate spacer 138 may be made of a dielectric material such as silicon oxide, silicon nitride, silicon carbide, silicon oxynitride, SiCN, silicon oxycarbide, SiOCN, and/or combinations thereof.

The portions of the fin structures 112 that are covered by the sacrificial gate electrode layer 134 of the sacrificial gate structure 130 serve as channel regions for the semiconductor device structure 100. The fin structures 112 that are partially exposed on opposite sides of the sacrificial gate structure 130 define source/drain (S/D) regions for the semiconductor device structure 100. In some cases, some S/D regions may be shared between various transistors. For example, various one of the S/D regions may be connected together and implemented as multiple functional transistors. It should be understood that the source region and the drain region can be interchangeably used since the epitaxial features to be formed in these regions are substantially the same. Source/drain region(s) may refer to a source or a drain, individually or collectively dependent upon the context.

Figure 6:
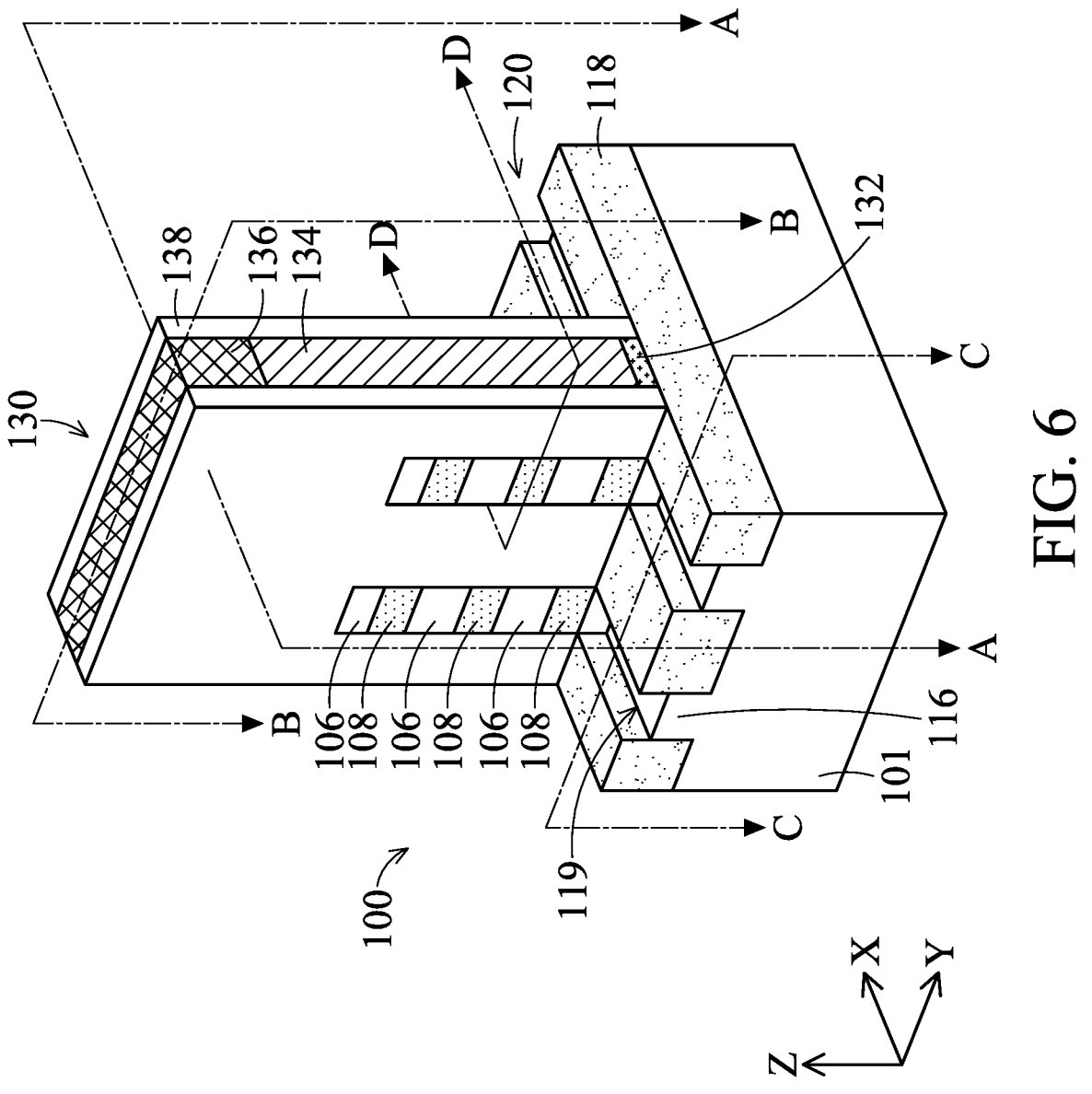
Figure 7B:
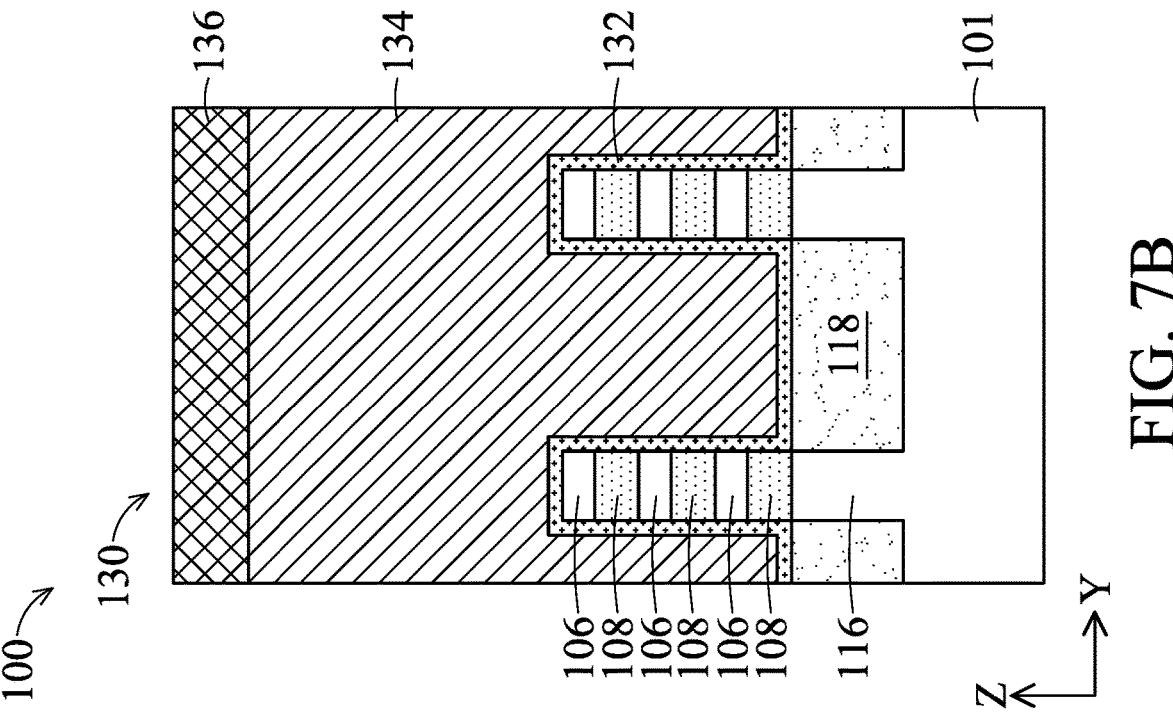
Figure 7A:
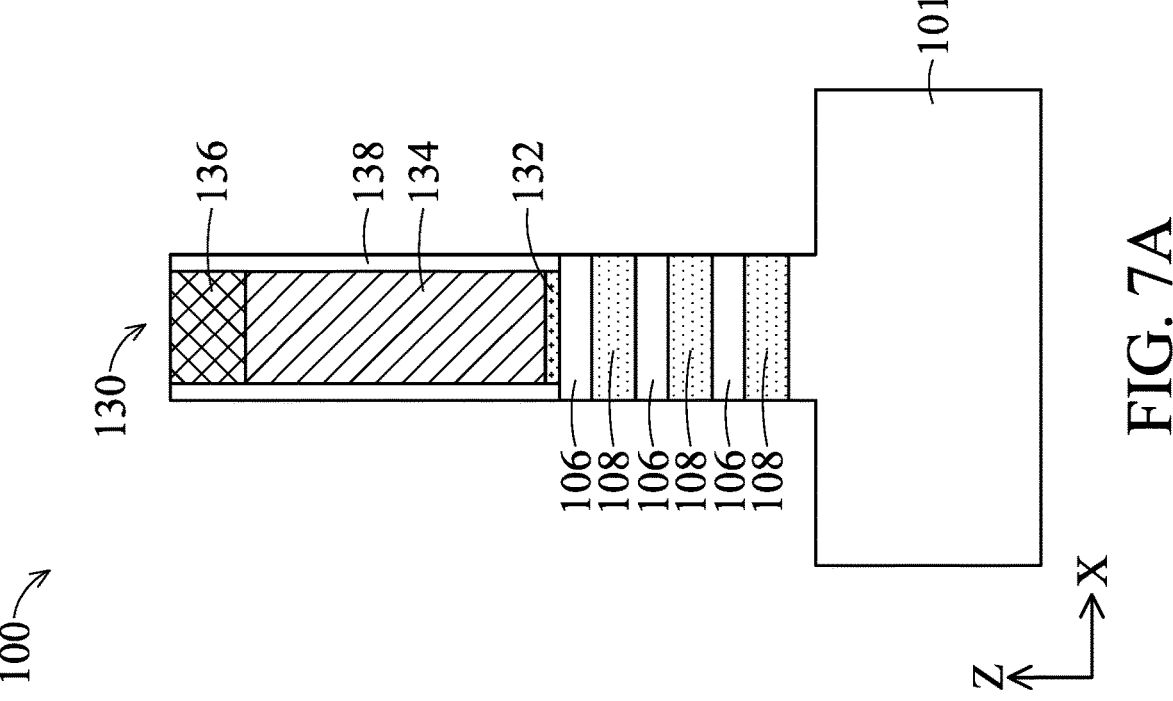
Figure 7D:
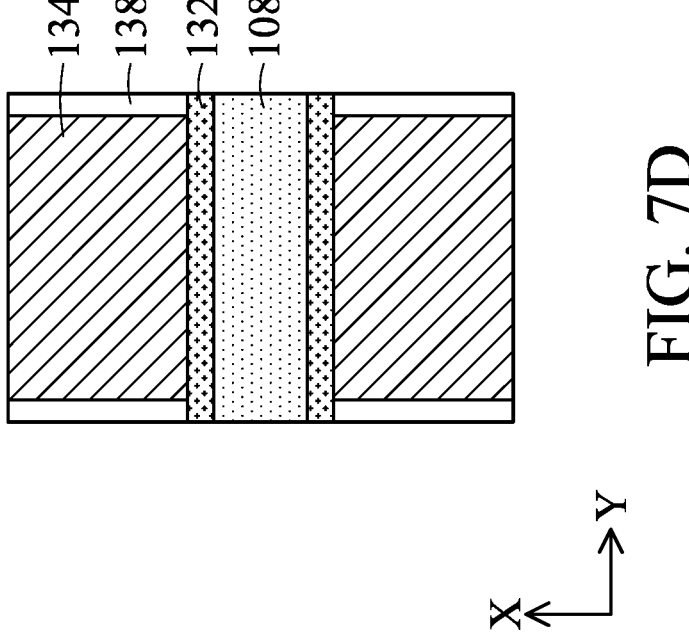
Figure 7C:
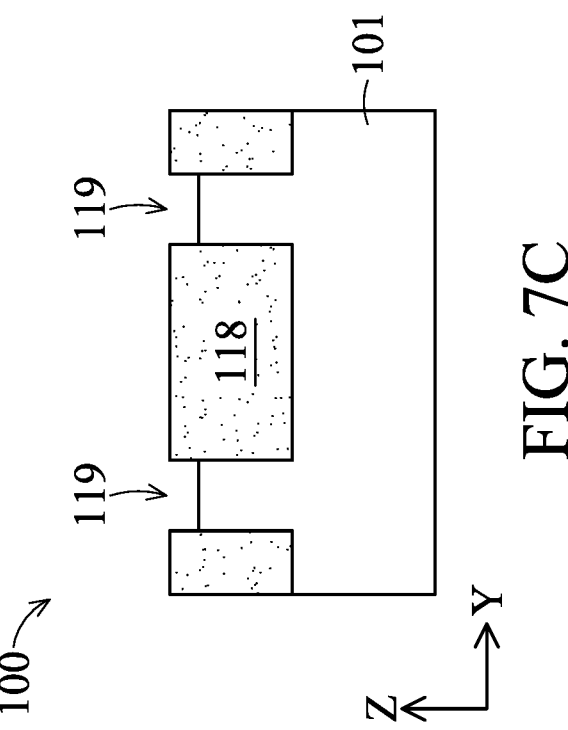
Figure 8B:
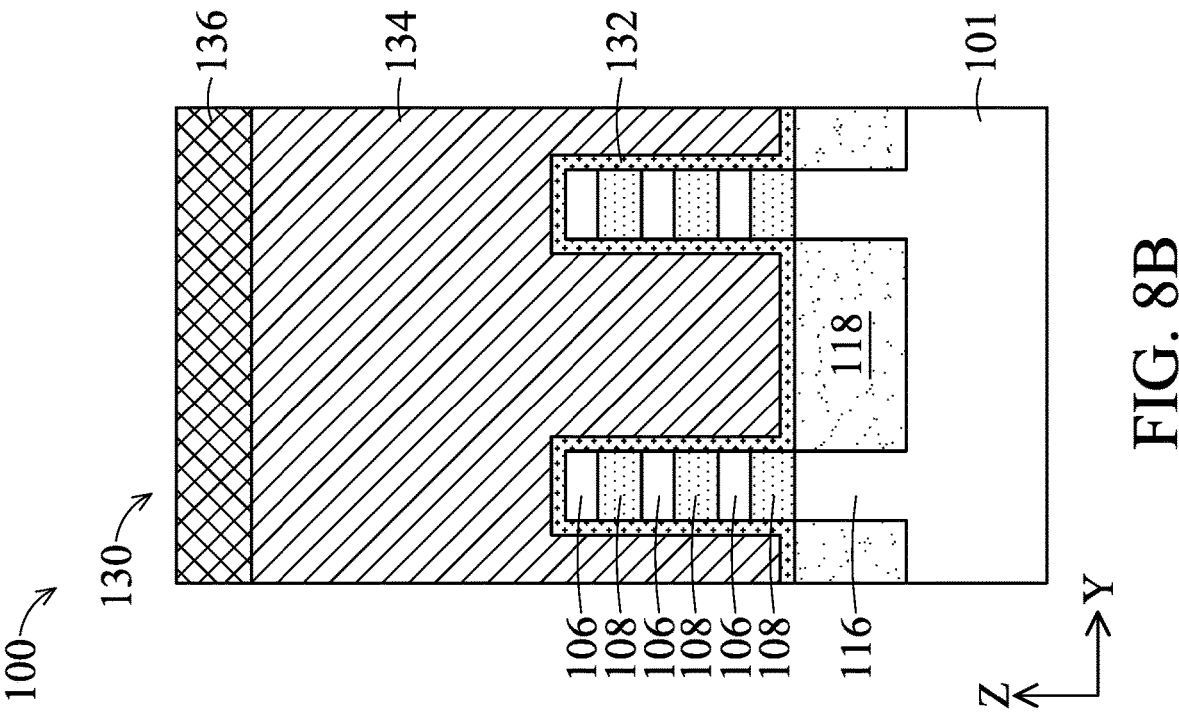
Figure 8A:
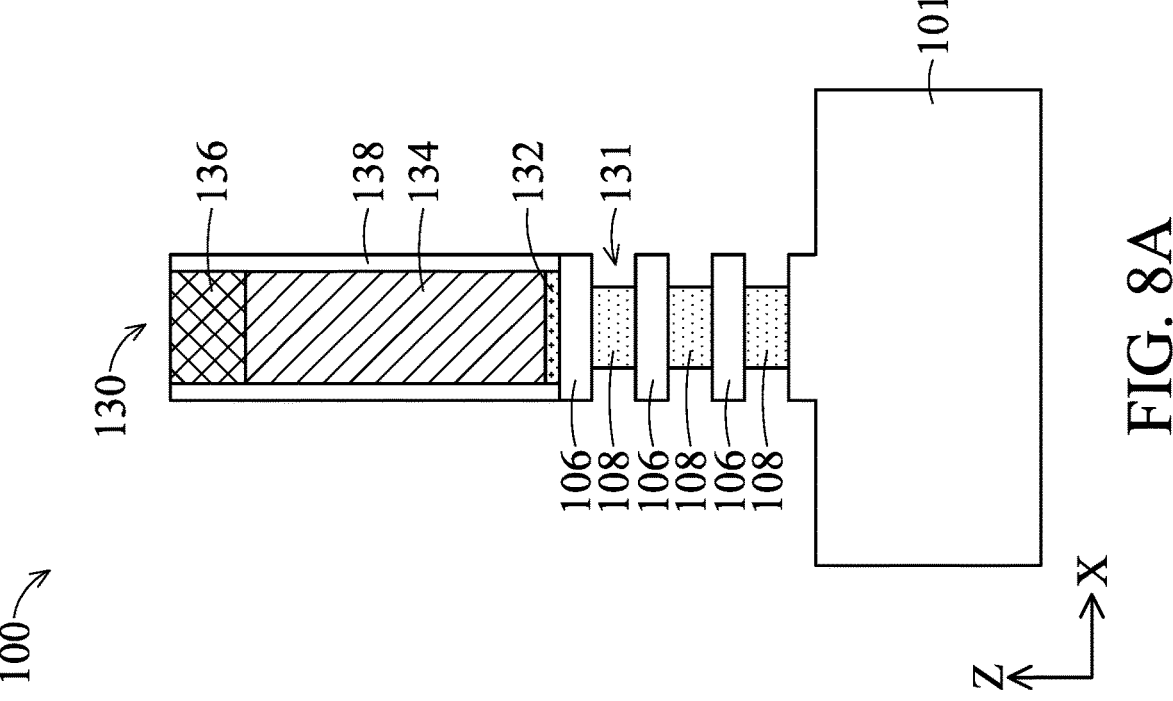
Figure 8D:
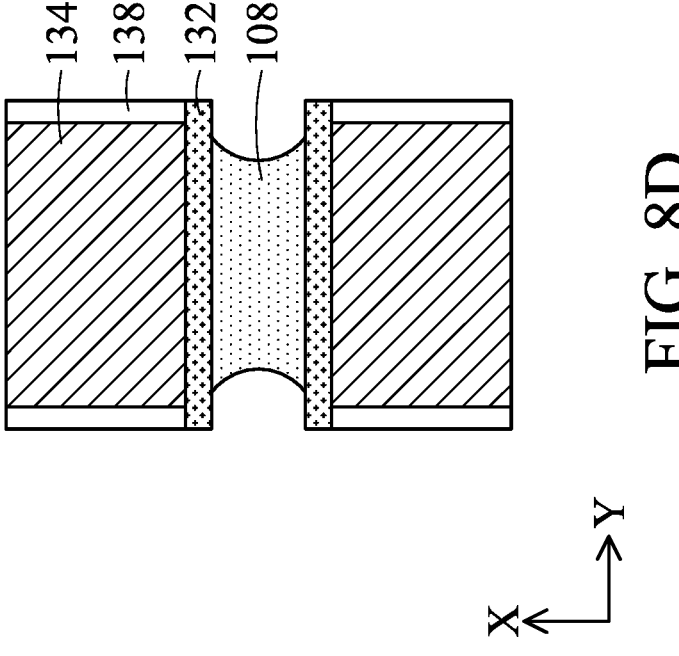
Figure 8C:
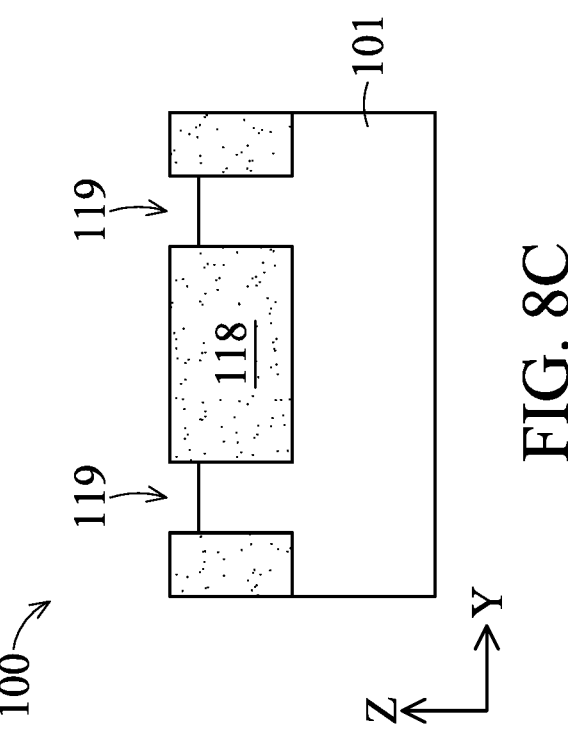

In FIG. 6, the portions of the fin structures 112 in the S/D regions (e.g., regions on opposite sides of the sacrificial gate structure 130) are recessed down below the top surface of the isolation region 120 (or the insulating material 118), by removing portions of the fin structures 112 not covered by the sacrificial gate structure 130. The recess of the portions of the fin structures 112 can be done by an etch process, either isotropic or anisotropic etch process, or further, may be selective with respect to one or more crystalline planes of the substrate 101. The etch process may be a dry etch, such as a RIE, NBE, or the like, or a wet etch, such as using tetramethyalammonium hydroxide (TMAH), ammonium hydroxide (NH$_4$OH), or any suitable etchant. Trenches 119 are formed in the S/D regions as the result of the recess of the portions of the fin structures 112.

FIGS. 7A-17A are cross-sectional side views of various stages of manufacturing the semiconductor device structure 100 taken along cross-section A-A of FIG. 6, in accordance with some embodiments. FIGS. 7B-17B are cross-sectional side views of various stages of manufacturing the semiconductor device structure 100 taken along cross-section B-B of FIG. 6, in accordance with some embodiments. FIGS. 7C-17C are cross-sectional side views of various stages of manufacturing the semiconductor device structure 100 taken along cross-section C-C of FIG. 6, in accordance with some embodiments. FIGS. 6D-17D are cross-sectional side views of various stages of manufacturing the semiconductor device structure 100 taken along cross-section D-D of FIG. 6, in accordance with some embodiments. Cross-section A-A are in a plane of the fin structure 112 (FIG. 4) along the X direction. Cross-section B-B is in a plane perpendicular to cross-section A-A and is in the sacrificial gate structure 130 along the Y direction. Cross-section C-C is in a plane perpendicular to cross-section A-A and is in the S/D features 146 (FIG. 12A) along the Y-direction. Cross-section D-D is in a plane of the second semiconductor layer 108 along the X direction.

In FIGS. 8A-8D, edge portions of each second semiconductor layer 108 of the stack of semiconductor layers 104 are removed horizontally along the X direction. The removal of the edge portions of the second semiconductor layers 108 forms cavities 131. In some embodiments, the portions of the second semiconductor layers 108 are removed by a selective wet etching process. In cases where the second semiconductor layers 108 are made of SiGe and the first semiconductor layers 106 are made of silicon, the second semiconductor layer 108 can be selectively etched using a wet etchant such as, but not limited to, ammonium hydroxide (NH$_4$OH), tetramethylammonium hydroxide (TMAH), ethylenediamine pyrocatechol (EDP), or potassium hydroxide (KOH) solutions.

Figure 12A:
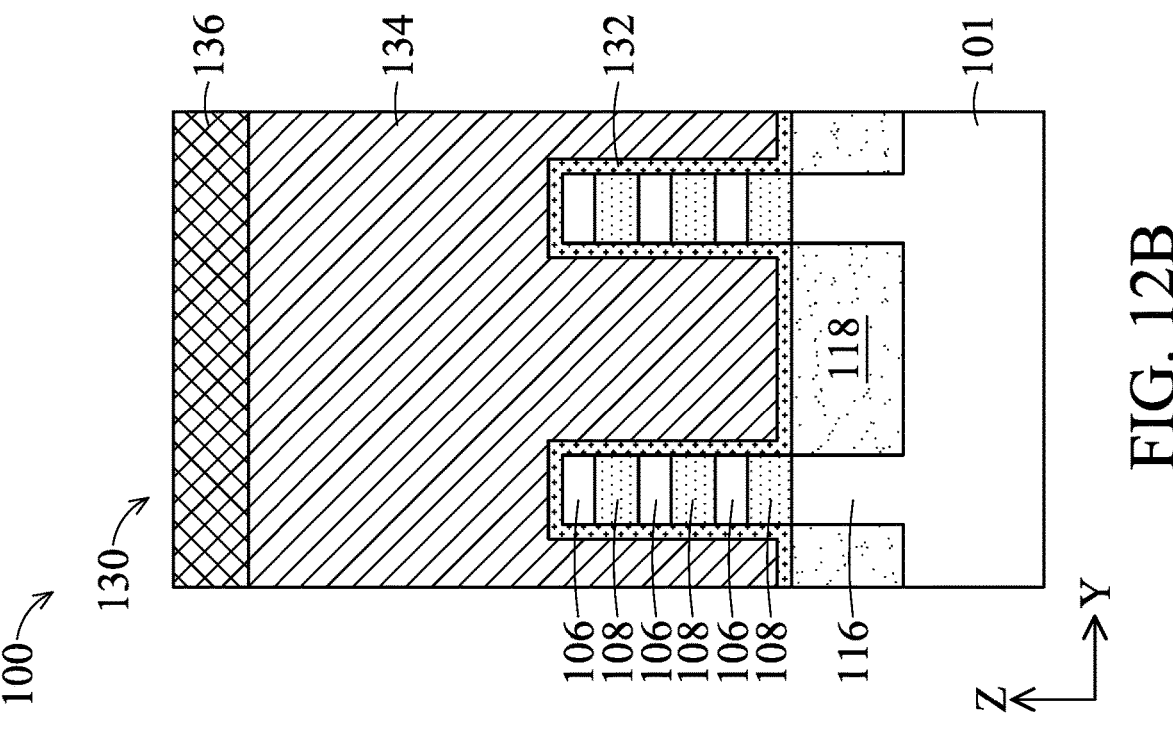
Figure 12B:
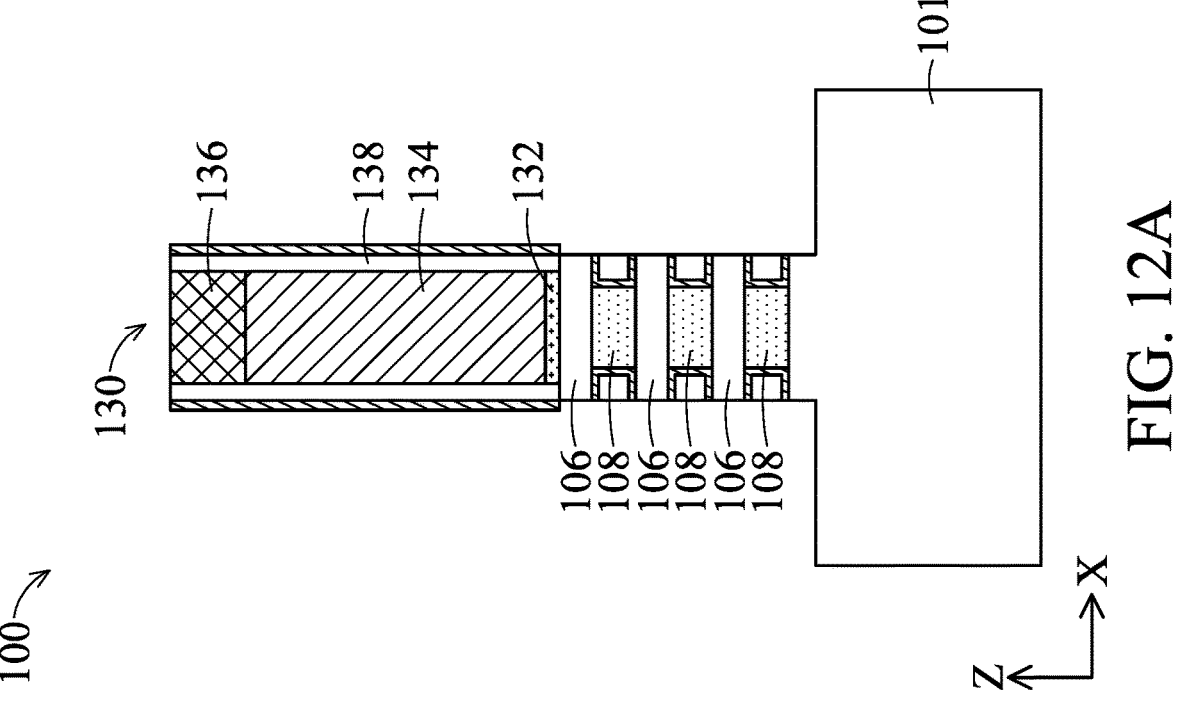
Figure 12D:
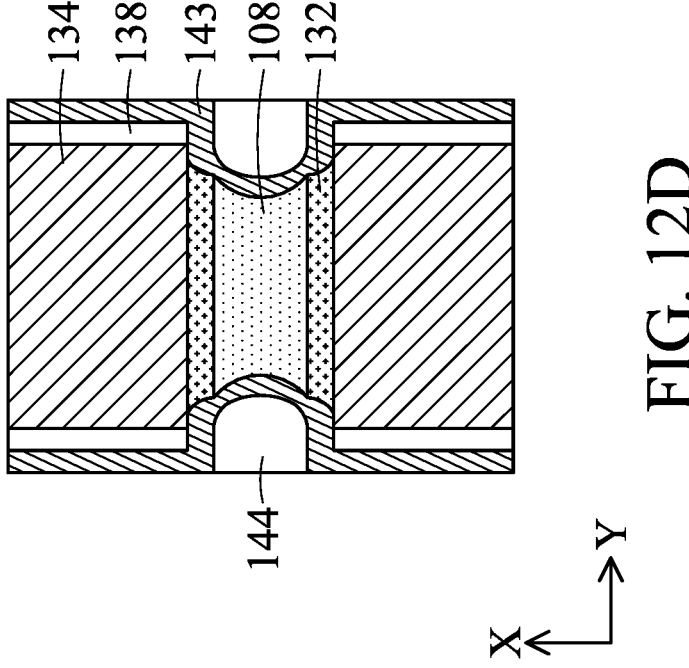
Figure 12C:
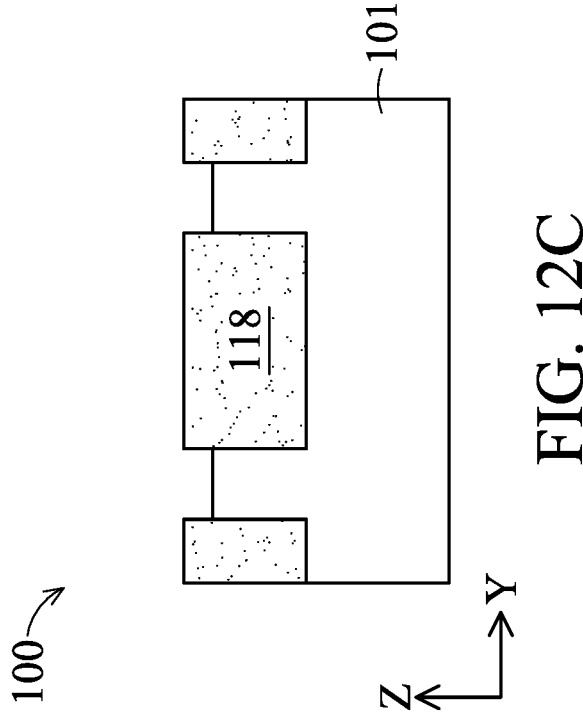
Figures 1, 2, 12A:
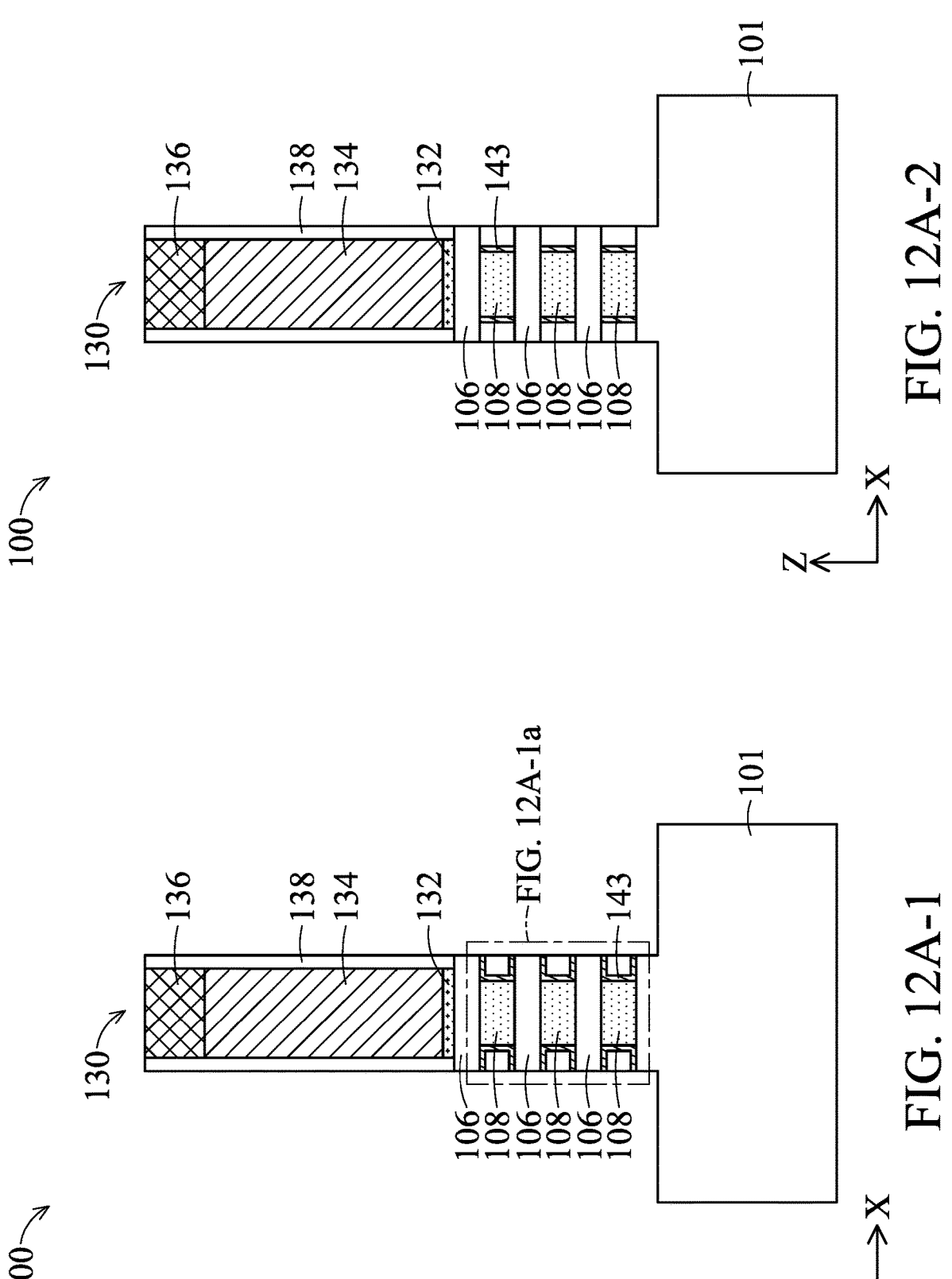

In FIGS. 9A-9D, after removing edge portions of each second semiconductor layers 108, a cap layer 143 is conformally formed on the exposed surfaces of the sacrificial gate structures 130, the first semiconductor layers 106, the second semiconductor layers 108, and the sacrificial gate dielectric layer 132. In some embodiments, the cap layer 143 is further formed on a portion the exposed wells 116 of the substrate 101. The cap layer 143 serves as an etch stop layer to prevent etchant chemicals (used during subsequent removal of the second semiconductor layers 108) from breaking through subsequently formed inner spacers 144 (FIGS. 10A and 10B). If the inner spacers 144 are broken, the etch process to remove the second semiconductor layers 108 may also remove subsequently formed S/D features 146 (FIG. 12A). This is because the atomic percentage of germanium of the second semiconductor layers 108 is similar to or lower than that of the material of the S/D features 146 (e.g., SiGe:B). As a result, the S/D features 146 may be damaged or even be removed entirely by the etch process. The formation of the cap layer 143 between the second semiconductor layers 108 and the subsequent inner spacers 144 avoids or minimizes the damage to the inner spacers 144 during removal of the second semiconductor layers 108, thereby protecting the integrality of the S/D features 146. The combined thickness of the cap layer 143 and the inner spacers 144 should avoid reliability issues, such as time dependent dielectric breakdown (TDDB).

The cap layer 143 may be any suitable material that can withstand a chemical attack during subsequent removal of the second semiconductor layers 108. In various embodiments, the cap layer 143 is made of a dielectric material that is different from the material of the gate spacers 138. In some embodiments, the cap layer 143 is a nitride. Suitable materials for the cap layer 143 may include, but are not limited to, SiN, SiCN, SiON, SiOCN, or any suitable nitride-based dielectrics. The cap layer 143 may be formed by converting a portion of the sacrificial gate structures 130, the first semiconductor layers 106, the second semiconductor layers 108, the wells 106 of the substrate 101, and the sacrificial gate dielectric layer 132 into a nitride layer. For example, the exposed surfaces of the sacrificial gate structures 130, the first semiconductor layers 106, the second semiconductor layers 108, the wells 106 of the substrate 101, and the sacrificial gate dielectric layer 132 may be subjected to a nitridation process, such as rapid thermal nitridation (RTN) process, high pressure nitridation (HPN) process, decoupled plasma nitridation (DPN) process.

Portions of the sacrificial gate dielectric layers 132, such as the surface portion of the sacrificial gate dielectric layers 132, may be nitrided after the nitridation process. In cases where the sacrificial gate dielectric layer 132 is silicon oxide (SiO$_x$), such as SiO$_2$, a portion of the sacrificial gate dielectric layer 132 may become SiON. Likewise, portions of the second semiconductor layers 108, such as the surface portion of the second semiconductor layers 108, may be nitrided after the nitridation process. In cases where the second semiconductor layer 108 is SiGe, a portion of the second semiconductor layer 108 may become SiGeN.

In addition to nitriding portions of the sacrificial gate dielectric layer 132 and the second semiconductor layers 108, the nitridation process may be performed so that the gate spacers 138 are partially or fully nitrided. For example, the surface portion of the gate spacers 138 may be nitrided, such as the embodiment shown in FIG. 9D. Alternatively, the entire portion of the gate spacers 138 may be nitrided, such as the embodiment shown in FIG. 9D-1. In some embodiments, the nitridation process may be performed so that portions of the second semiconductor layers 108 and the sacrificial gate dielectric layer 132 are nitrided while the gate spacers 138 are not nitrided, such as the embodiment shown in FIG. 9D-2. In some embodiments, the gate spacers 138 may be a multi-layer structure and only a portion of the sub-layer is nitrided. In one exemplary embodiment, the gate spacers 138 may include a first sublayer 138a and a second sublayer 138b disposed between the first sublayer 138a and the second semiconductor layer 108. Depending on the application, the first sublayer 138a of the gate spacer 138 may be SiN and the second sublayer 138b of the gate spacer 138 may be SiON. In some cases, after the nitridation process (e.g., RTN process), the first sublayer 138a may be completely nitrided (meaning the nitrogen content in the first layer 138a is increased), while the second sublayer 138b may be partially nitrided, such as the alternative embodiment shown in FIG. 9D-3. In other words, the first sublayer 138a (now outer cap layer) may have a first nitrogen content and the second sublayer 138b (now inner cap layer) may have a second nitrogen content less than the first nitrogen content. In some embodiments, the gate spacer 138 that has not been nitrided may have a third nitrogen content less than the second nitrogen content.

In various embodiments where the nitridation process is used, the nitrogen content in the cap layer 143 is gradually decreased along a direction away from the surface of the nitrided layer. This applies to the sacrificial gate dielectric layer 132, the second semiconductor layer 108, and the gate spacer 132.

Additionally and/or alternatively, the cap layer 143 may be deposited on the exposed surfaces of the sacrificial gate structures 130, the first semiconductor layers 106, and the second semiconductor layers 108 using a thermal or plasma-based nitridation process. Other materials, such as oxide-based dielectrics, carbon-based dielectrics, or high-k materials (e.g., a material having a k value ≥7), or any combination thereof, may also be used. In such cases, the cap layer 143 may be a single layer or a multi-layer structure comprising any of the materials for the cap layer 143 discussed above, and may be deposited by a conformal deposition process, such as ALD. The precursors may be chosen to make the conformal deposition process a selective or non-selective deposition process. In some embodiments, the conformal deposition process is a non-selective process, meaning the cap layer 143 is globally formed on the exposed surfaces of the sacrificial gate structures 130 (e.g., mask layer 136 and gate spacers 138), the first semiconductor layers 106, the second semiconductor layers 108, the sacrificial gate dielectric layer 132, and optionally the wells 116 of the substrate 101.

Figure 9B:
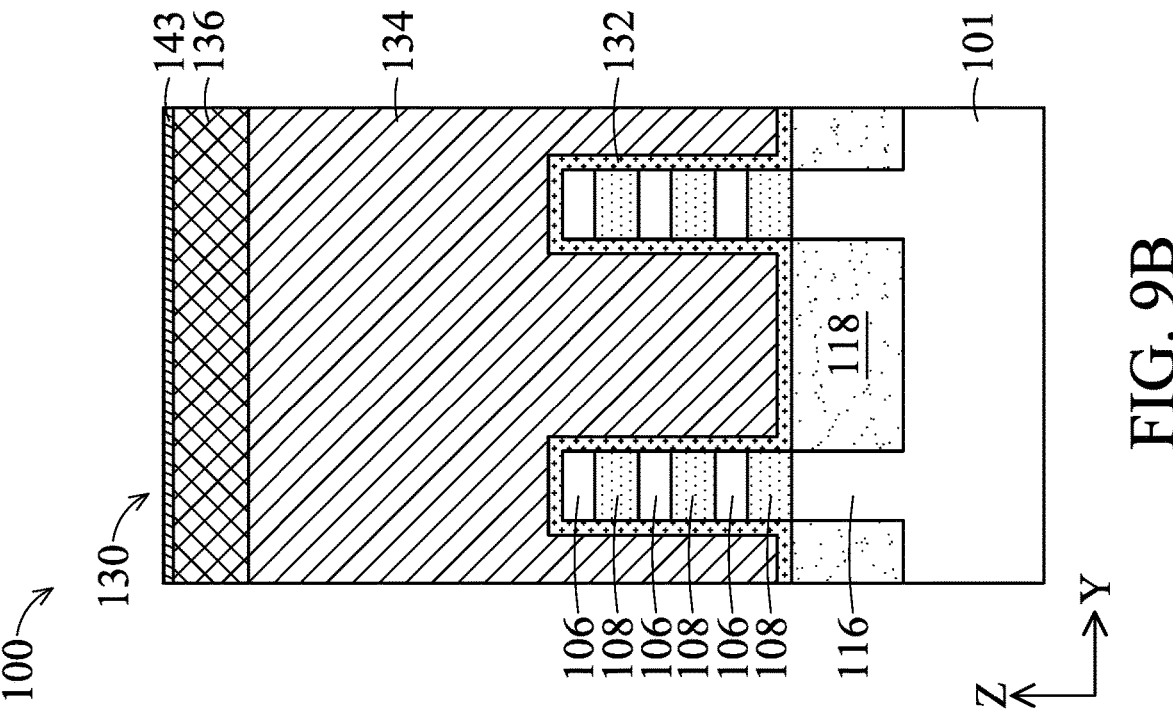
Figure 9A:
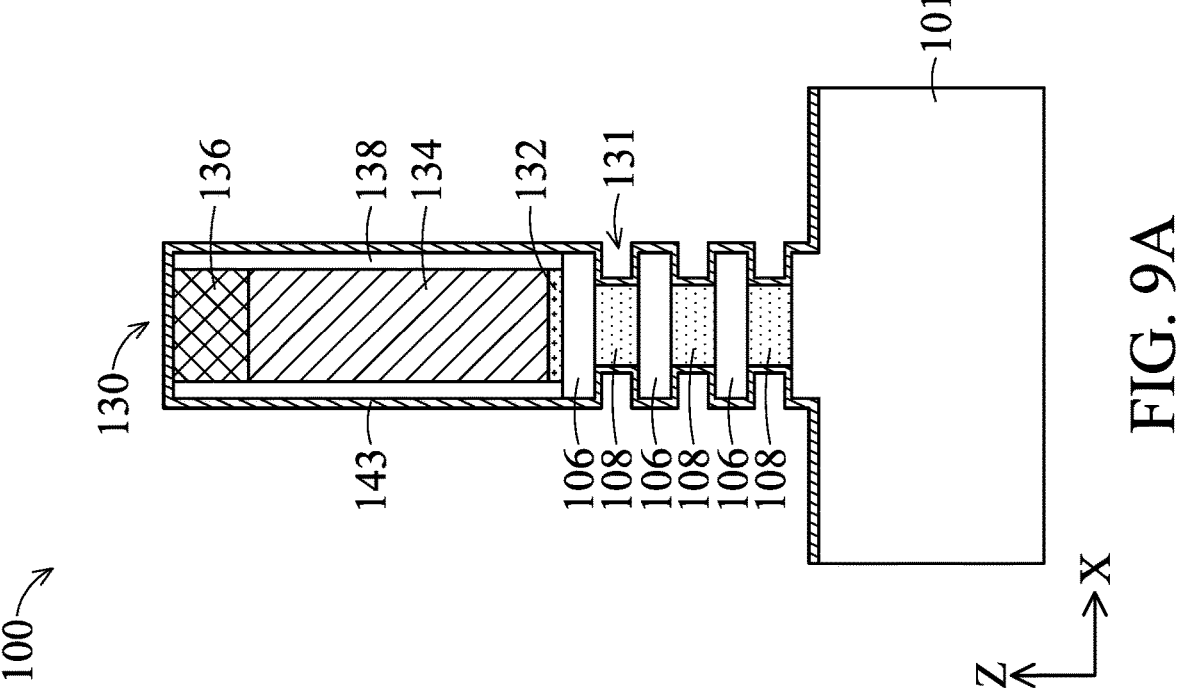
Figure 9C:
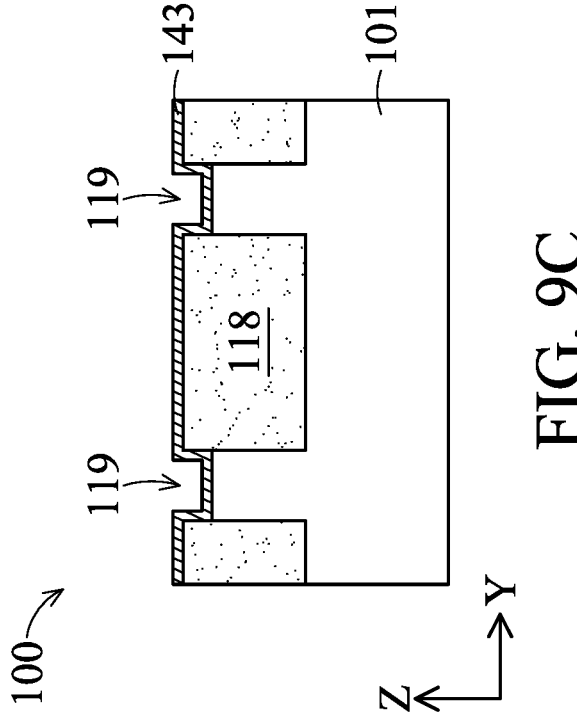
Figures 2, 9A:
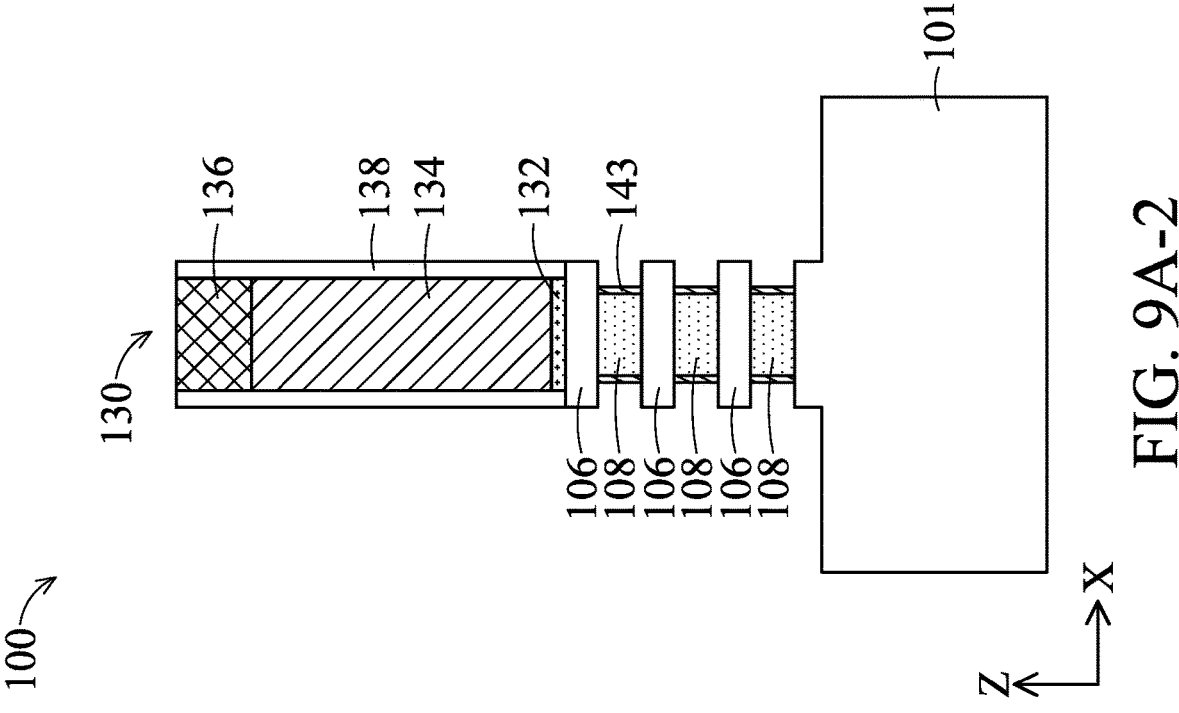
Figures 1, 9A:
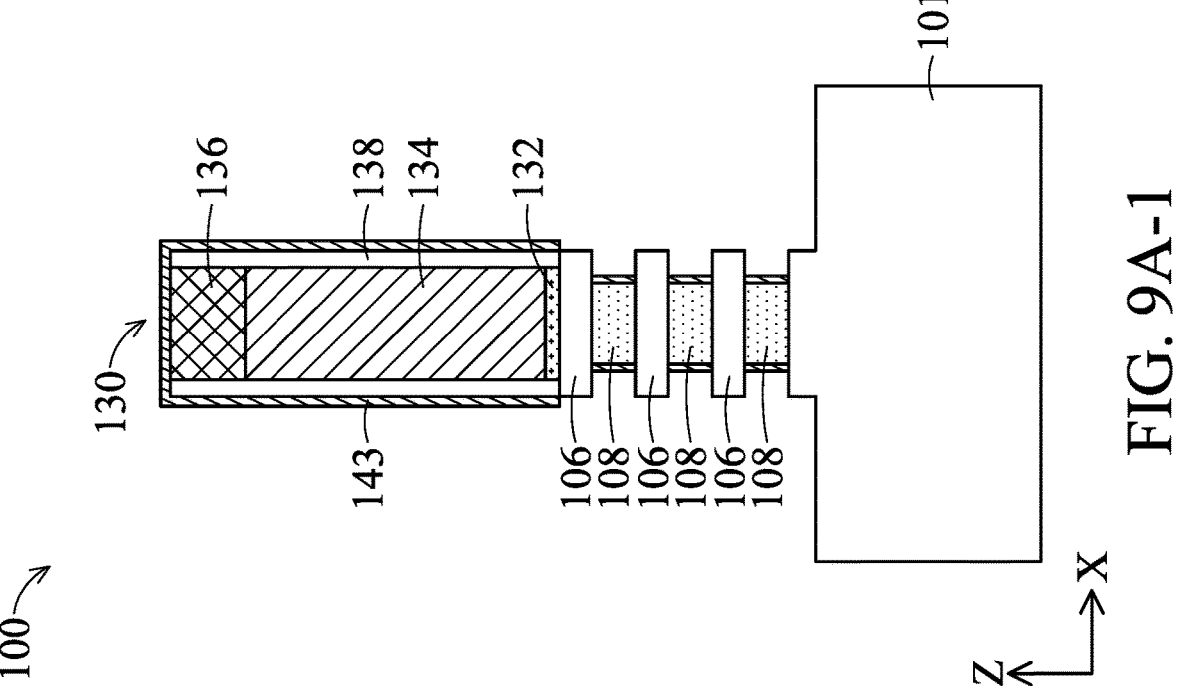
Figures 3, 9A:
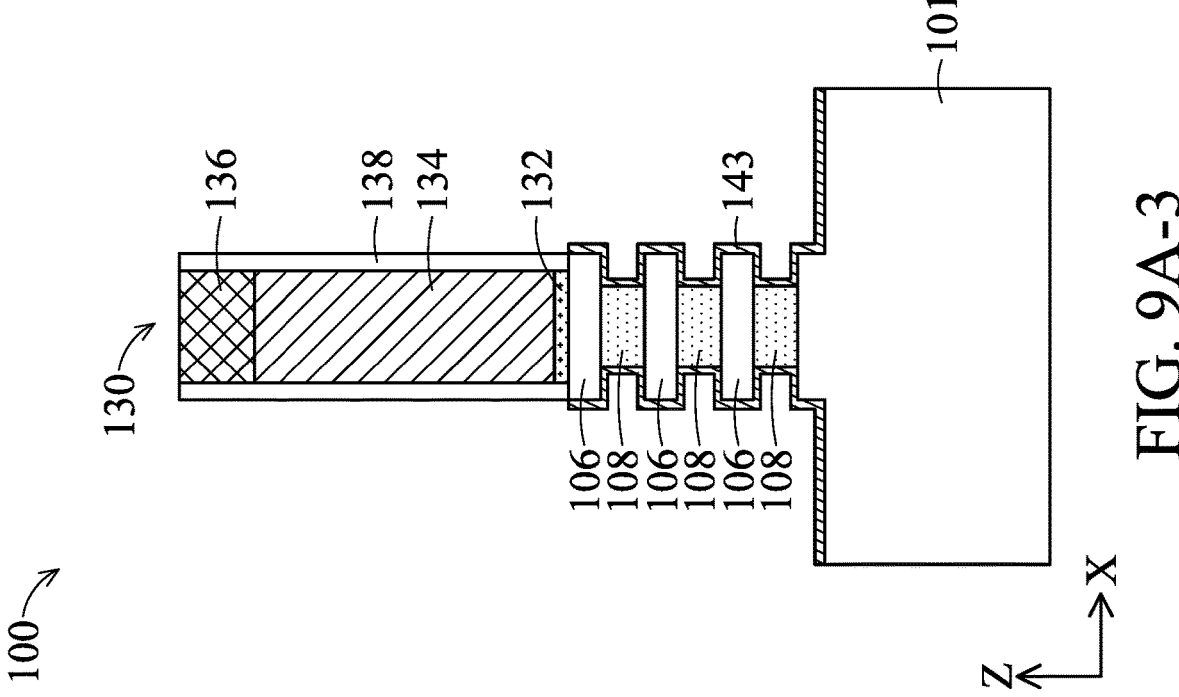
Figures 1, 9D:
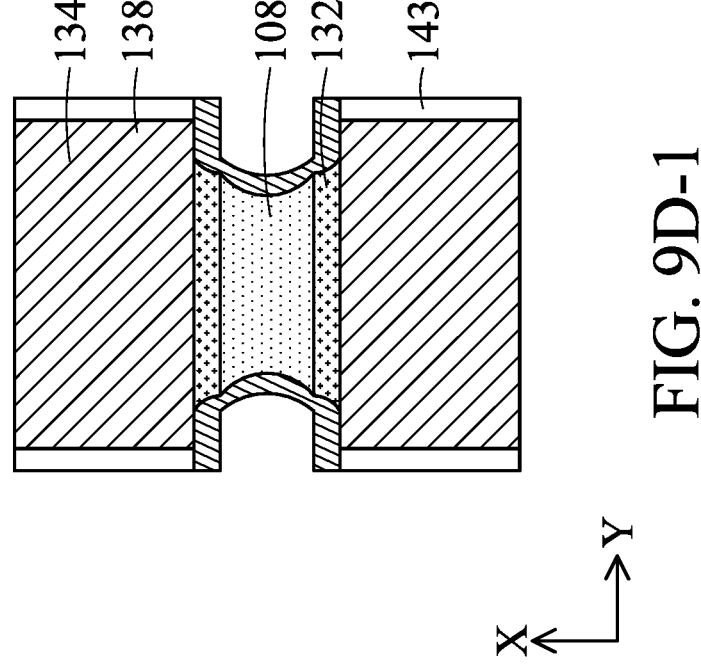
Figure 9D:
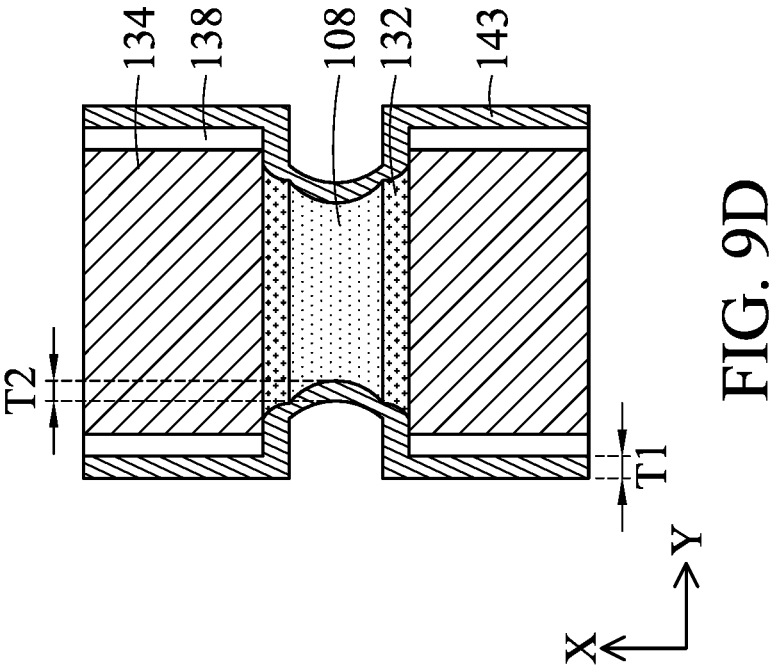
Figures 3, 9D:
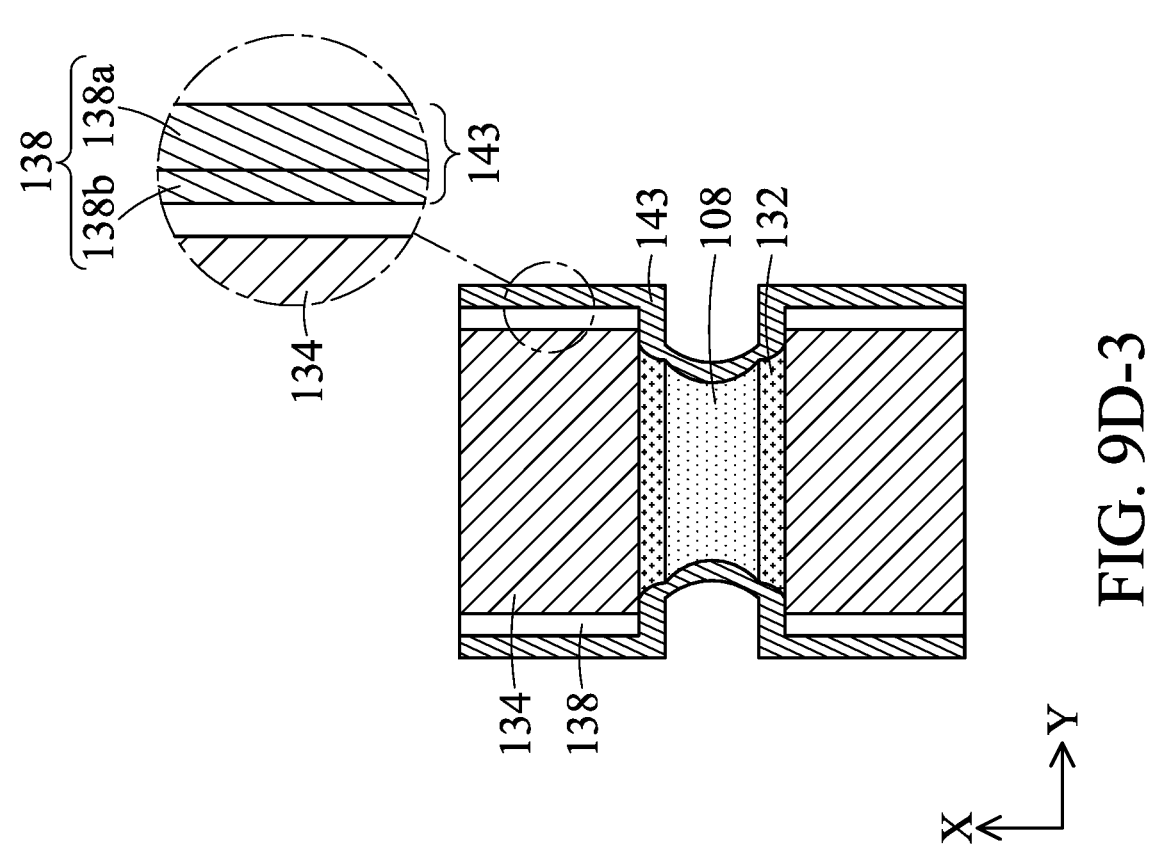
Figures 2, 9D:
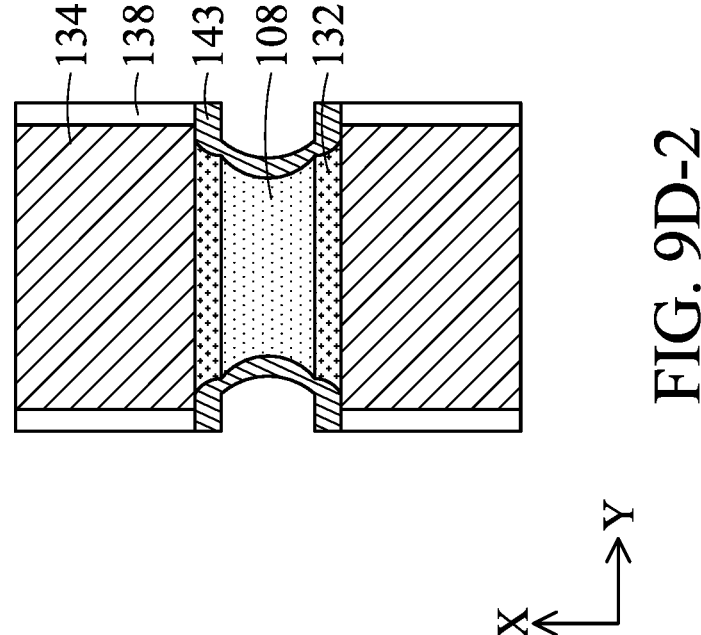
Figure 10B:
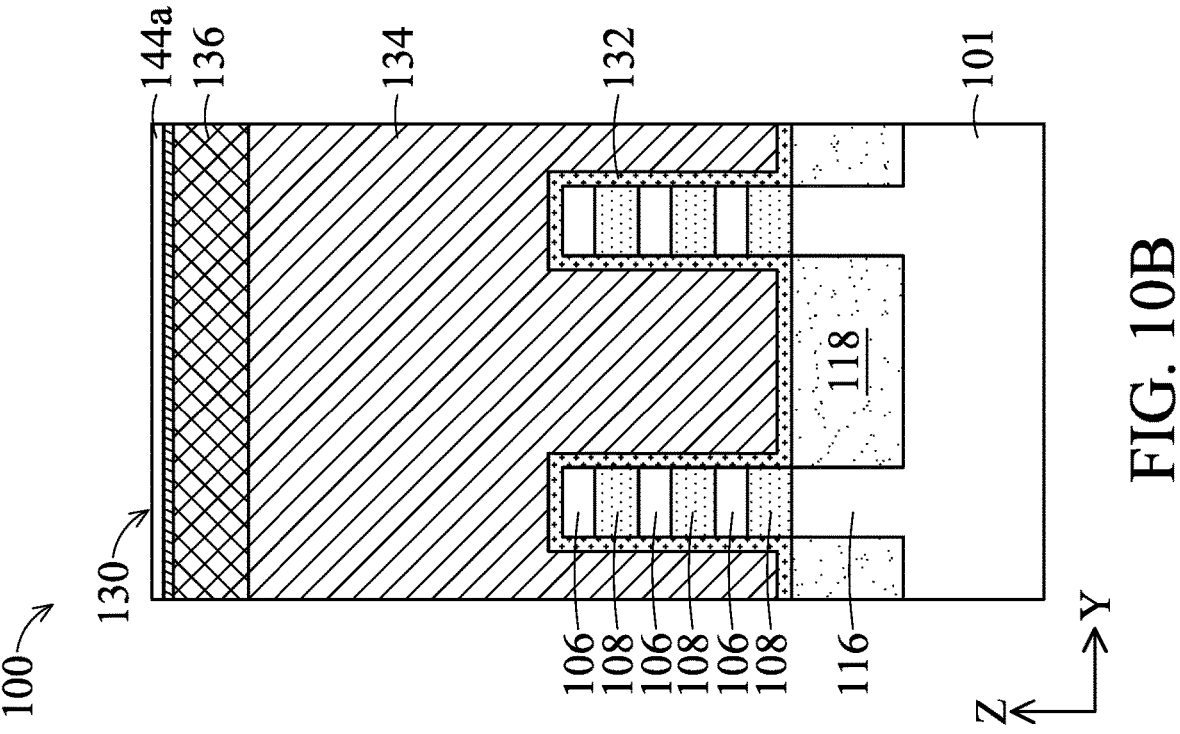
Figure 10A:
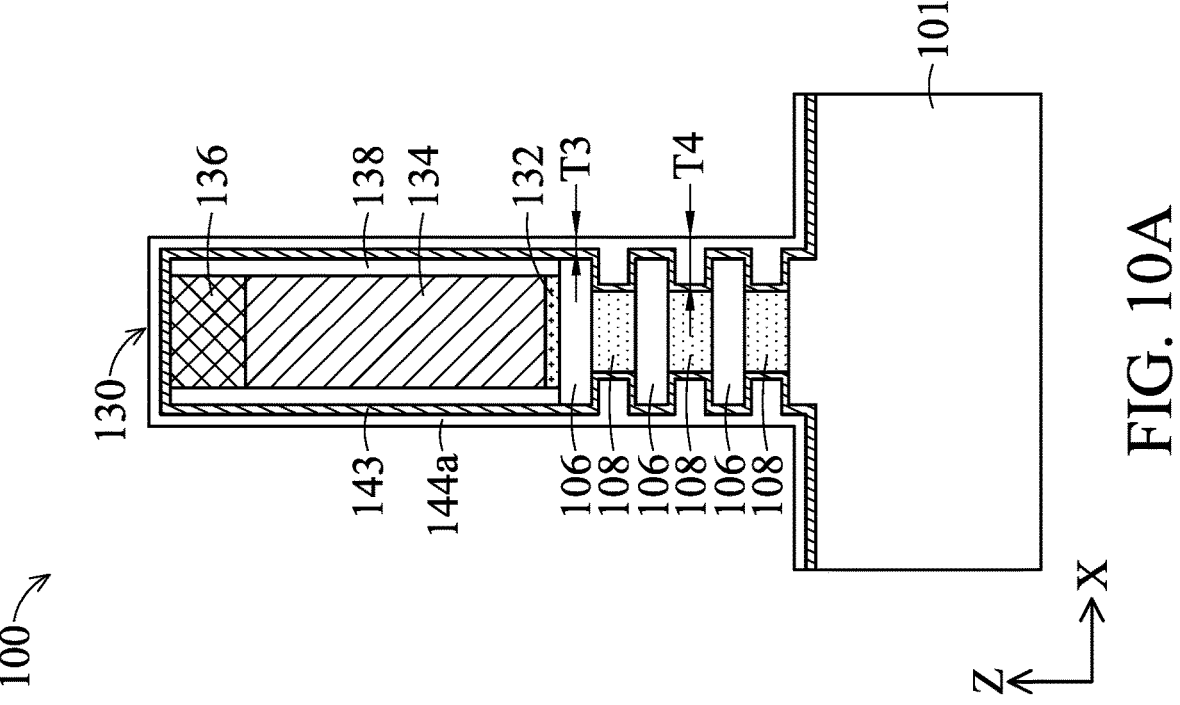
Figure 10D:
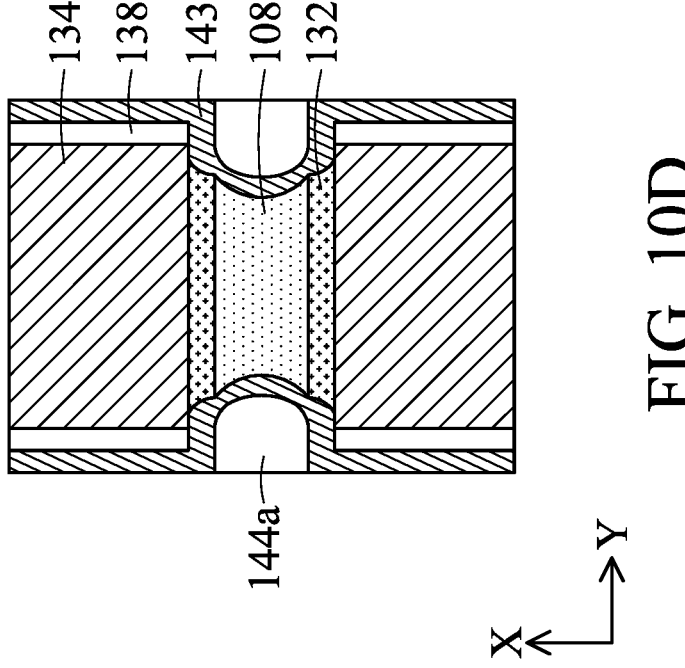
Figure 10C:
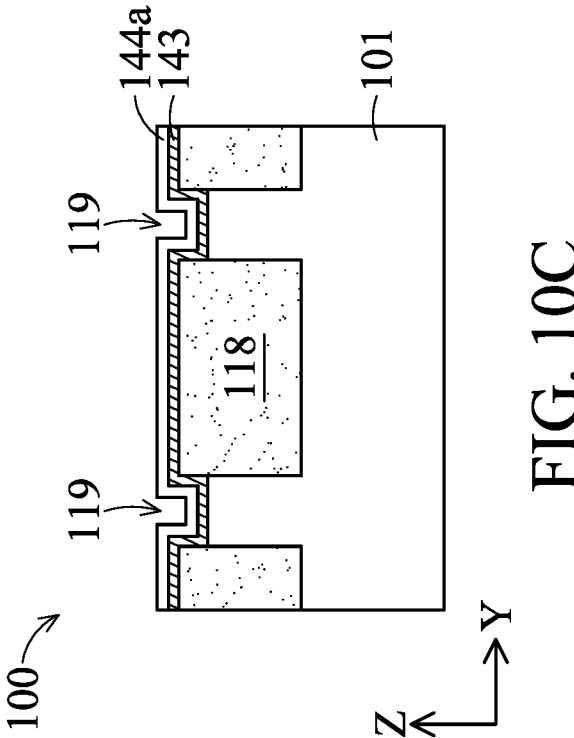

In some embodiments, after the cap layer 143 is globally formed on the exposed surfaces of the sacrificial gate structures, the first semiconductor layers 106, the second semiconductor layers 108, the sacrificial gate dielectric layer 132, and optionally the wells 116 of the substrate 101, an etch process may be performed so that the cap layer 143 on the exposed portion of the first semiconductor layers 106 is selectively removed, leaving the cap layer 143 on the exposed surfaces of the second semiconductor layers 108, the sacrificial gate structures 130, and the sacrificial gate dielectric layer 132 (not shown), as the alternative embodiment shown in FIG. 9A-1. Since the cap layer 143 on the sacrificial gate structure 130 may include higher nitrogen content (from the cap layer 143 itself and the gate spacers 138 made of nitrogen-containing material) than the cap layer 143 on the first semiconductor layers 106, and the cap layer 143 within the cavities 131 is more difficult for the etchant to reach, the etch process may remove the cap layer 143 on the first semiconductor layer 106 at a faster rate than that of the cap layer 143 on the sacrificial gate structure 130 and the second semiconductor layer 108. As a result, the entire cap layer 143 on the first semiconductor layer is removed, while a portion of the cap layer 143 on the sacrificial gate structure 130, the second semiconductor layer 108, and the sacrificial gate dielectric layer 132 is slightly removed. One exemplary etch process may include exposing the exposed surfaces of the sacrificial gate structures, the first semiconductor layers 106, the second semiconductor layers 108, the sacrificial gate dielectric layer 132, and optionally the wells 116 of the substrate 101 to fluorine (F) radicals at a chamber temperature of about 0° C. to about 50° C., a chamber pressure of about 100 mTorr to about 400 mTorr, and a source power of about 100 Watts to about 400 Watts. The fluorine radicals may be introduced from a remote plasma source in which one or more fluorine-containing precursors are employed. Suitable fluorine-containing precursor may include, but is not limited to, tetrafluoromethane ($CF_4$), trifluoromethane ($CHF_3$), methyl fluoride ($CH_3F$), difluoromethane ($CH_2F_2$), hexafluoroethane ($C_2F_6$), octofluorocyclobutane ($C_4F_8$), hexafluorobutadiene ($C_4F_6$), perfluoropropane ($C_2F_8$), sulfur hexafluoride ($SF_6$), nitrogen trifluoride ($NF_3$), or the like. Another exemplary etch process may include exposing the exposed surfaces of the sacrificial gate structures, the first semiconductor layers 106, the second semiconductor layers 108, the sacrificial gate dielectric layer 132, and optionally the wells 116 of the substrate 101 to a gas mixture comprising hydrogen fluoride (HF) and ammonia ($NH_3$) at a chamber temperature of about 20° C. to about 50° C., and a chamber pressure of about 100 mTorr to about 500 mTorr. In some embodiments, the HF and $NH_3$ may be flowed into the process chamber at a flow rate ratio of about 1 (HF):5 ($NH_3$) to about 1 (HF):10 ($NH_3$).

In some embodiments, the etch process is performed so that the cap layer 143 on the exposed portion of the sacrificial gate structures 130 and the first semiconductor layers 106 are selectively removed, leaving the cap layer 143 on the exposed surfaces of the second semiconductor layers 108 and the sacrificial gate dielectric layer 132 (not shown), as the alternative embodiment shown in FIG. 9A-2. One exemplary embodiment may include using radicals from $NF_3$, $H_2$, and $N_2$ to etch the nitride-based or carbide-based cap layer materials from the gate spacers 138. Alternatively, the deposition process may be performed so that the cap layer 143 is selectively formed on the second semiconductor layers 108 and the sacrificial gate dielectric layer 132, but not on the exposed surfaces of the sacrificial gate structures 130, the first semiconductor layers 106, and the wells 116 of the substrate 101. In some embodiments, the conformal deposition process is controlled so that the cap layer 143 is selectively formed on the semiconductor materials (e.g., first and second semiconductor layers 106, 108, and the wells 116 of the substrate 101) but not on the dielectric materials (e.g., mask layer 136 and gate spacers 138), as the alternative embodiment shown below in FIG. 9A-3.

In any case, the cap layer 143 may have a thickness T1 (FIG. 9D) of about 3 Å to about 30 Å. If the thickness T1 is less than about 3 Å, the cap layer 143 may not effectively block the etchant used during removal of the second semiconductor layer 108. On the other hand, if the thickness T1 is greater than 30 Å, it may be difficult to uniformly form subsequent high-K dielectric layer. In addition, a thick cap layer 143 may also occupy too much space needed for forming the subsequent metal gates. Due to the recess at the edges of the second semiconductor layers 108, the nitridation process or the deposition process at these regions may be less effective. Therefore, the cap layer 143 over the sacrificial gate structure 130 may have the thickness T1 and the cap layer 143 over the second semiconductor layer 108 may have a thickness T2 less than the thickness T1. In such cases, the thickness T1 may be about 5% to about 20% greater than the thickness T2.

In one exemplary embodiment shown in FIG. 9A, the cap layer 143 is globally formed on the gate spacers 138, the sacrificial gate dielectric layer 132 (not shown), the first semiconductor layers 106, and the second semiconductor layers 108. In cases where the RTN process is used, the RTN process may be performed at a temperature of about 500° C. to about 800° C. and a chamber pressure of about 10 Torr to about 1000 Torr, using a nitrogen-containing gas (e.g., $NH_3$ or $NH_3$ and $N_2$) as reaction gas, for about 30 seconds to about 5 minutes. If the temperature is lower than about 500° C., the layers may not be completely nitrided. On the other hand, if the temperature is greater than about 800° C., the germanium in the second semiconductor layers 108 may diffuse into the silicon channel (i.e., nanosheet) and degrade the performance of the device. If the chamber pressure is less than about 10 Torr, the layers may not be completely nitrided. On the other hand, if the chamber pressure is greater than 1000 Torr, the thickness of the nitrided film on the second semiconductor layers 108 may be too high, which takes up too much space needed for forming the subsequent metal gates.

Alternatively, the HPN process may be used for forming the cap layer 143. In such cases, the HPN process may be performed using a process gas of nitrogen-containing gas at a pressure from about 1 ATM to about 25 ATM and a temperature from about 300° C. to about 700° C., for about 1 minute to about 10 minutes. Alternatively, the DPN process may be used for forming the cap layer 143. In such cases, the DPN process may be performed under a source power of about 300 Watts to about 2000 Watts, using a process gas of a nitrogen-containing gas alone, or a combination of a nitrogen-containing gas and argon, helium, or the like. Suitable nitrogen-containing gas may include, but are not limited to, nitrogen gas ($N_2$), ammonia ($NH_3$), nitrous oxide ($N_2O$), or the like.

It is contemplated that the cap layer 143 at and/or adjacent the second semiconductor layers 108 may have a shape in accordance with the profile of the recessed second semiconductor layer 108. In the embodiments shown in FIGS. 9D, 9D-1, 9D-2, and 9D-3, the cap layer 143 is formed to have a curved profile (e.g., concave shape) when viewed from the top. In some embodiments, the cap layer 143 may have a square or rectangular shape when viewed from the top, which may vary depending on the edge profile of the recessed second semiconductor layer 108.

In FIGS. 10A-10D, a dielectric layer 144a is deposited on the cap layer 143. The dielectric layer 144a also fills the cavities 131 (FIG. 8A) provided by the removal of the edge portions of the second semiconductor layers 108. The dielectric layer 144a may be made of a dielectric material that is different from the material of the cap layer 143. Suitable materials for the dielectric layer 144a may include, but are not limited to, $SiO_2$, $Si_3N_4$, SiC, SiCP, SiON, SiOC, SiCN, SiOCN, and/or other suitable material. Other materials, such as low-k materials with a k value less than about 3.5, may also be used. The formation of the dielectric layer 144a may be formed by a conformal deposition process, such as ALD. The thickness T3 of the dielectric layer 144a adjacent the first semiconductor layers 106 (and wells 116 of the substrate 101) may be in a range of about 1 nm to about 4 nm, while the thickness T4 of the dielectric layer 144a adjacent the second semiconductor layers 108 may be in a range of about 2 nm to about 10 nm. In some embodiments, the dielectric layer 144a is a single layer structure. In some embodiments, the dielectric layer 144a is a multi-layer structure including two or more of the materials discussed herein.

Figure 11B:
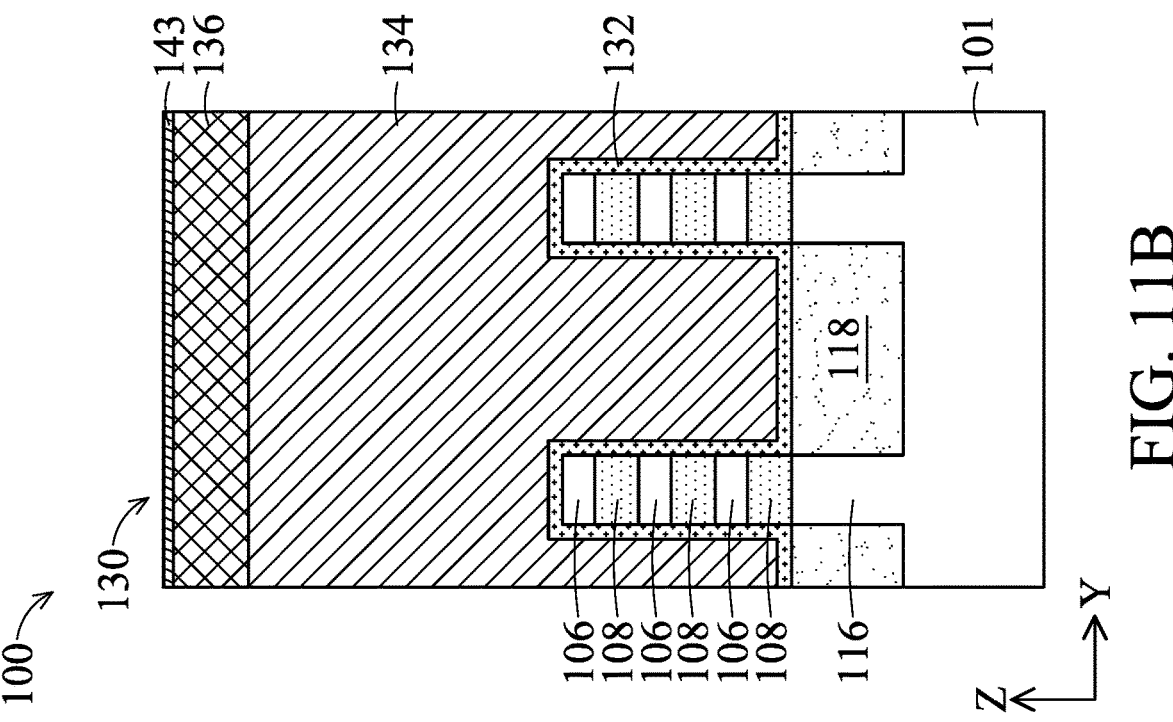
Figure 11A:
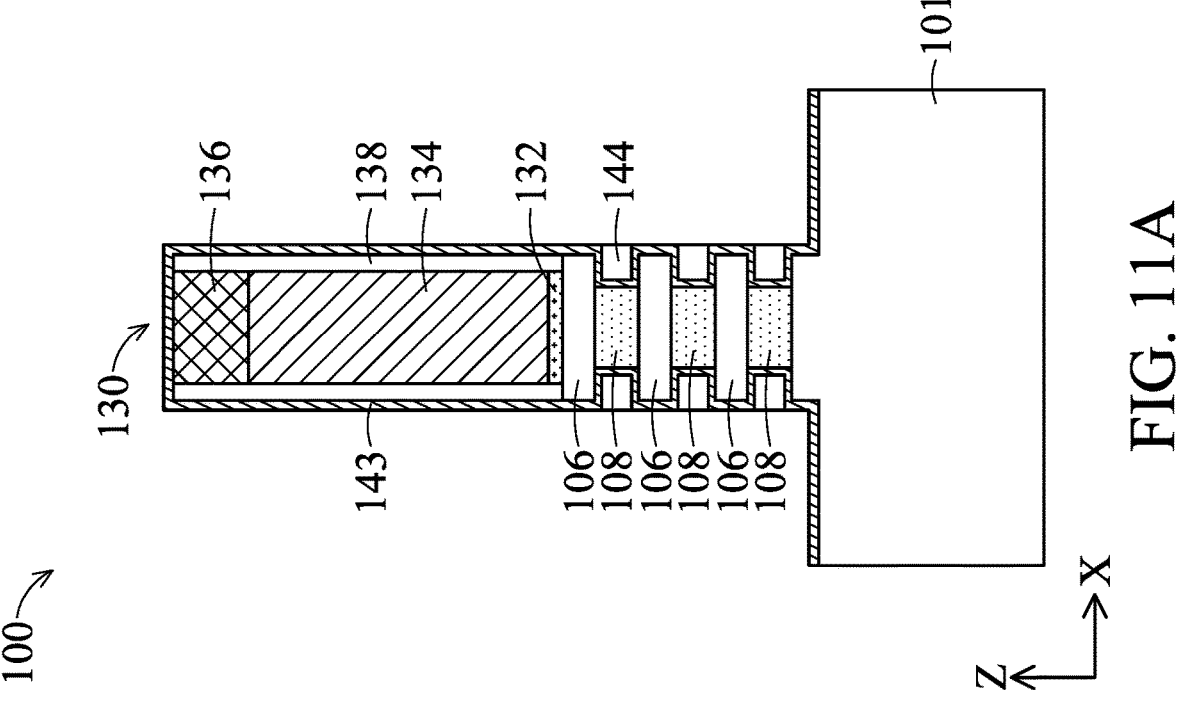
Figure 11C:
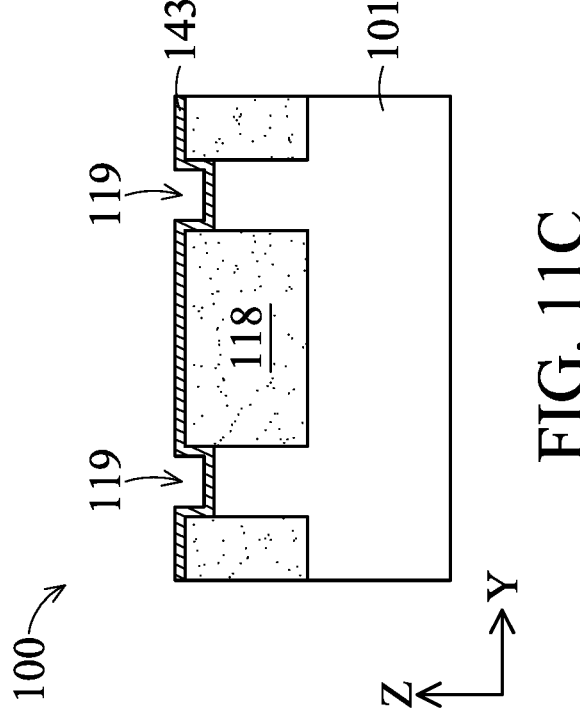
Figures 1, 11D:
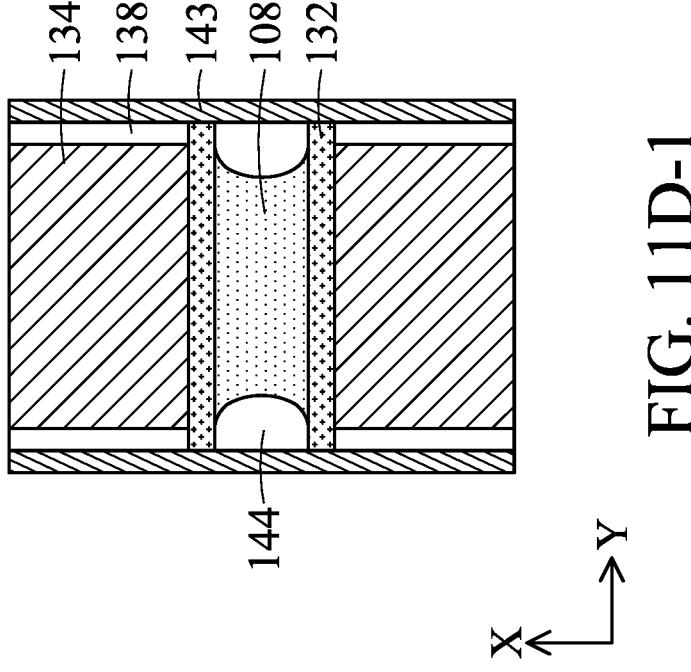
Figure 11D:
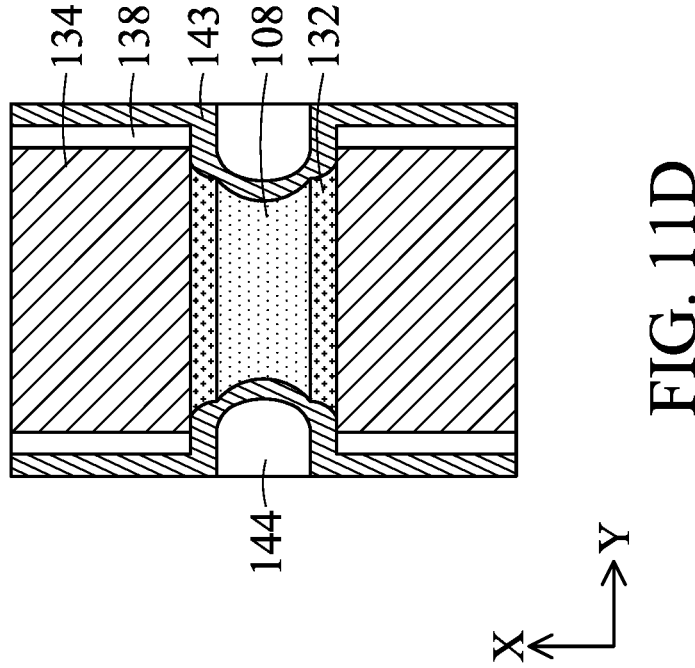

In FIGS. 11A-11D, an etch process is performed so that only portions of the dielectric layer 144a remain in the cavities 131 (FIG. 9A) to form inner spacers 144. The removal process may be any suitable etch processes, such as dry etch, wet etch, or a combination thereof. The etch process may use an etchant that selectively removes the dielectric layer 144a without substantially removing the cap layer 143. The removal of the portions of the dielectric layer 144a may be performed by an anisotropic etching. The dielectric layer 144a within the cavities 131 are protected by the first semiconductor layers 106 and the cap layer 143 during the anisotropic etching process. The remaining second semiconductor layers 108 are capped between the inner spacers 144 along the X direction In some alternative embodiments, the cap layer 143 is not formed until after the edge portions of second semiconductor layers 108 are removed and the inner spacer 144 is deposited in the cavities formed as a result of removal of the edge portions of the second semiconductor layers 108. In such cases, the cap layer 143 may be formed by either subjecting the exposed surfaces of the gate spacers 138, the sacrificial gate dielectric layers 132, and the inner spacers 144 to the nitridation process (e.g., RTN process) as discussed above, or by depositing a cap layer 143 on the exposed surfaces of the gate spacers 138, the sacrificial gate dielectric layers 132, and the inner spacers 144 using a conformal deposition process (e.g., ALD process). In either case, the cap layer 143 in the embodiment of FIG. 11D-1 is a continuous layer formed on the exposed surfaces of the gate spacers 138, the sacrificial gate dielectric layers 132, and the inner spacers 144. That is, the cap layer 143 on the second semiconductor layer 108 is co-planar or flushed with the cap layer 143 on the gate spacers 138, the sacrificial gate dielectric layers 132, and the inner spacers 144, as opposed to the embodiment where a portion of the cap layer 143 is disposed between the second semiconductor layer 108 and the dielectric layer 144a.

In FIGS. 12A-12D, a removal process is performed to selectively remove the cap layer 143 from the first semiconductor layers 106 and the wells 116 of the substrate 101. The removal process may be a selective etch process that is configured to etch the cap layer 143 but not the inner spacers 144. The duration of the selective etch process may be controlled so that the cap layer 143 disposed between and in contact with the inner spacers 144 and the first semiconductor layers 106 and the second semiconductor layers 108 still remains upon completion of the selective etch process. In cases where the cap layer 143 is SiN, the removal process may include a hot phosphoric acid ($H_3PO_4$) solution to remove SiN. In cases where the cap layer 143 includes SiN and SiO, the removal process may be a two-step process in which the first etching process includes $H_3PO_4$ solution to remove SiN and the second etching process includes HF solution to remove SiO. In some embodiments, the removal process may further remove the cap layer 143 from the top of the sacrificial gate structure 130.

In some alternative embodiments, the removal process may be performed (e.g., by time control) so that the cap layer 143 on the sacrificial gate structure 130 is further removed, as shown in FIG. 12A-1. FIG. 12A-2 illustrates another alternative embodiment based on the embodiment of FIG. 9A-2, where the cap layer 143 remains only between the inner spacer 144 and the second semiconductor layer 108, and the cap layer 143 on the sacrificial gate structure 130 is also removed.

Figures 1A, 12A:
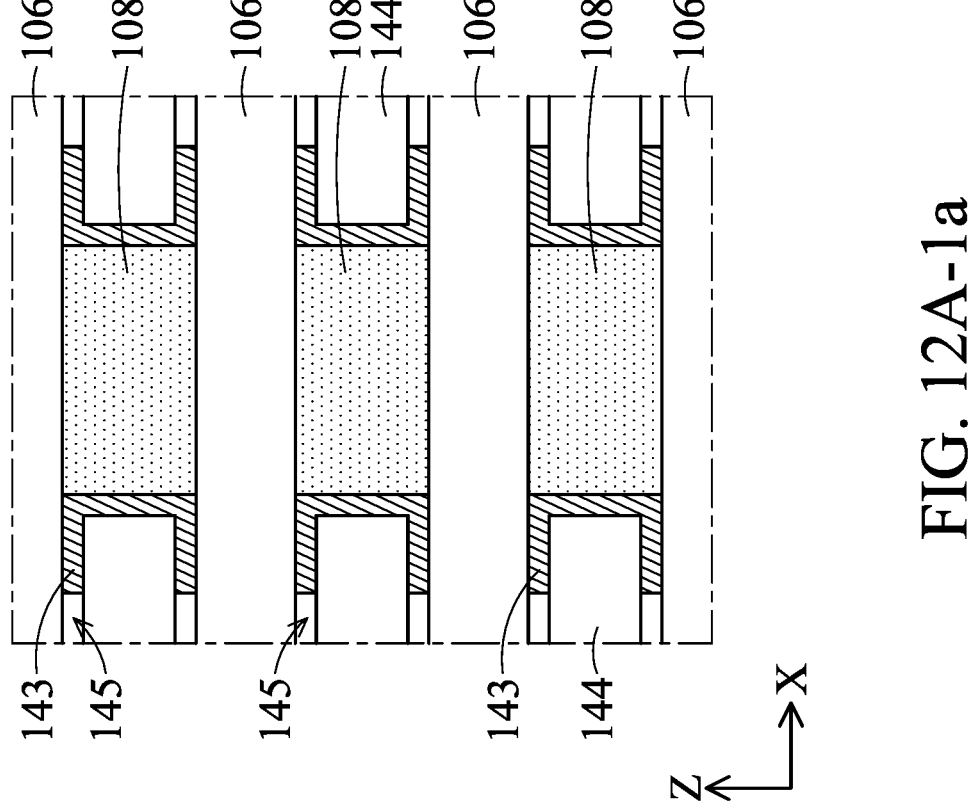
Figure 13A:
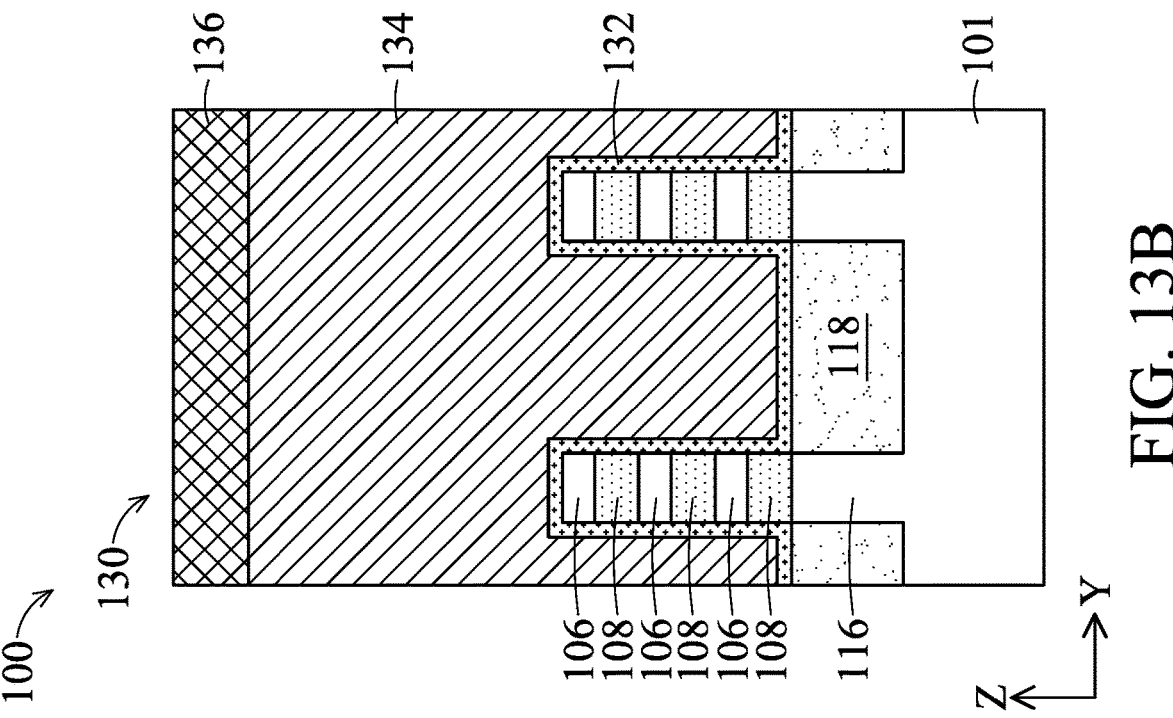
Figure 13B:
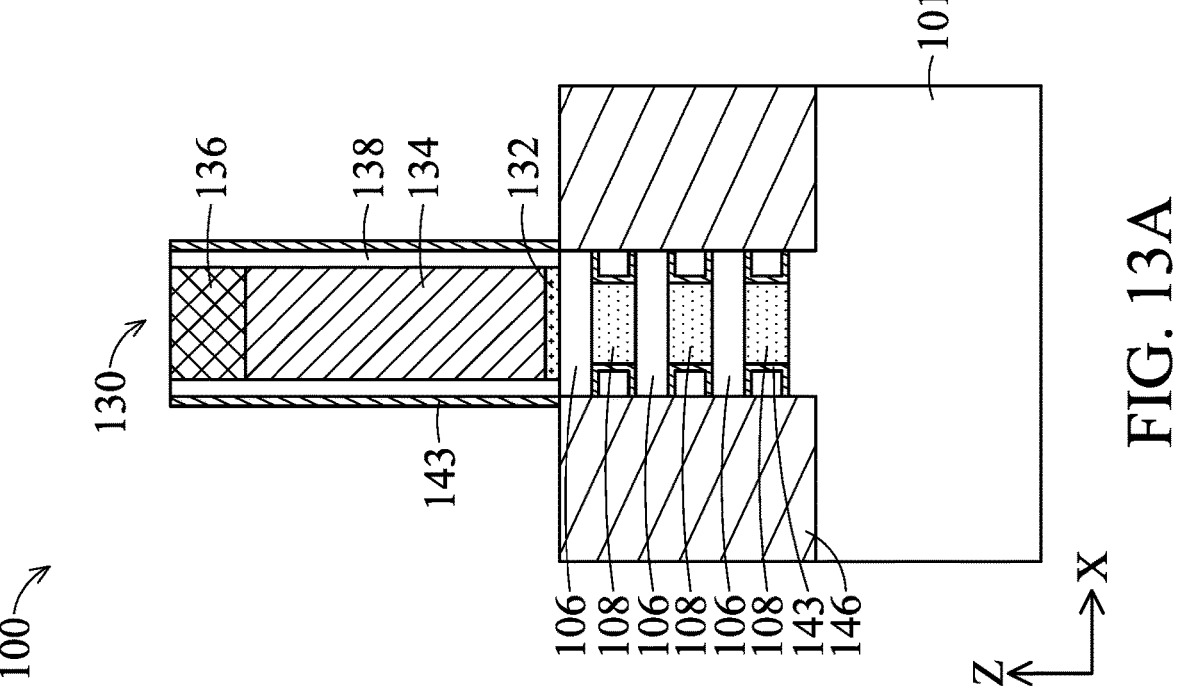
Figure 13D:
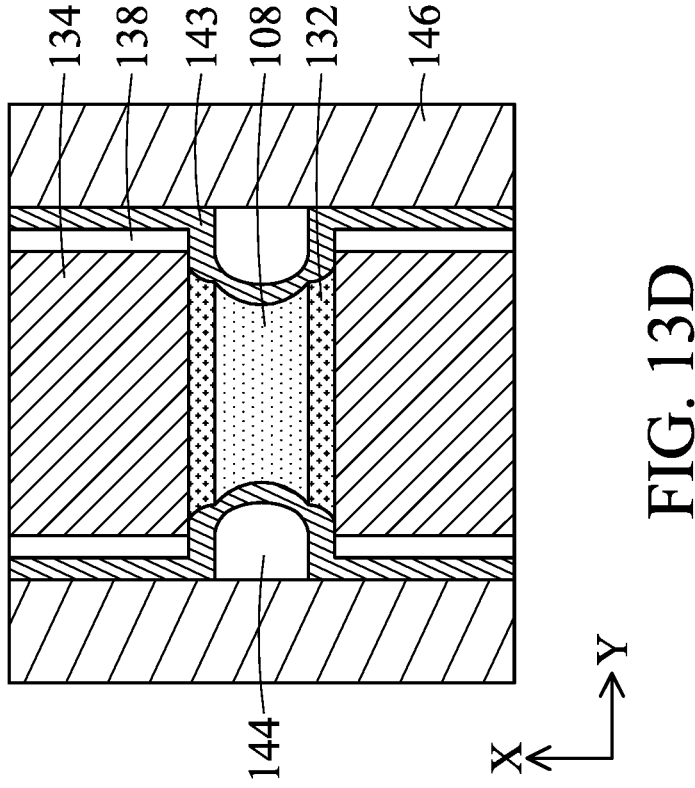
Figure 13C:
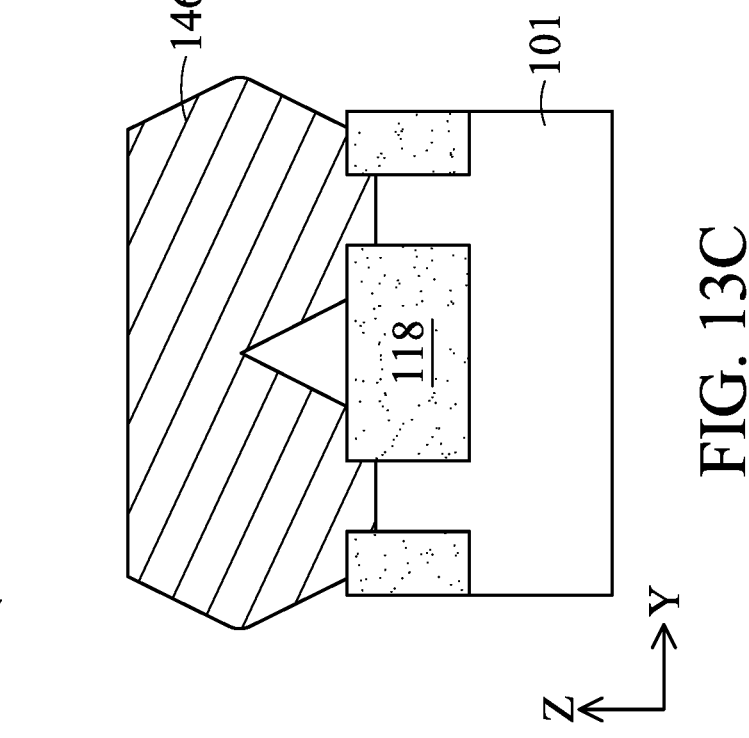
Figure 14A:
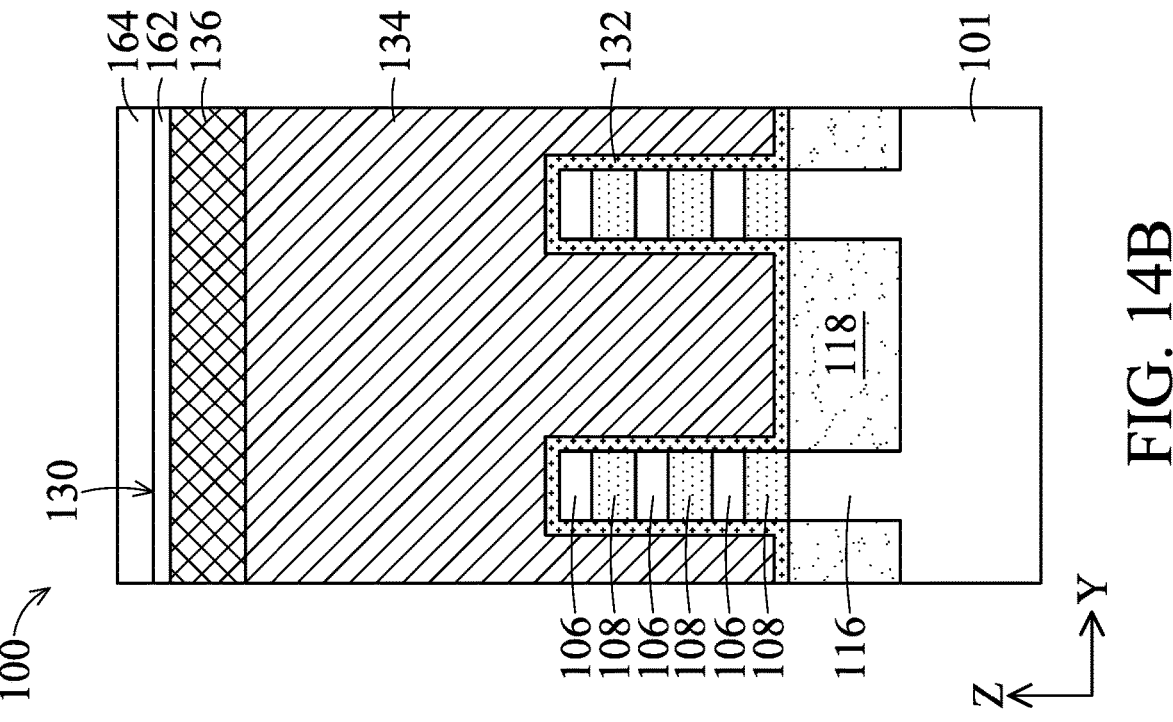
Figure 14B:
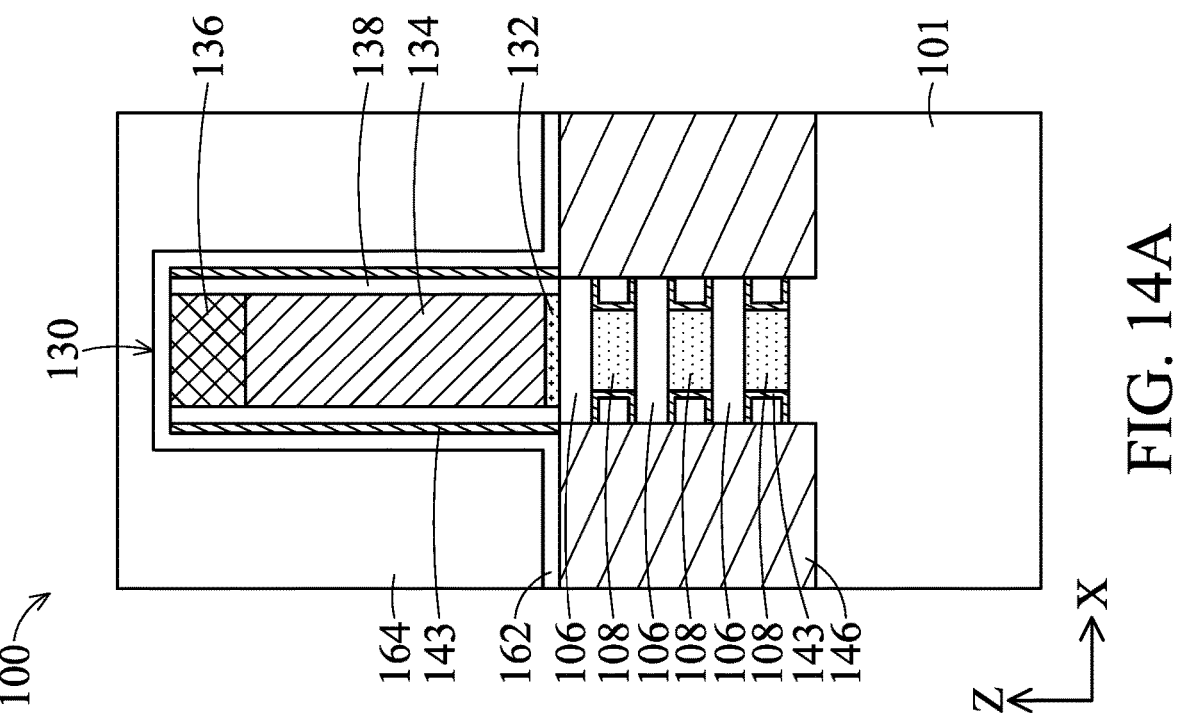
Figure 14D:
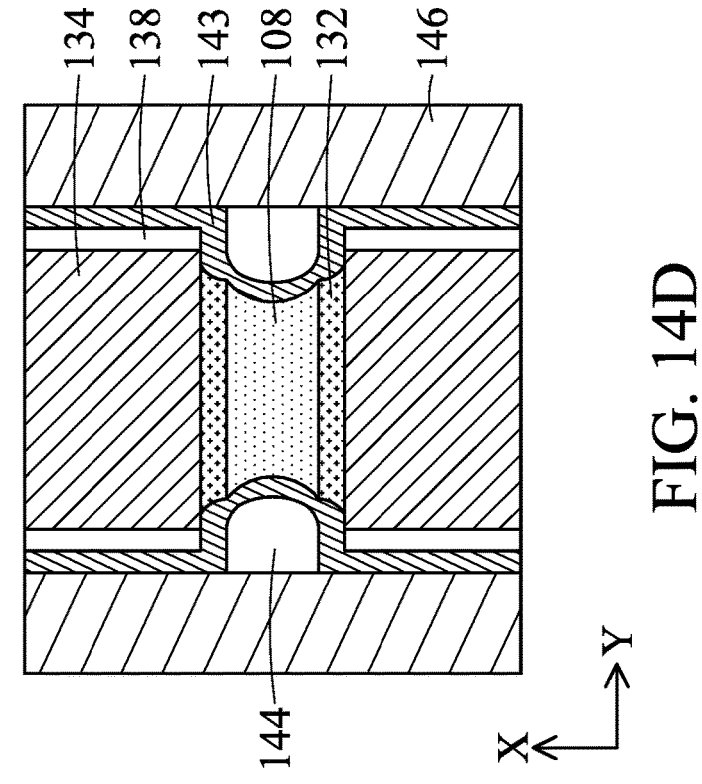
Figure 14C:
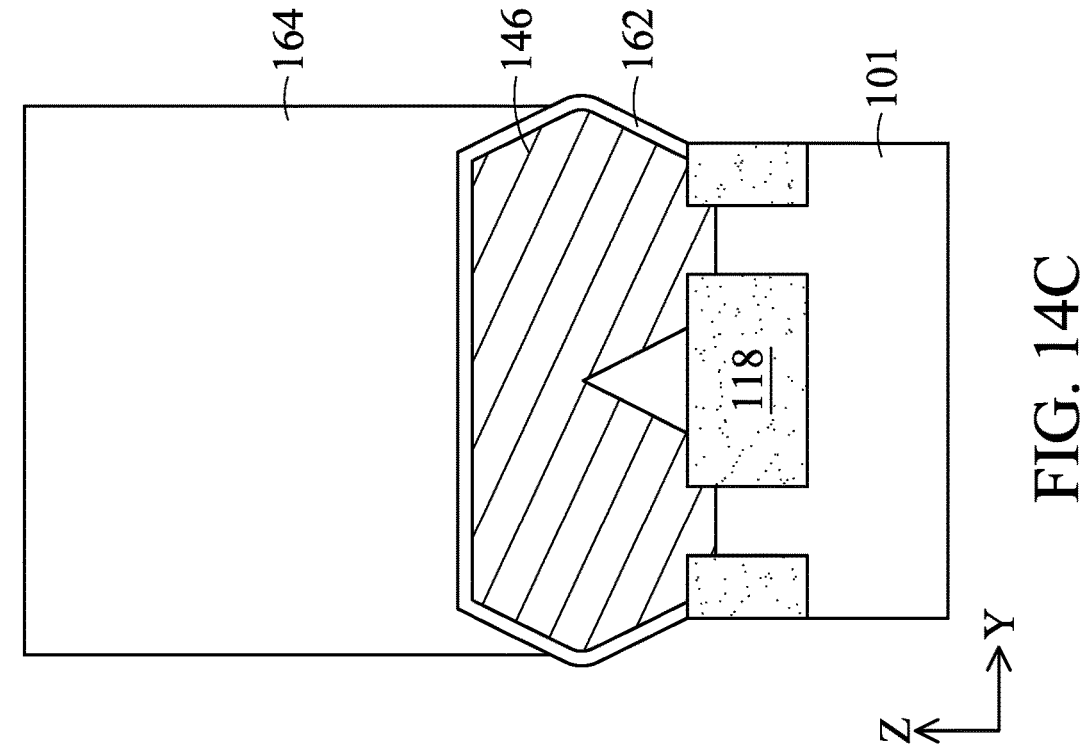
Figure 15B:
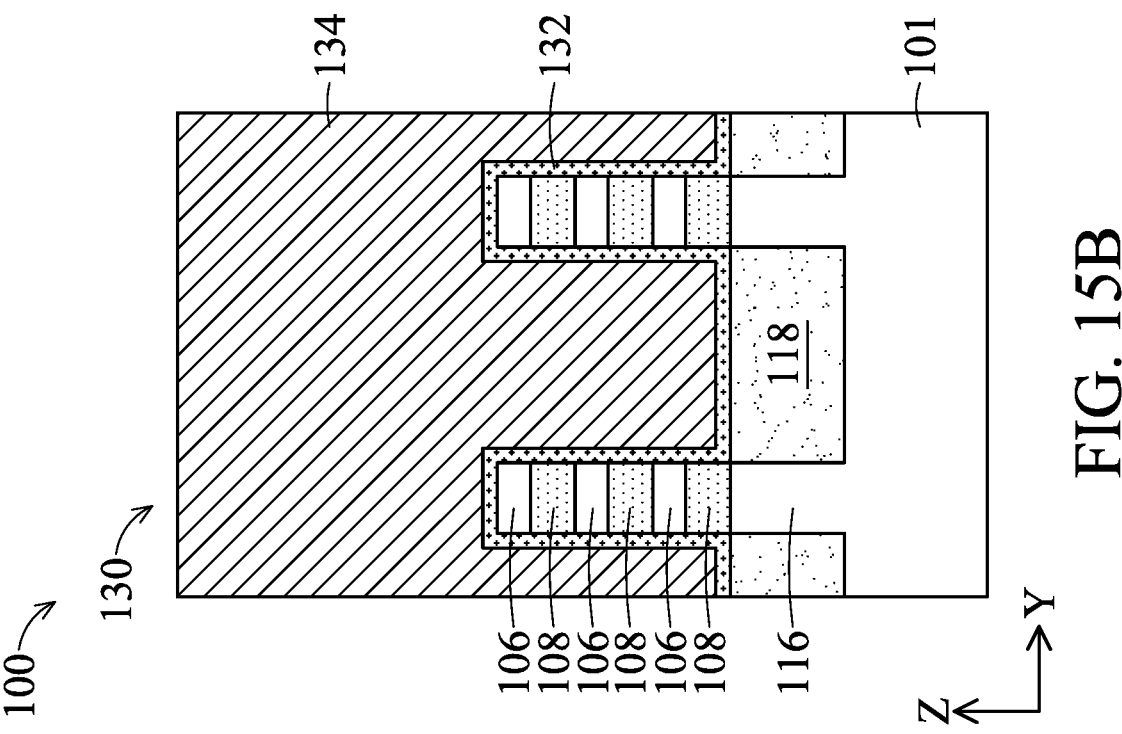
Figure 15A:
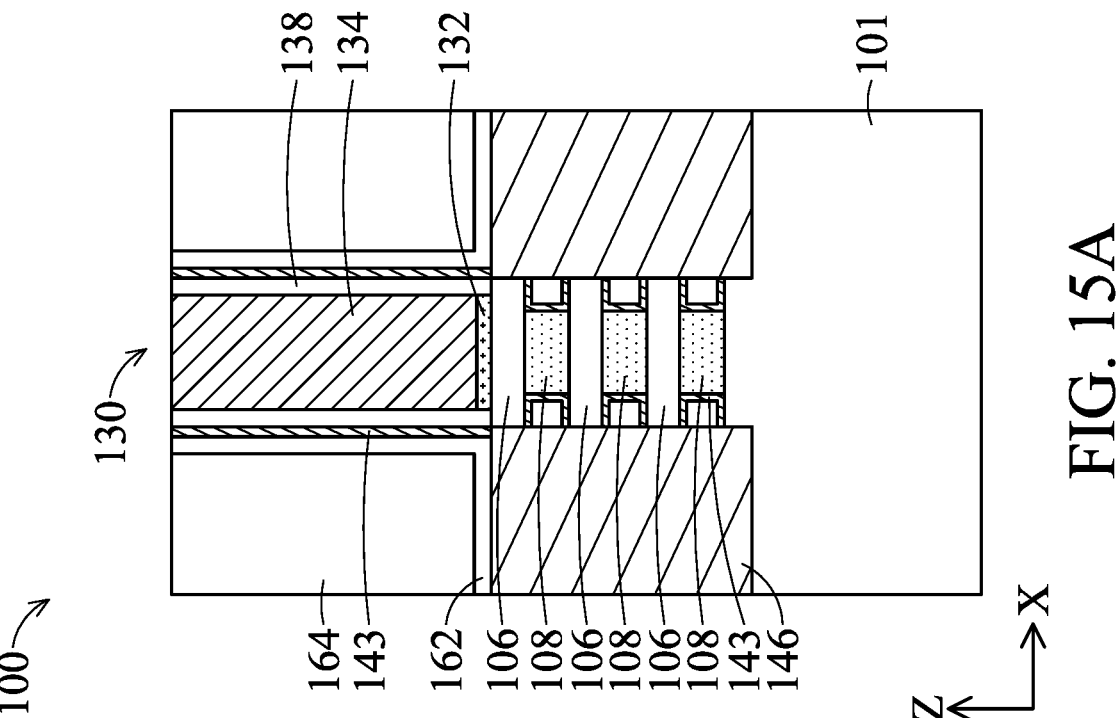
Figure 15D:
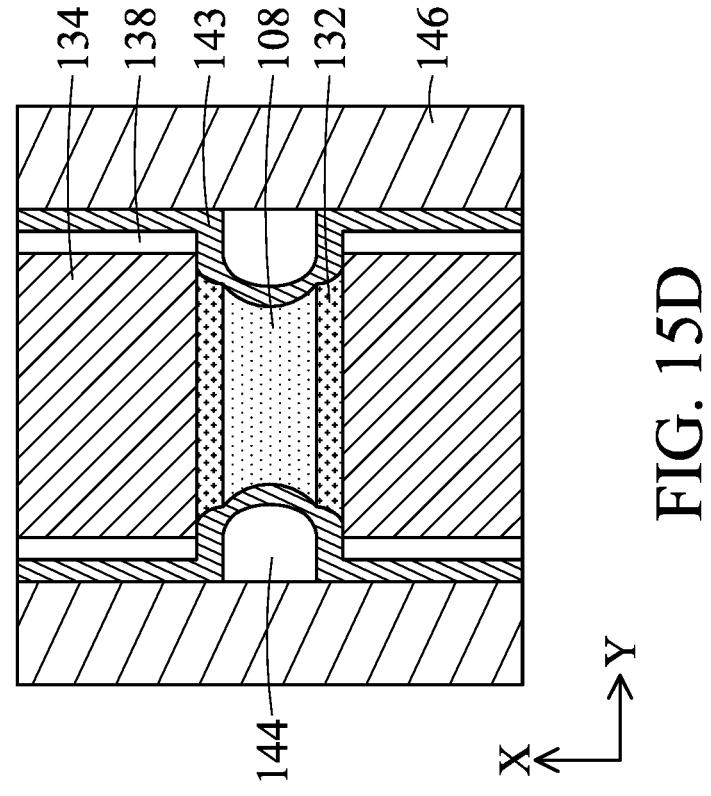
Figure 15C:
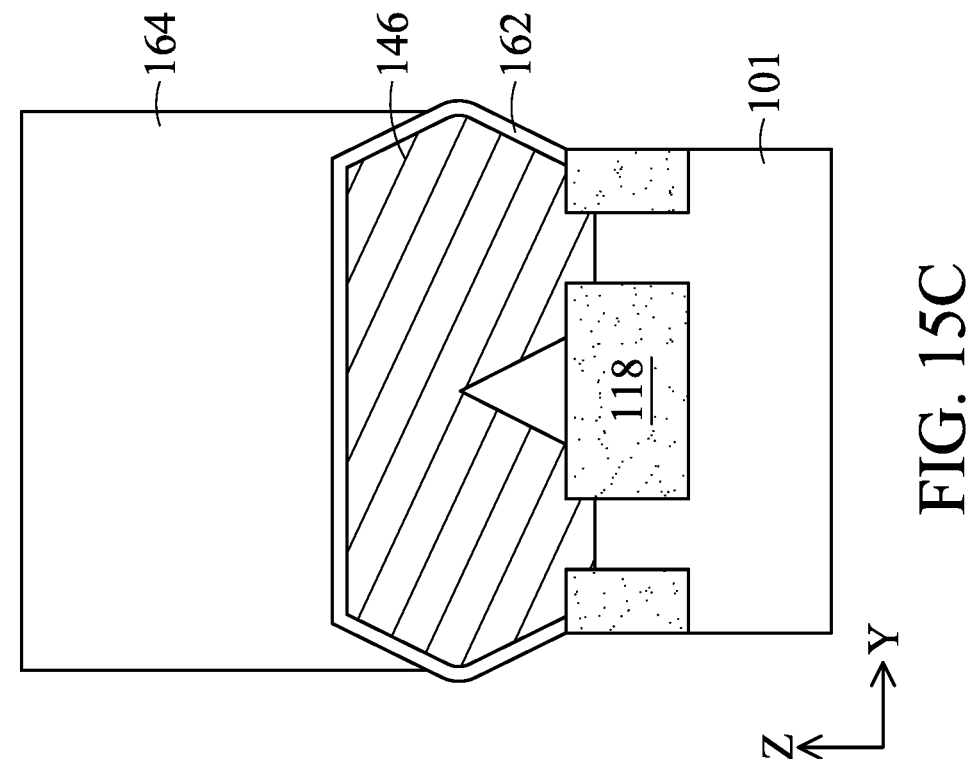

Additionally or alternatively, the duration of the selective etch process may be controlled so that not only the cap layer 143 on first surfaces (i.e., vertical surfaces along the Z direction) of the first semiconductor layers 106 is removed, but a portion of the cap layer 143 on the second surfaces (i.e., horizontal surfaces along the X direction) of the first semiconductor layers 106 is also removed. In such cases, a gap is formed between the inner spacers 144 and the first semiconductor layers 106. FIG. 12A-1a illustrates an enlarged view of a portion of the semiconductor device structure 100 of FIG. 12A-1 in accordance with some alternative embodiments. In this embodiment, a gap 145 is formed between the inner spacers 144 and the first semiconductor layers 106 as a result of the selective etch process discussed above. The removal of a portion of the cap layer 143 between the inner spacers 144 and the first semiconductor layers 106 results in a substantial C-shape or U-shape structure of the cap layer 143 sandwiched between the adjacent first semiconductor layers 106 and in contact with the first semiconductor layers 106, the second semiconductor layers 108, and the inner spacers 144. The gap 145 may later be filled with the S/D features 146 (FIG. 13A).

In FIGS. 13A-13D, epitaxial S/D features 146 are formed in the source/drain (S/D) regions. The epitaxial S/D features 146 may grow laterally from the first semiconductor layers 106. The epitaxial S/D feature 146 may include one or more layers of Si, SiP, SiC and SiCP for an n-type FET or Si, SiGe, Ge for a p-type FET. The epitaxial S/D features 146 may be formed by an epitaxial growth method using selective epitaxial growth (SEG), CVD, ALD or MBE. In cases where embodiment of FIG. 12A is adapted, the epitaxial S/D features 146 are in contact with the first semiconductor layers 106, inner spacers 144, and a portion of the cap layer 143. In some cases, the epitaxial S/D features 146 may grow pass the topmost semiconductor channel, i.e., the first semiconductor layer 106 under the sacrificial gate structure 130, to be in contact with the cap layer 143 on the gate spacers 138. The second semiconductor layer 108 under the sacrificial gate structure 130 are separated from the epitaxial S/D features 146 by the dielectric spacers 144. The epitaxial S/D features 146 may grow both vertically and horizontally to form facets, which may correspond to crystalline planes of the material used for the first semiconductor layers 106. In some cases, the epitaxial S/D features 146 of a fin structure may grow and merge with the epitaxial S/D features 146 of the neighboring fin structures, as one example shown in FIG. 13C.

The epitaxial S/D features 146 may be the S/D regions. For example, one of a pair of epitaxial S/D features 146 located on one side of the sacrificial gate structures 130 may be a source region, and the other of the pair of epitaxial S/D features 146 located on the other side of the sacrificial gate structures 130 may be a drain region. A pair of S/D epitaxial features 146 includes a source epitaxial feature 146 and a drain epitaxial feature 146 connected by the channels (i.e., the first semiconductor layers 106). Source/drain region(s) may refer to a source or a drain, individually or collectively dependent upon the context. In this disclosure, a source and a drain are interchangeably used, and the structures thereof are substantially the same In FIGS. 14A-14D, a contact etch stop layer (CESL) 162 is conformally formed on the exposed surfaces of the semiconductor device structure 100. The CESL 162 covers the sidewalls of the cap layer 143 (if not removed), the top surfaces of the sacrificial gate structure 130, the insulating material 118, the epitaxial S/D features 146, and the exposed surface of the stack of semiconductor layers 104. The CESL 162 may include an oxygen-containing material or a nitrogen-containing material, such as silicon nitride, silicon carbon nitride, silicon oxynitride, carbon nitride, silicon oxide, silicon carbon oxide, or the like, or a combination thereof, and may be formed by CVD, PECVD, ALD, or any suitable deposition technique. Next, a first interlayer dielectric (ILD) layer 164 is formed on the CESL 162 over the semiconductor device structure 100. The materials for the first ILD layer 164 may include compounds comprising Si, O, C, and/or H, such as silicon oxide, TEOS oxide, SiCOH and SiOC. Organic materials, such as polymers, may also be used for the first ILD layer 164. The first ILD layer 164 may be deposited by a PECVD process or other suitable deposition technique. In some embodiments, after formation of the first ILD layer 164, the semiconductor device structure 100 may be subject to a thermal process to anneal the first ILD layer 164.

In FIGS. 15A-15D, after the first ILD layer 164 is formed, a planarization operation, such as CMP, is performed on the semiconductor device structure 100 until the sacrificial gate electrode layer 134 is exposed.

In FIGS. 16A-16D, the sacrificial gate structure 130 and the second semiconductor layers 108 are sequentially removed. The removal of the sacrificial gate structure 130 and the semiconductor layers 108 forms an opening 166 between gate spacers 138 and between adjacent first semiconductor layers 106. The first ILD layer 164 protects the epitaxial S/D features 146 during the removal processes. The sacrificial gate structure 130 can be removed using plasma dry etching and/or wet etching. The sacrificial gate electrode layer 134 may be first removed by any suitable process, such as dry etch, wet etch, or a combination thereof, followed by the removal of the sacrificial gate dielectric layer 132, which may also be performed by any suitable process, such as dry etch, wet etch, or a combination thereof. In some embodiments, a wet etchant such as a tetramethylammonium hydroxide (TMAH) solution can be used to selectively remove the sacrificial gate electrode layer 134 but not the gate spacers 138, the first ILD layer 164, the CESL 162, and the cap layer 143.

The removal of the sacrificial gate structure 130 exposes the first semiconductor layers 106, the second semiconductor layers 108, and the cap layer 143 on the inner spacers 144. An etch process, which may be any suitable etch processes, such as dry etch, wet etch, or a combination thereof, is then performed to remove the second semiconductor layers 108. The etch process may be a selective etch process that removes the second semiconductor layers 108 but not the cap layer 143, the gate spacers 138, the first ILD layer 164, the CESL 162, and the first semiconductor layers 106. In cases where the second semiconductor layers 108 are made of SiGe or Ge and the first semiconductor layers 106 are made of Si, the chemistry used in the selective wet etching process removes the SiGe while not substantially affecting Si, the dielectric materials of the gate spacers 138, the cap layer 143, the inner spacers 144, the first ILD layer 164, and the CESL 162. In one embodiment, the second semiconductor layers 108 can be removed using a wet etchant such as, but not limited to, hydrofluoric (HF), nitric acid ($HNO_3$), hydrochloric acid (HCl), phosphoric acid ($H_3PO_4$), a dry etchant such as fluorine-based (e.g., $F_2$) or chlorine-based gas (e.g., $Cl_2$), or any suitable isotropic etchants. Upon completion of the etch process, a portion of the first semiconductor layers 106 not covered by the inner spacers 144 and the cap layer 143 is exposed in the opening 166.

Figure 16B:
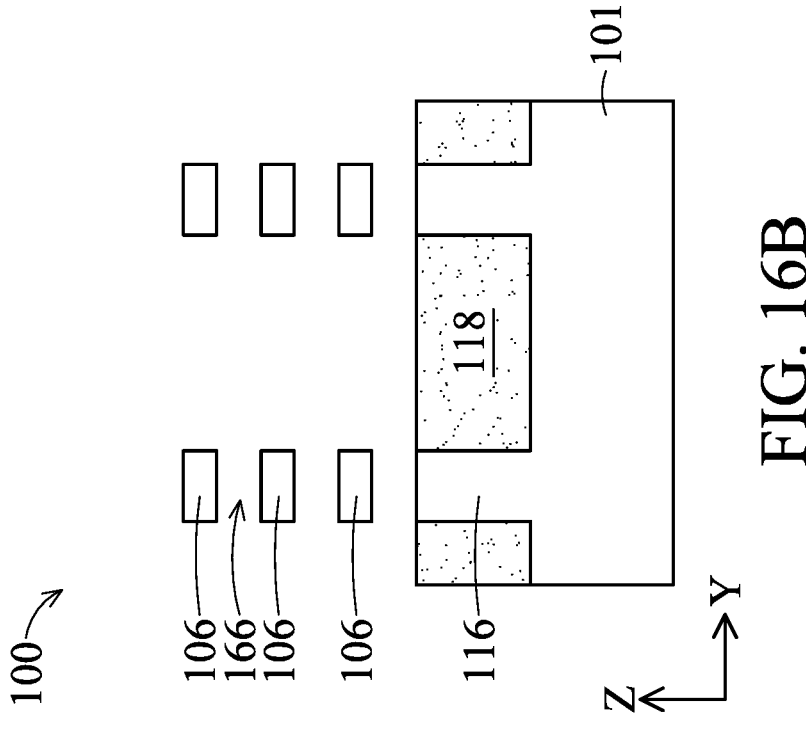
Figure 16A:
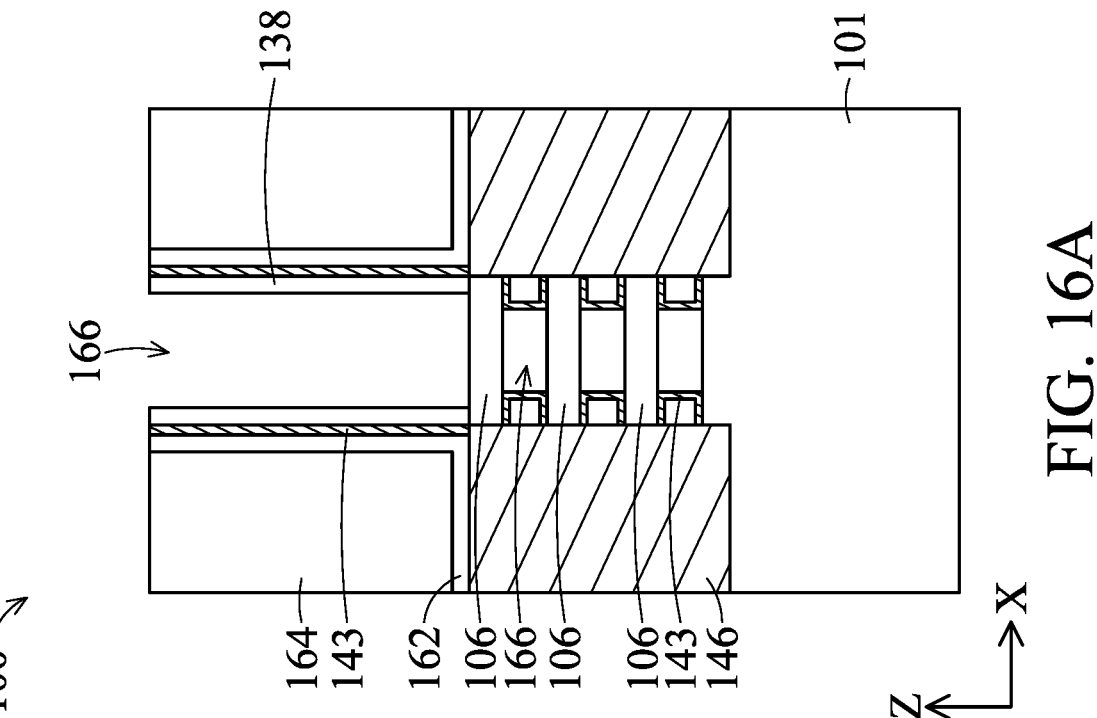
Figure 16C:
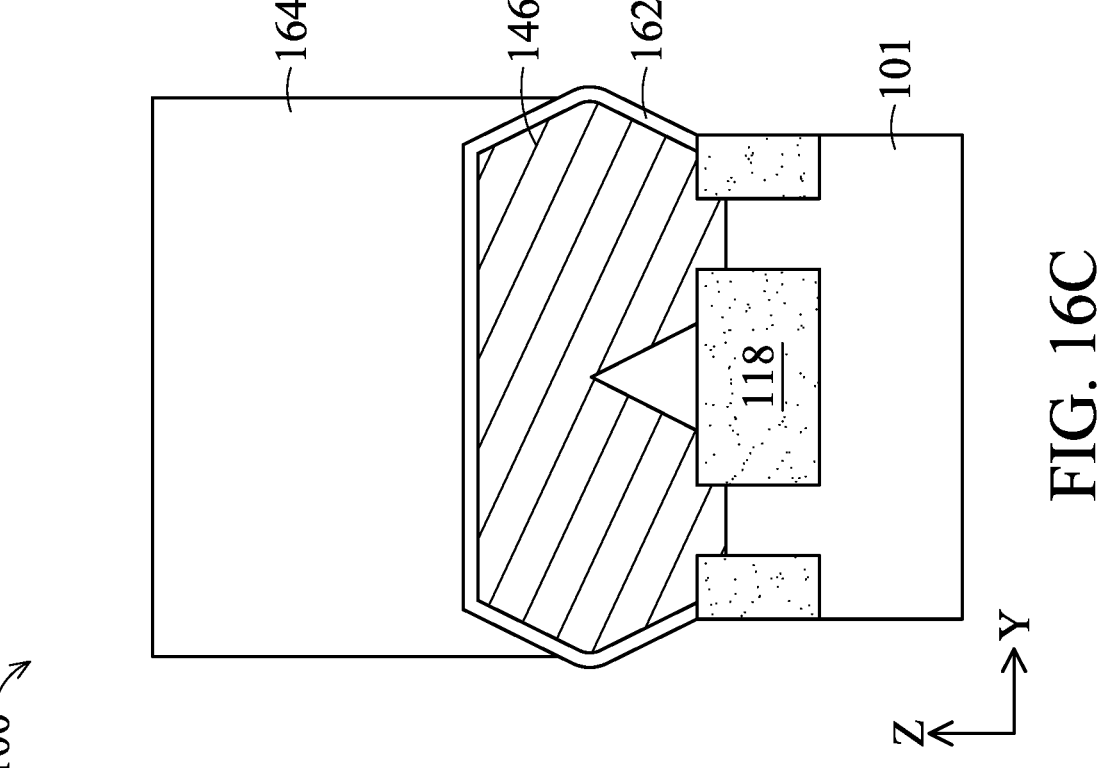
Figures 1, 16D:
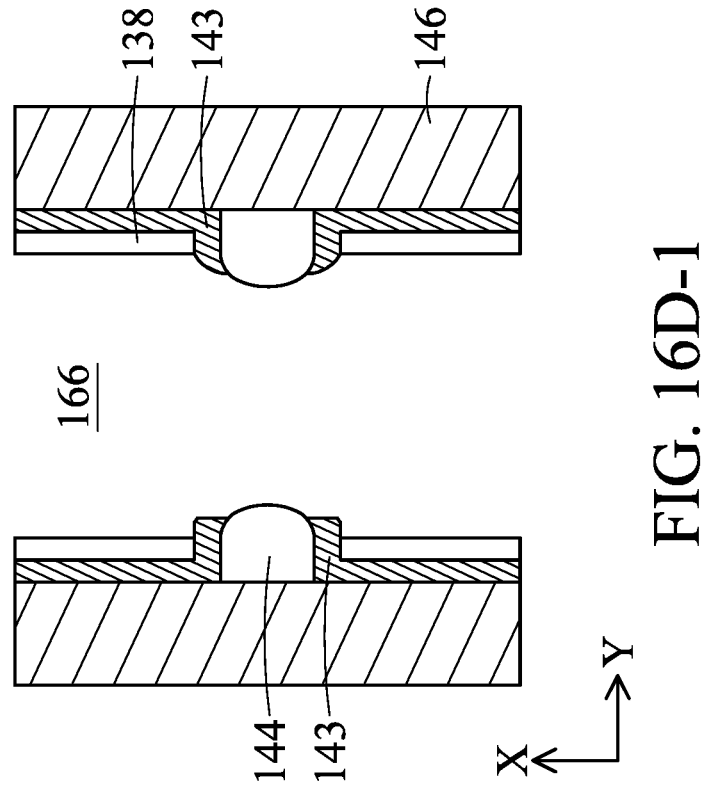
Figure 16D:
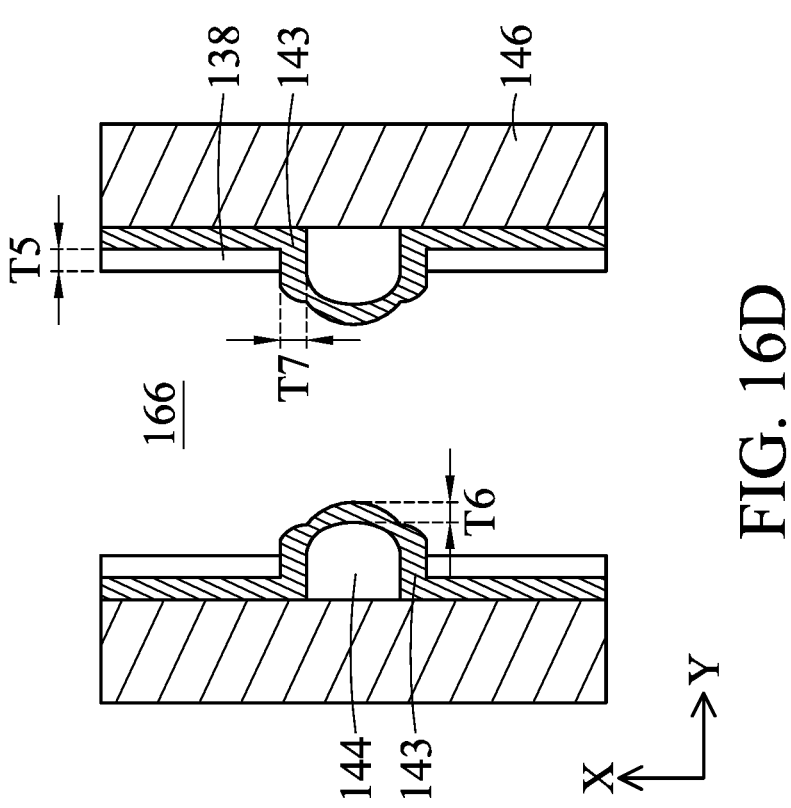
Figures 2, 3, 16D:
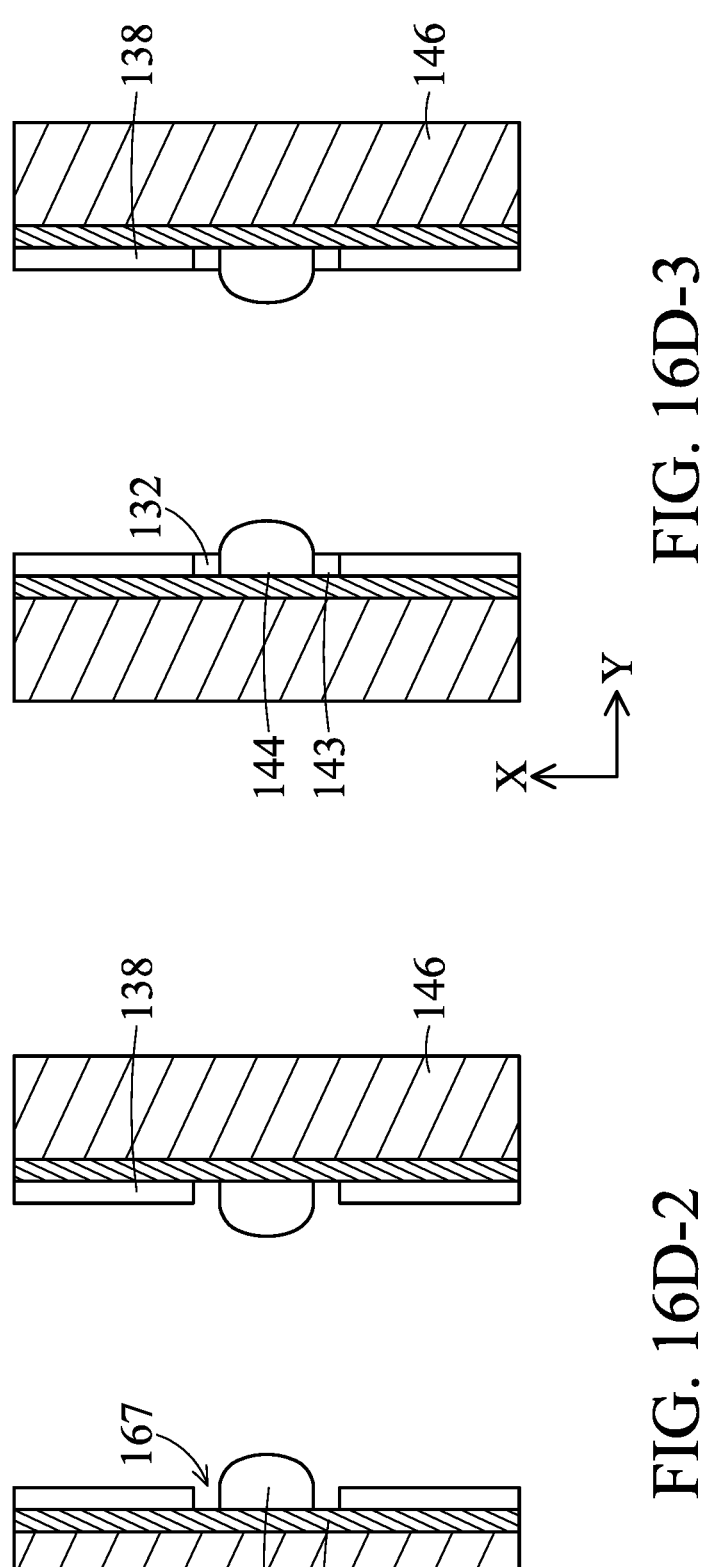
Figure 17B:
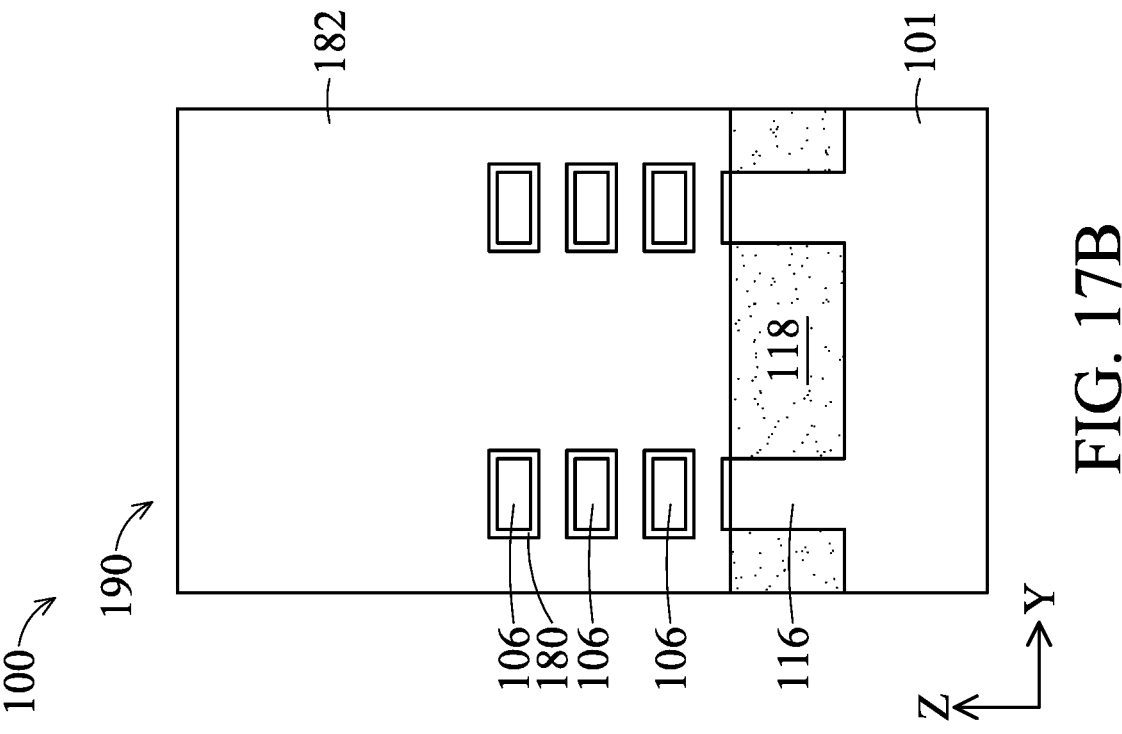
Figure 17A:
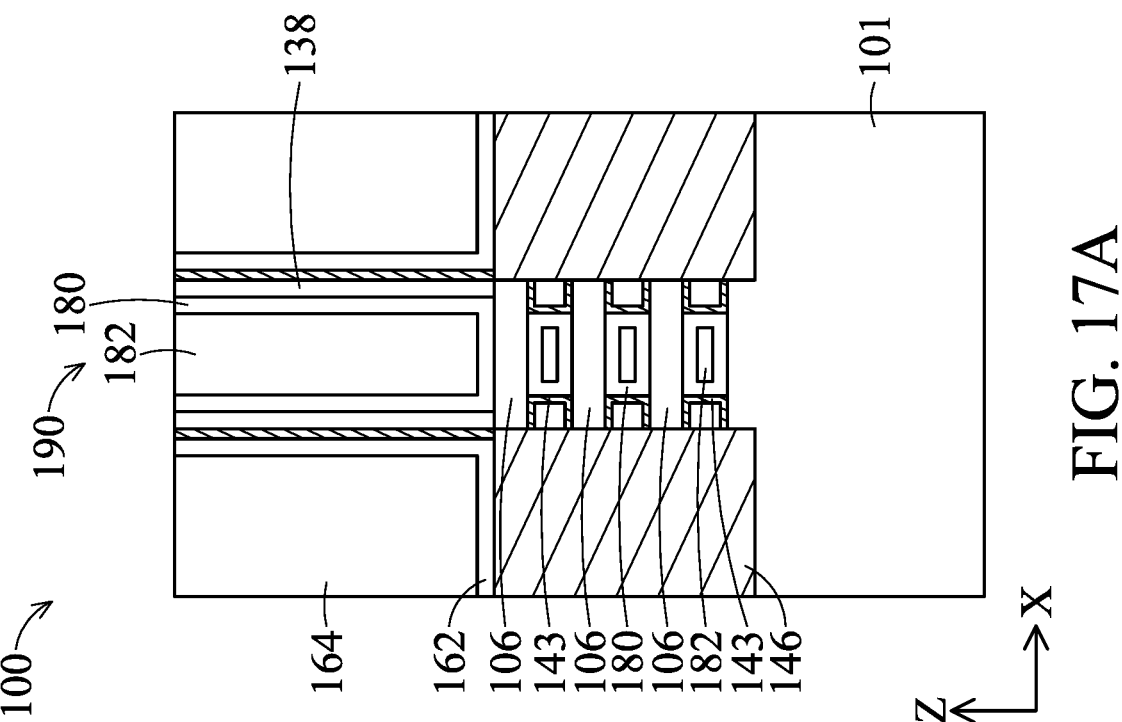
Figure 17D:
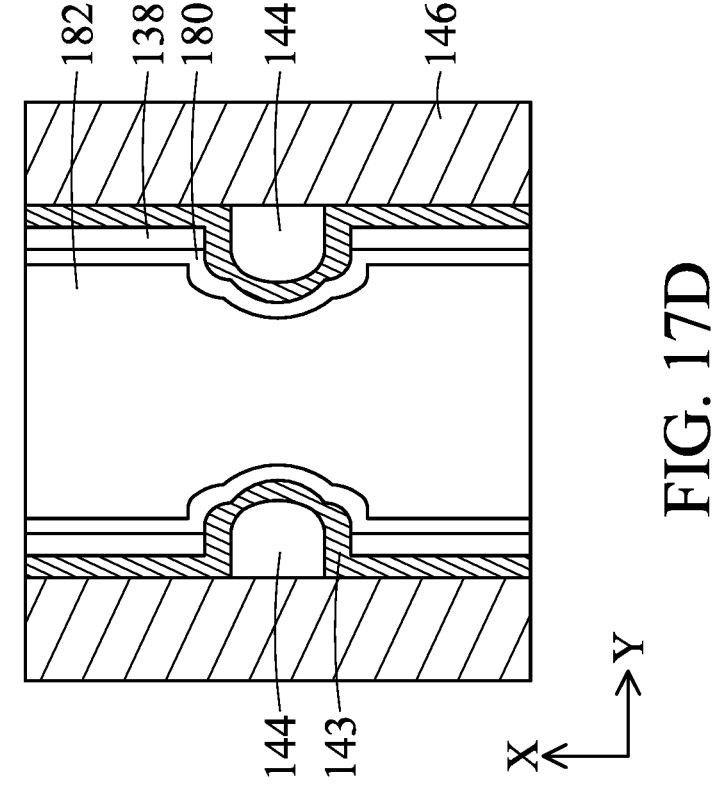
Figure 17C:
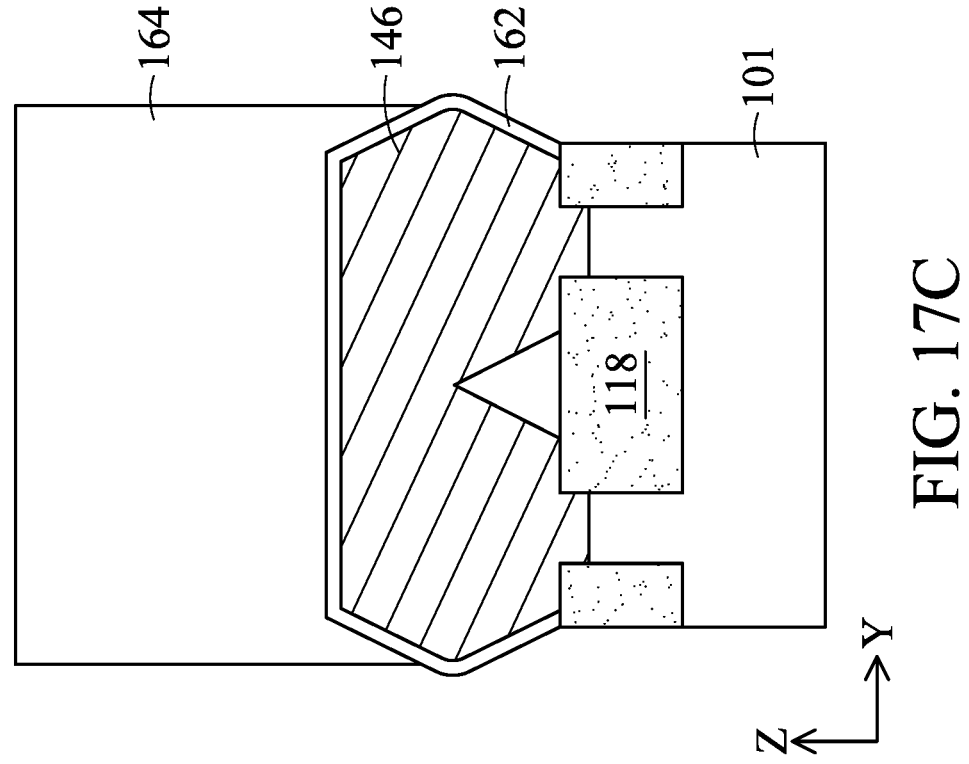

In some embodiments, which can be combined with any other embodiments of this disclosure, the removal of the sacrificial gate structure 130 may also remove a portion of the exposed cap layer 143 on the inner spacer 144. In such cases, the cap layer 143 between the gate spacer 138 and the epitaxial S/D features 146 may have a thickness T5 and the cap layer 143 on the inner spacer 144 may have a thickness T6 that is less than the thickness T5, as shown in FIG. 16D. In some embodiments, the removal process may be performed so that the cap layer 143 between the gate spacer 138 and the inner spacer 144 may have a thickness T7 that is less than the thickness T5 but greater than the thickness T6.

Figure 18B:
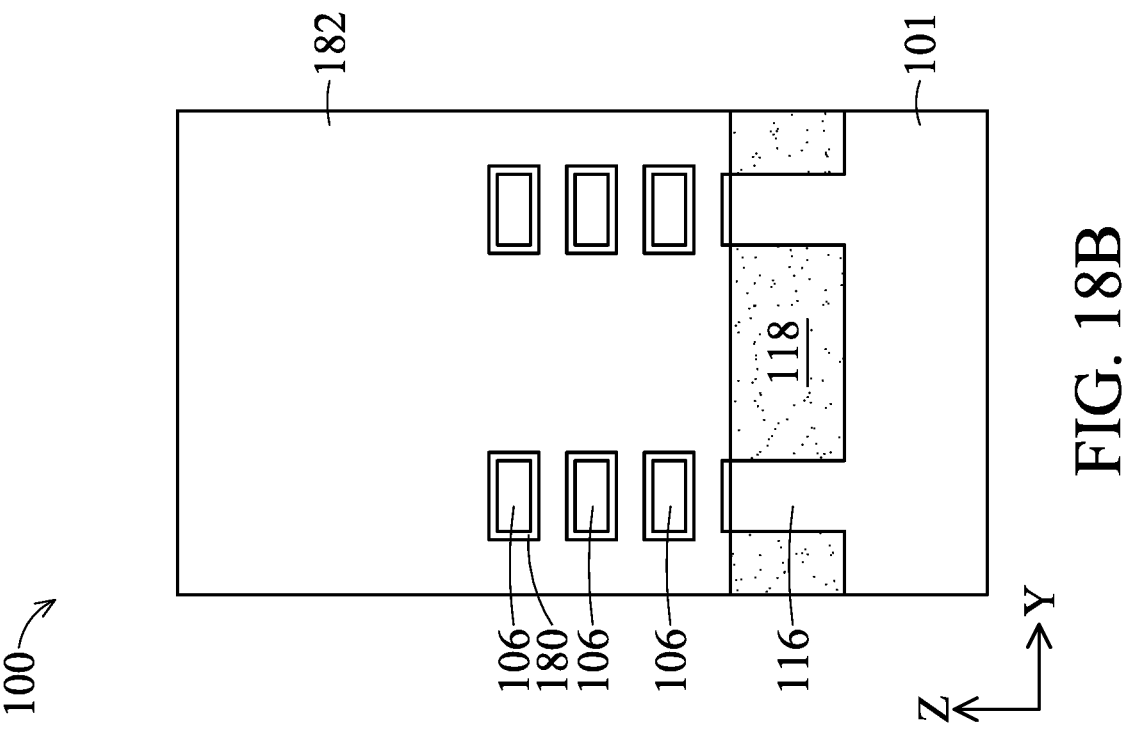
Figure 18A:
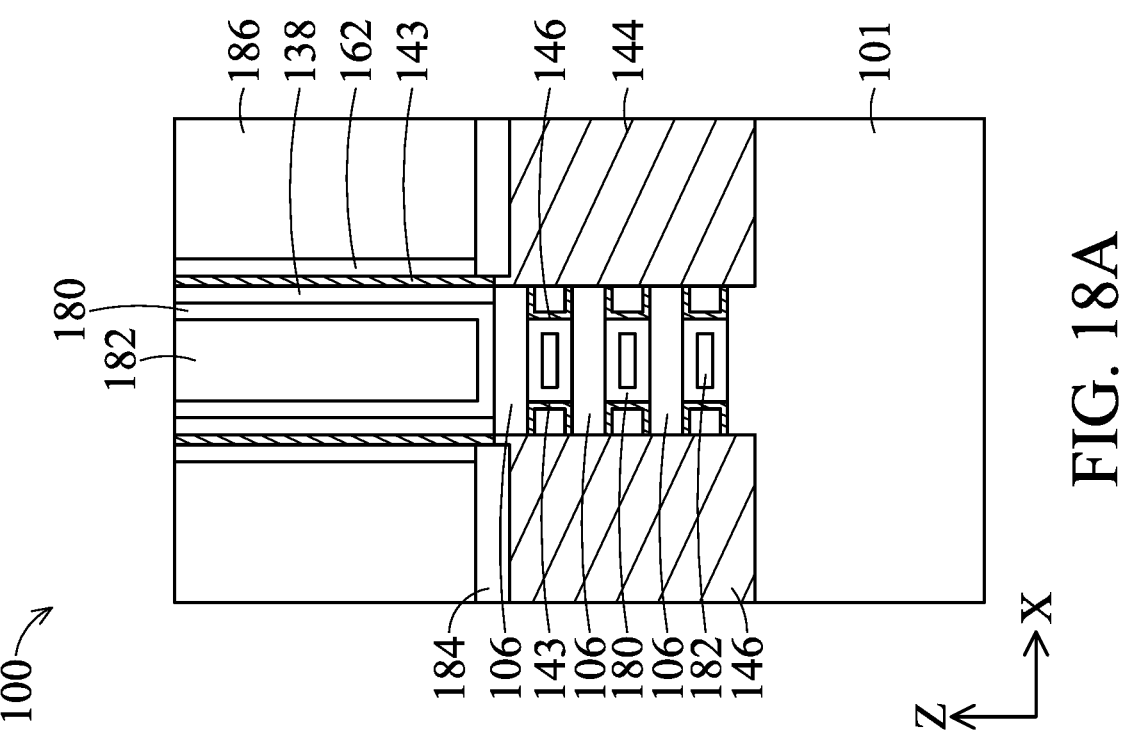
Figure 18C:
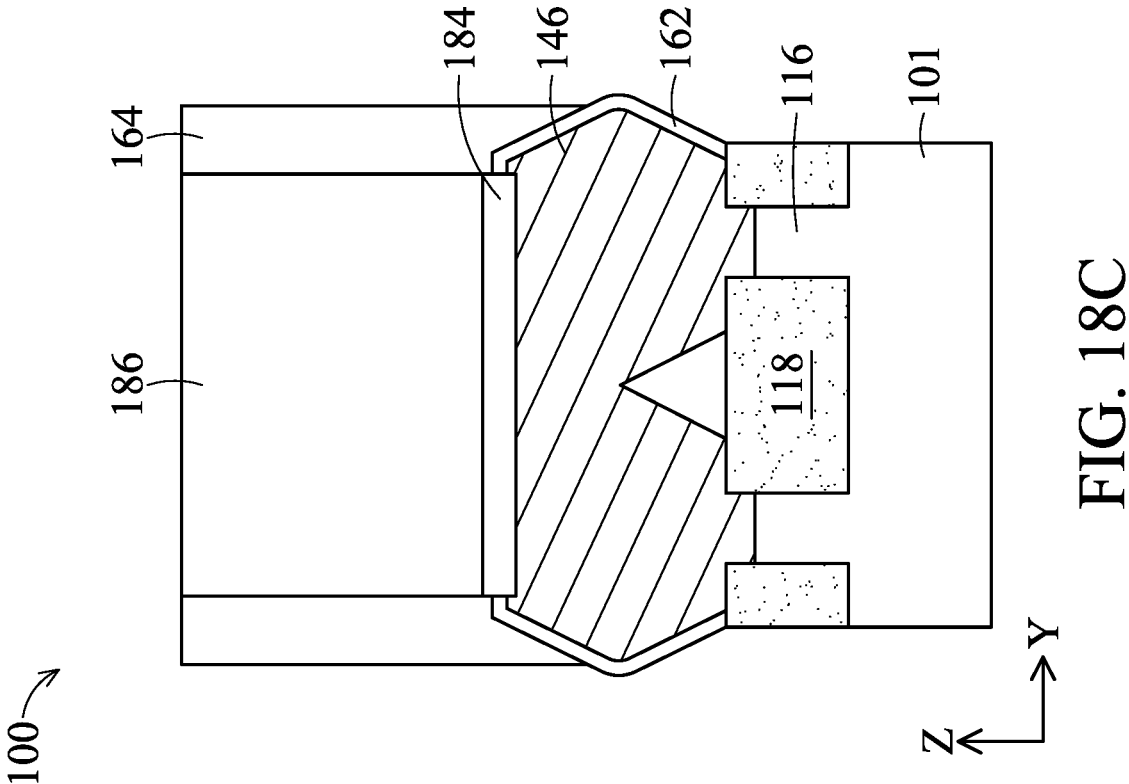
Figures 1, 18D:
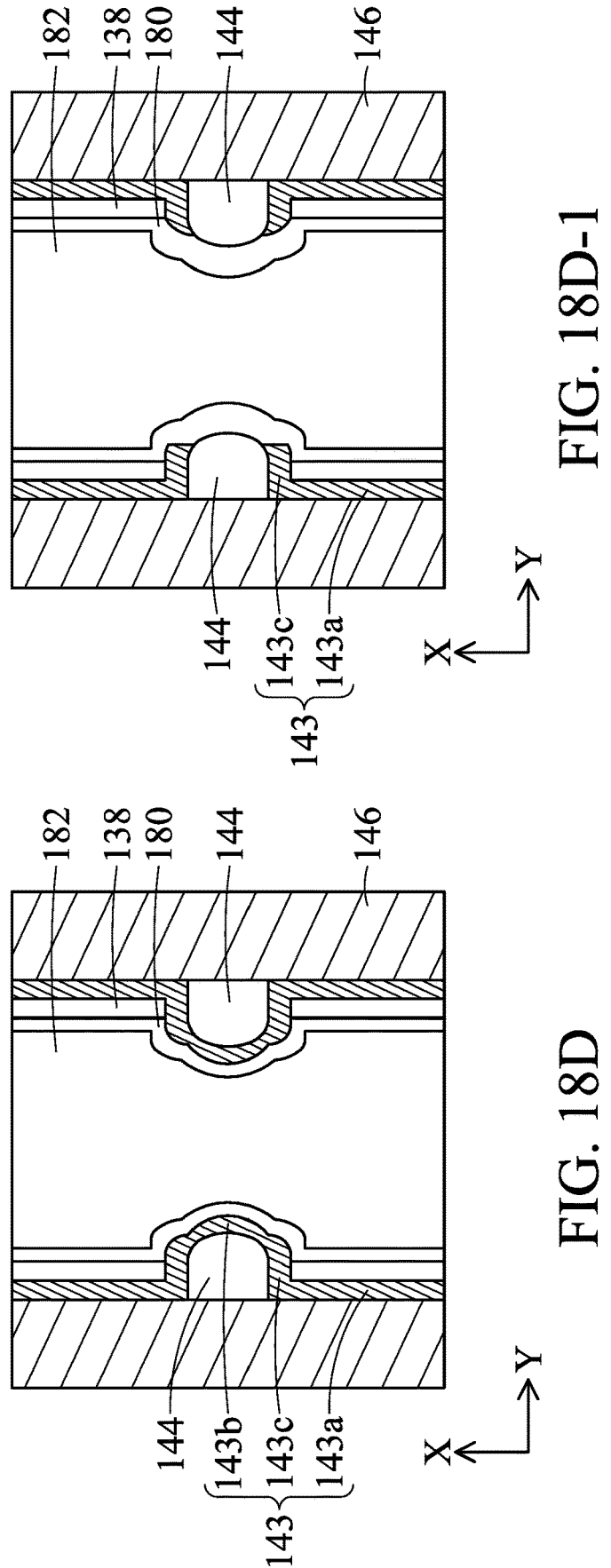
Figures 3, 18D:
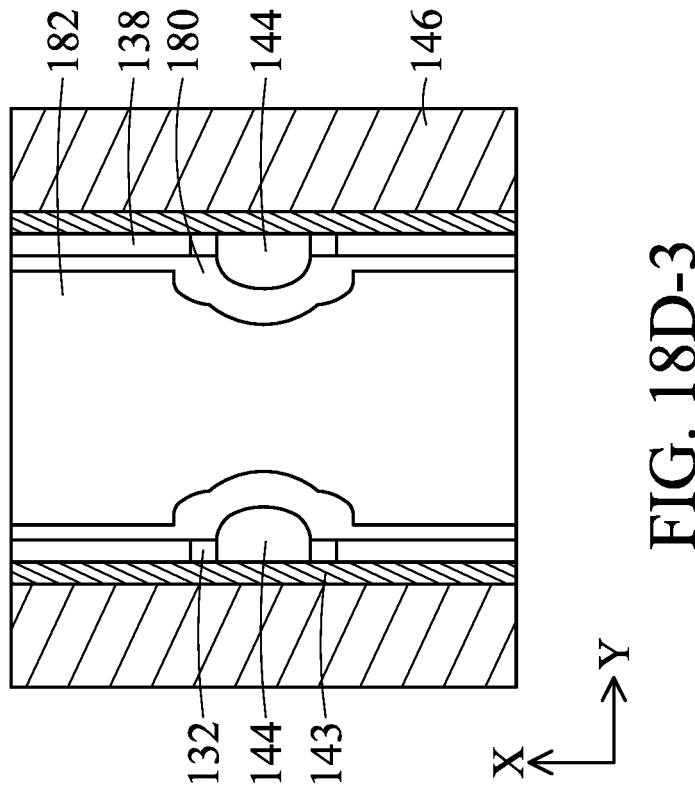
Figures 2, 18D:
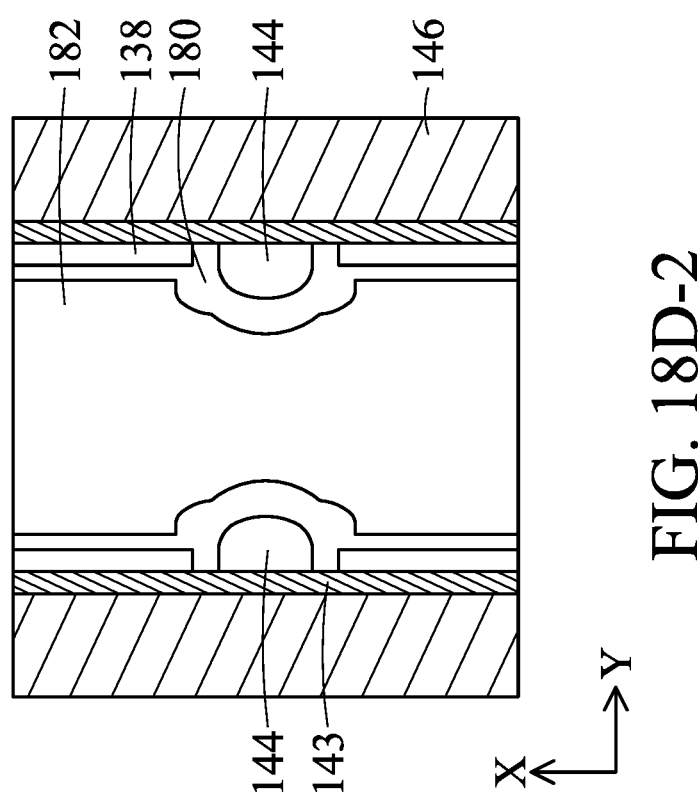

In some embodiments, which can be combined with any other embodiments of this disclosure, the etchants used during the removal of the sacrificial gate structure 130 may remove the exposed cap layer 143 on the inner spacer 144, thereby exposing a portion of the inner spacer 144, as an alternative embodiment shown in FIG. 16D-1. This may be advantageous as it provides more space for the subsequent gate electrode layer 182 (FIG. 18D-1). FIG. 16D-2 illustrates an embodiment based on the alternative embodiment of FIG. 11D-1 after the removal of the sacrificial gate structure 130. In this embodiment, which can be combined with any other embodiments of this disclosure, the etchants used during the removal of the sacrificial gate structure 130 may also remove the sacrificial gate dielectric layer 132 entirely, leaving a recess 167 defined by the gate spacer 138, the cap layer 143, and the inner spacer 144. FIG. 16D-3 illustrates another embodiment based on the alternative embodiment of FIG. 11D-1 after the removal of the sacrificial gate structure 130. In this embodiment, which can be combined with any other embodiments of this disclosure, the etchants used during the removal of the sacrificial gate structure 130 may not fully remove the sacrificial gate dielectric layer 132, leaving a portion of the sacrificial gate dielectric layer 132 remained between and in contact with the gate spacer 138, the cap layer 143, and the inner spacer 144.

In FIGS. 17A-17D, replacement gate structures 190 are formed. The replacement gate structures 190 may each include a gate dielectric layer 180 and a gate electrode layer 182. In some embodiments, an interfacial layer (IL) (not shown) may be formed between the gate dielectric layer 180 and the first semiconductor layer 106. The IL may also form on the exposed surfaces of the substrate 101. The IL may include or be made of an oxide (e.g., silicon oxide) formed by thermal or chemical oxidation of the first semiconductor layers 106, a nitride (e.g., silicon nitride, silicon oxynitride, oxynitride, etc.), and/or a dielectric layer (e.g., hafnium silicate). Next, the gate dielectric layer 180 is formed on the exposed surfaces of the semiconductor device structure 100 (e.g., on the IL (if any), sidewalls of the gate spacers 138, the top surfaces of the first ILD layer 164, the CESL 162, and the cap layer 143). The gate dielectric layer 180 may be formed of a material chemically different than that of the sacrificial gate dielectric layer 132. The gate dielectric layer 180 may include or made of a high-k dielectric material, such as hafnium oxide ($HfO_2$), hafnium silicate (HfSiO), hafnium silicon oxynitride (HfSiON), hafnium aluminum oxide (HfAlO), hafnium lanthanum oxide (HfLaO), hafnium zirconium oxide (HfZrO), hafnium tantalum oxide (HfTaO), hafnium titanium oxide (HfTiO), lanthanum oxide (LaO), aluminum oxide (AlO), aluminum silicon oxide (AlSiO), zirconium oxide (ZrO), titanium oxide (TiO), tantalum oxide ($Ta_2O_5$), yttrium oxide ($Y_2O_3$), silicon oxynitride (SiON), or other suitable high-k materials. The gate dielectric layer 180 may be a conformal layer formed by a conformal process, such as an ALD process, a PECVD process, a molecular-beam deposition (MBD) process, or the like, or a combination thereof. The gate dielectric layer 180 may have a thickness in a range of about 0.3 nm to about 5 nm.

After formation of the IL (if any) and the gate dielectric layer 180, the gate electrode layer 182 is formed on the gate dielectric layer 180. The gate electrode layer 182 fills the openings 166 (FIG. 16A) and surrounds a portion of each of the first semiconductor layers 106. The gate electrode layer 182 includes one or more layers of conductive material, such as polysilicon, aluminum, copper, titanium, tantalum, tungsten, cobalt, molybdenum, tantalum nitride, nickel silicide, cobalt silicide, TiN, WN, WCN, TiAl, TiTaN, TiAlN, TaN, TaCN, TaC, TaSiN, metal alloys, other suitable materials, and/or combinations thereof. The gate electrode layers 182 may be formed by PVD, CVD, ALD, electro-plating, or other suitable method. In some embodiments, one or more optional conformal layers (not shown) can be conformally (and sequentially, if more than one) deposited between the gate dielectric layer 180 and the gate electrode layer 182. The one or more optional conformal layers can include one or more barrier and/or capping layers and one or more work-function tuning layers. The one or more barrier and/or capping layers may include or be a nitride, silicon nitride, carbon nitride, and/or aluminum nitride of tantalum and/or titanium; a nitride, carbon nitride, and/or carbide of tungsten; the like; or a combination thereof. The one or more work-function tuning layers may include or be a nitride, silicon nitride, carbon nitride, aluminum nitride, aluminum oxide, and/or aluminum carbide of titanium and/or tantalum; a nitride, carbon nitride, and/or carbide of tungsten; cobalt; platinum; the like; or a combination thereof.

Portions of the gate electrode layer 182, the one or more optional conformal layers (if any), and the gate dielectric layer 180 above the top surfaces of the first ILD layer 164, the CESL 162, the cap layer 143 (if any), and the gate spacers 138 may be removed by a planarization process, such as by a CMP process. After the CMP process, the top surfaces of the first ILD layer 164, the CESL 162, the gate spacers 138, the cap layer 143, and the gate electrode layer 182 are substantially co-planar.

In FIGS. 18A-18D, contact openings are formed through the first ILD layer 164, and the CESL 162 to expose the epitaxial S/D feature 146. A silicide layer 184 is then formed on the S/D epitaxial features 146, and a source/drain (S/D) contact 186 is formed in the contact opening on the silicide layer 184. The S/D contact 186 may include an electrically conductive material, such as Ru, Mo, Co, Ni, W, Ti, Ta, Cu, Al, TiN, or TaN. While not shown, a barrier layer (e.g., TiN, TaN, or the like) may be formed on sidewalls of the contact openings prior to forming the S/D contacts 186.

After the formation of the contact openings, a silicide layer 184 is formed on the epitaxial S/D features 146. The silicide layer 184 conductively couples the epitaxial S/D features 146 to subsequent S/D contacts 186 formed in the contact openings. The silicide layer 184 may be formed by depositing a metal source layer over the epitaxial S/D features 146 and performing a rapid thermal annealing process. During the rapid anneal process, the portion of the metal source layer over the epitaxial S/D features 146 reacts with silicon in the epitaxial S/D features 146 to form the silicide layer 184. Unreacted portion of the metal source layer is then removed. The silicide layer 184 may include a metal or metal alloy silicide, and the metal includes a noble metal, a refractory metal, a rare earth metal, alloys thereof, or combinations thereof. Next, a conductive material is formed in the contact openings and form the S/D contacts 186. The conductive material may be made of a material including one or more of Ru, Mo, Co, Ni. W, Ti, Ta, Cu, Al, TiN and TaN. While not shown, a barrier layer (e.g., TiN, TaN, or the like) may be formed on sidewalls of the contact openings prior to forming the S/D contacts 186. Then, a planarization process, such as CMP, is performed to remove excess deposition of the contact material and expose the top surface of the gate electrode layer 182.

As shown in FIG. 18D, the cap layer 143 between two adjacent semiconductor layers 106 may include a first portion 143a, a second portion 143b, and a third portion 143c extends between the first portion 143a and the second portion 143b. The first portion 143a is disposed between and in contact with the epitaxial S/D feature 146 and the gate spacer 138. The second portion 143b is disposed between and in contact with the gate dielectric layer 180 and the inner spacer 144. The third portion 143c is disposed between and in contact with the inner spacer 144 and the gate spacer 138.

FIG. 18D-1 illustrates an embodiment based on the alternative embodiment of FIG. 16D-1. The embodiment of FIG. 18D-1 is similar to the embodiment of FIG. 18D except that the second portion 143b is removed. Therefore, a portion of the gate dielectric layer 180 is in direct contact with the inner spacer 144. In other words, the inner spacer 144 is in contact with the epitaxial S/D feature 146, the third portion 143c of the cap layer 143, and the gate dielectric layer 180. In some embodiments, the third portion 143c is extended to a point so that the third portion 143c is disposed between and in contact with the gate dielectric layer 180 and the inner spacer 144.

FIG. 18D-2 illustrates an embodiment based on the alternative embodiment of FIG. 16D-2. In this embodiment, a portion of the cap layer 143 is in contact with the gate dielectric layer 180. The gate spacer 138 is disposed between the cap layer 143 and the gate dielectric layer 180. The inner spacer 144 has one side in contact with the cap layer 143 and the remaining surface being in contact with the gate dielectric layer 180. Particularly, the gate dielectric layer 180 is in contact with the cap layer 143, the gate spacer 138, the inner spacer 144, and the gate electrode layer 182. In addition, the cap layer 143 is substantially co-planar with the gate spacer 138, the inner spacer 144, and a portion of the gate dielectric layer 180.

FIG. 18D-3 illustrates an embodiment based on the alternative embodiment of FIG. 16D-3. This embodiment is similar to the embodiment of FIG. 18D-2 except that the sacrificial gate dielectric layer 132 remains adjacent the inner spacer 144. Particularly, the sacrificial gate dielectric layer 132 is being surrounded and in contact with the cap layer 143, the gate spacer 138, the gate dielectric layer 180, and the inner spacer 144.

It is understood that the semiconductor device structure 100 may undergo further complementary metal oxide semiconductor (CMOS) and/or back-end-of-line (BEOL) processes to form various features such as transistors, contacts/vias, interconnect metal layers, dielectric layers, passivation layers, etc. The semiconductor device structure 100 may also include backside contacts (not shown) on the backside of the substrate 101 so that either source or drain of the epitaxial S/D features 146 is connected to a backside power rail (e.g., positive voltage VDD or negative voltage VSS) through the backside contacts.

Various embodiments or examples described herein offer multiple advantages over the state-of-art technology. According to embodiments of the present disclosure, wire release induced damages to S/D features of nanostructure channel FETs can be prevented by providing a nitride-based cap layer between inner spacers and the nanostructure channels through a nitridation process. The cap layer can effectively retard etchant chemicals used during nanostructure formation process, thereby protecting the integrality of the epitaxial S/D features. It has been observed that the cap layer can reduce amount of defects in the epitaxial S/D features from over about $1 \times 10^6 / \text{cm}^2$ to less than $1 \times 10^4 / \text{cm}^2$. The cap layer increases physical thickness of the inner spacers and help avoid reliability issues (e.g., TDDB).

An embodiment is a semiconductor device structure. The structure includes a plurality of semiconductor layers vertically stacked over a substrate, a source/drain feature in contact with each of the plurality of the semiconductor layers, an inner spacer disposed between two adjacent semiconductor layers, a gate electrode layer surrounding a portion of each of the plurality of the semiconductor layers, a gate dielectric layer disposed between the semiconductor layer and the gate electrode layer, a gate spacer in contact with a portion of the gate dielectric layer. The semiconductor device structure further includes a first cap layer comprising a first portion disposed between and in contact with the source/drain feature and the gate spacer, and a second portion disposed between and in contact with gate spacer and the inner spacer.

Another embodiment is a semiconductor device structure. The structure includes a plurality of semiconductor layers vertically stacked over a substrate, a source/drain feature in contact with each of the plurality of the semiconductor layers, a first gate dielectric layer surrounding a portion of each of the plurality of the semiconductor layers, a first cap layer disposed between the source/drain feature and the first gate dielectric layer, wherein the first cap layer has a first side in contact with the source/drain feature. The structure also includes a gate spacer disposed between and in contact with the first gate dielectric layer and a second side of the first cap layer, and an inner spacer disposed between and in contact with the first gate dielectric layer and the second side of the first cap layer.

A further embodiment is a method for forming a semiconductor device structure. The method includes forming a stack of semiconductor layers over a substrate, the stack of the semiconductor layers comprising a plurality of first semiconductor layers and a plurality of second semiconductor layers alternatingly stacked, forming a fin structure from the stack of the semiconductor layers and the substrate, forming a sacrificial gate structure and a gate spacer over a portion of the fin structure, removing portions of the fin structure not covered by the sacrificial gate structure and the gate spacer to expose a portion of the substrate, removing edge portions of the second semiconductor layers to form cavities between adjacent first semiconductor layers, forming a cap layer on exposed surfaces of each of the first and second semiconductor layers and the gate spacer, forming an inner spacer on the cap layer, forming a source/drain feature on opposite sides of the sacrificial gate structure and the gate spacer, wherein the source/drain feature is in contact with the inner spacer. The method also includes removing the sacrificial gate structure and the plurality of second semiconductor layers to expose portions of the plurality of first semiconductor layers and the cap layer, removing a portion of the cap layer to expose a portion of the inner spacer, and forming a gate electrode layer to surround the exposed portion of at least one of the plurality of first semiconductor layers, wherein the gate electrode layer is separated from the inner spacer by the cap layer.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

The invention claimed is:

1. A semiconductor device structure, comprising:
a plurality of semiconductor layers vertically stacked over a substrate;
a source/drain feature in contact with each of the plurality of the semiconductor layers;
an inner spacer disposed between two adjacent semiconductor layers;
a gate electrode layer surrounding a portion of at least one of the plurality of the semiconductor layers;
a gate dielectric layer disposed between at least one of the plurality of semiconductor layers and the gate electrode layer;
a gate spacer in contact with a portion of the gate dielectric layer;
a first cap layer comprising:
a first portion disposed between and in contact with the source/drain feature and the gate spacer; and
a second portion disposed between and in contact with gate spacer and the inner spacer;
a contact etch stop layer (CESL) disposed over the source/drain feature; and
a second cap layer disposed between and in contact with the gate spacer and the CESL.

2. The semiconductor device structure of claim 1, wherein the second portion is extended so that the second portion is disposed between and in contact with the gate dielectric layer and the inner spacer.

3. The semiconductor device structure of claim 1, wherein a portion of the gate dielectric layer is disposed between and in contact with the gate spacer and the gate electrode layer.

4. The semiconductor device structure of claim 1, wherein the first cap layer further comprises:
a third portion disposed between and in contact with the inner spacer and the gate dielectric layer.

5. The semiconductor device structure of claim 4, wherein the third portion of the first cap layer has a curved profile.

6. The semiconductor device structure of claim 1, wherein the first and second cap layers are formed of a nitride-based material.

7. The semiconductor device structure of claim 5, wherein the third portion of the first cap layer has a concave profile.

8. A semiconductor device structure, comprising:
a plurality of semiconductor layers vertically stacked over a substrate;
a source/drain feature in contact with the plurality of the semiconductor layers;
an inner spacer disposed between two adjacent semiconductor layers;
a gate electrode layer surrounding a portion of at least one of the plurality of the semiconductor layers;
a gate dielectric layer disposed between the semiconductor layer and the gate electrode layer;
a gate spacer in contact with a portion of the gate dielectric layer; and
a cap layer, comprising:
a first portion disposed between and in contact with the source/drain feature and the gate spacer, the first portion having a first thickness;
a second portion disposed between and in contact with gate spacer and the inner spacer, the second portion having a second thickness; and
a third portion disposed between and in contact with the inner spacer and the gate dielectric layer, the third portion having a third thickness,
wherein the third thickness is less than the first thickness.

9. The semiconductor device structure of claim 8, wherein the second thickness is greater than the third thickness.

10. The semiconductor device structure of claim 8, wherein the cap layer is formed of a nitride-based material.

11. The semiconductor device structure of claim 10, wherein the cap layer is SiGeN.

12. The semiconductor device structure of claim 10, wherein the cap layer has a thickness of about 3 Å to about 30 Å.

13. A semiconductor device structure, comprising:

a plurality of semiconductor layers vertically stacked over a substrate;

a source/drain feature in contact with each of the plurality of the semiconductor layers;

a first gate dielectric layer surrounding a portion of each of the plurality of the semiconductor layers;

a first cap layer disposed between the source/drain feature and the first gate dielectric layer, wherein the first cap layer has a first side in contact with the source/drain feature;

a gate spacer disposed between and in contact with the first gate dielectric layer and a second side of the first cap layer;

an inner spacer disposed between and in contact with the first gate dielectric layer and the second side of the first cap layer;

a contact etch stop layer (CESL) disposed over the source/drain feature; and a second cap layer disposed between and in contact with the gate spacer and the CESL.

14. The semiconductor device structure of claim 13, further comprising:

a gate electrode layer surrounding a portion of each of the plurality of the semiconductor layers; and a second gate dielectric layer disposed between the source/drain feature and the gate electrode layer.

15. The semiconductor device structure of claim 14, wherein the second gate dielectric layer is in contact with the first gate dielectric layer and the second side of the first cap layer, wherein the second gate dielectric layer is made of a material chemically different than the first gate dielectric layer.

16. The semiconductor device structure of claim 13, wherein the first cap layer surrounds a portion of at least one of the semiconductor layers.

17. The semiconductor device structure of claim 13, wherein the first and second cap layers are formed of a nitride-based material.

18. The semiconductor device structure of claim 17, wherein the second cap layer is disposed between and in contact with the CESL and the gate spacer.

19. The semiconductor device structure of claim 17, wherein the second cap layer further comprises:

a first sublayer in contact with the first gate dielectric layer, wherein the first sublayer has a first nitrogen content; and a second sublayer disposed between and in contact with the gate spacer and the first sublayer, the second sublayer has a second nitrogen content less than the first nitrogen content.

20. The semiconductor device structure of claim 13, wherein the cap layer is SiGeN.

* * * * *